US 6,642,600 B2
Nov. 4, 2003

(12) United States Patent
Narazaki et al.

(54) INSULATED GATE SEMICONDUCTOR DEVICE HAVING FIRST TRENCH AND SECOND TRENCH CONNECTED TO THE SAME

(75) Inventors: Atsushi Narazaki, Hyogo (JP); Katsumi Uryuu, Fukuoka (JP)

(73) Assignees: Mitsubishi Denki Kabushiki Kaisha, Tokyo (JP); Ryoden Semiconductor System Engineering Corporation, Itami (JP)

(*) Notice: Subject to any disclaimer, the term of this patent is extended or adjusted under 35 U.S.C. 154(b) by 0 days.

(21) Appl. No.: 10/273,001

(22) Filed: Oct. 18, 2002

(65) Prior Publication Data
US 2003/0168713 A1 Sep. 11, 2003

(30) Foreign Application Priority Data
Mar. 7, 2002 (JP) ........................ 2002-061696

(51) Int. Cl.⁷ ............................................. H01L 29/72
(52) U.S. Cl. .................. 257/513; 257/330; 257/331; 257/332
(58) Field of Search ................. 257/513, 330, 257/331, 332

(56) References Cited

U.S. PATENT DOCUMENTS
6,316,806 B1 * 11/2001 Mo ............................ 257/330

FOREIGN PATENT DOCUMENTS
JP          11-121741          4/1999

* cited by examiner

Primary Examiner—Edward Wojciechowicz
(74) Attorney, Agent, or Firm—Oblon, Spivak, McClelland, Maier & Neustadt, P.C.

(57) ABSTRACT

A second trench (105b) is formed inside a semiconductor layer (102), penetrating a base layer (103) and moreover extends along a second direction (D2) while being connected to one end portion of each first portion (P1) of a first trench (105a) extending along a first direction (D1). A second gate control electrode (107b) is connected to a first gate control electrode (107a) at the one end portion, filling the inside of the second trench (105b). A gate contact portion (109) extending along the second direction (D2) exposes part of an upper surface of the second gate control electrode (107b). A gate aluminum electrode (108) is connected to the second gate control electrode (107b) through the gate contact portion (109), protruding outside beyond an end (103e) of the base layer (103) by a distance (W0).

20 Claims, 44 Drawing Sheets

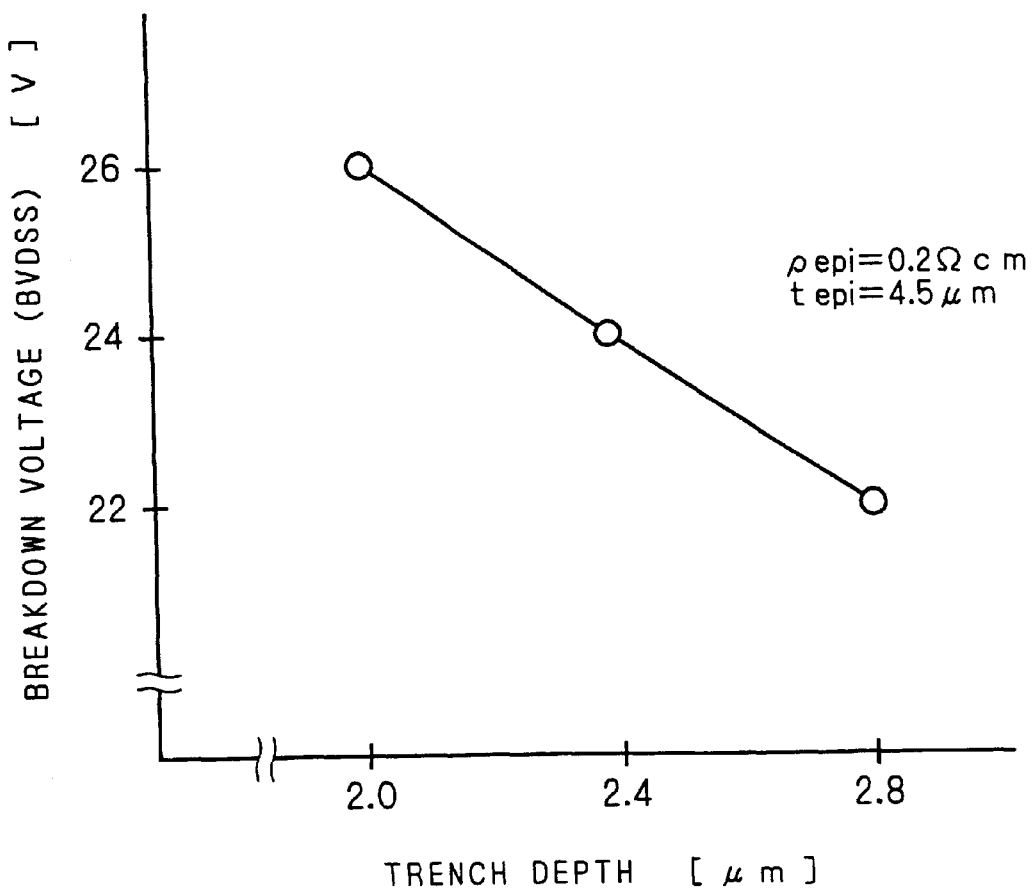

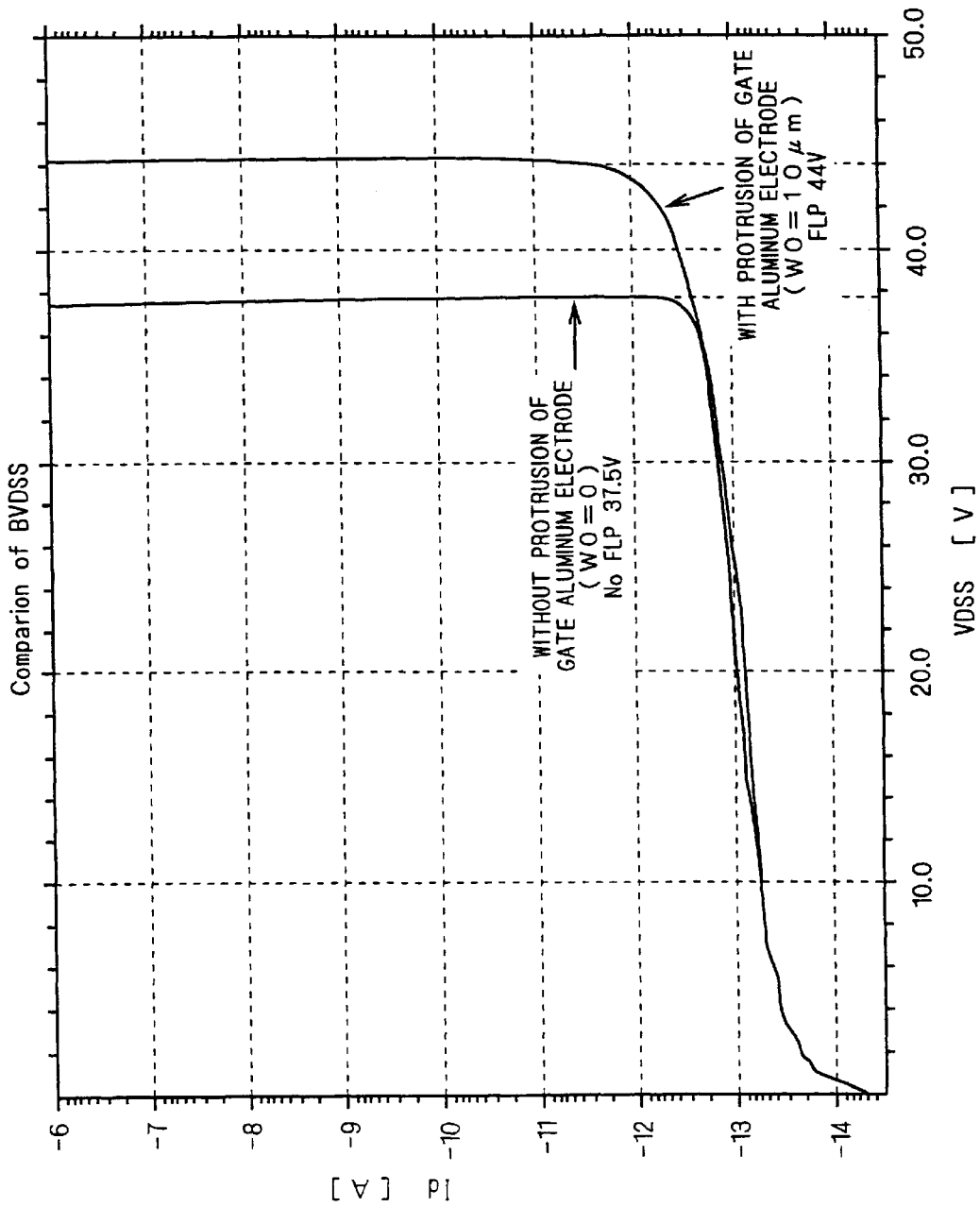

FIG. 7
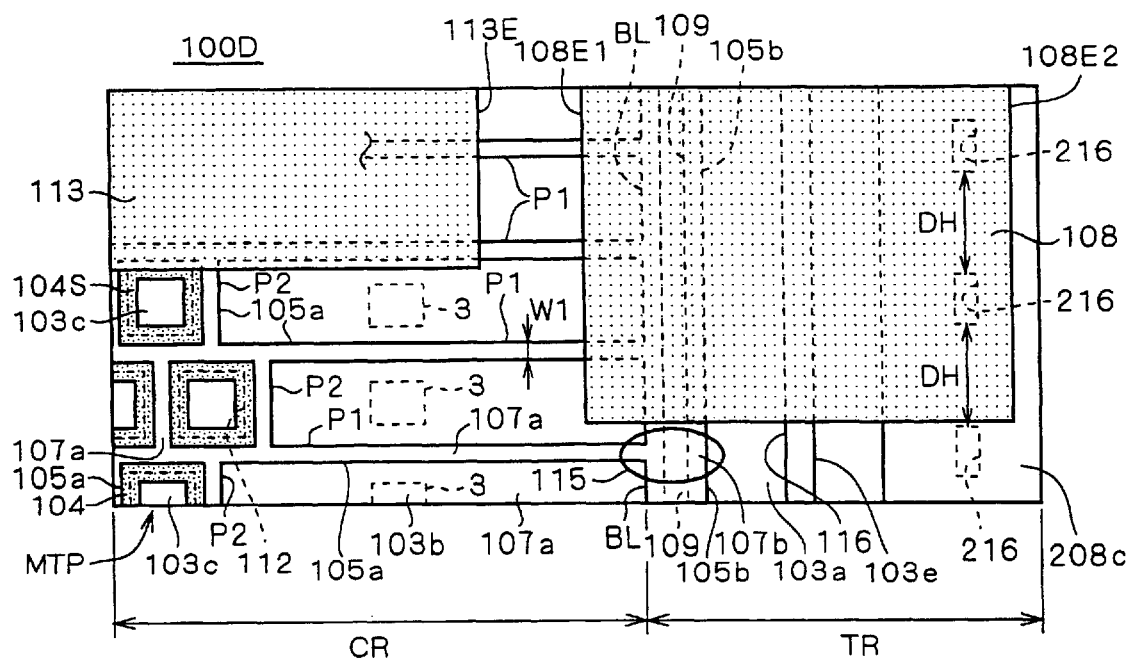
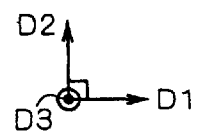

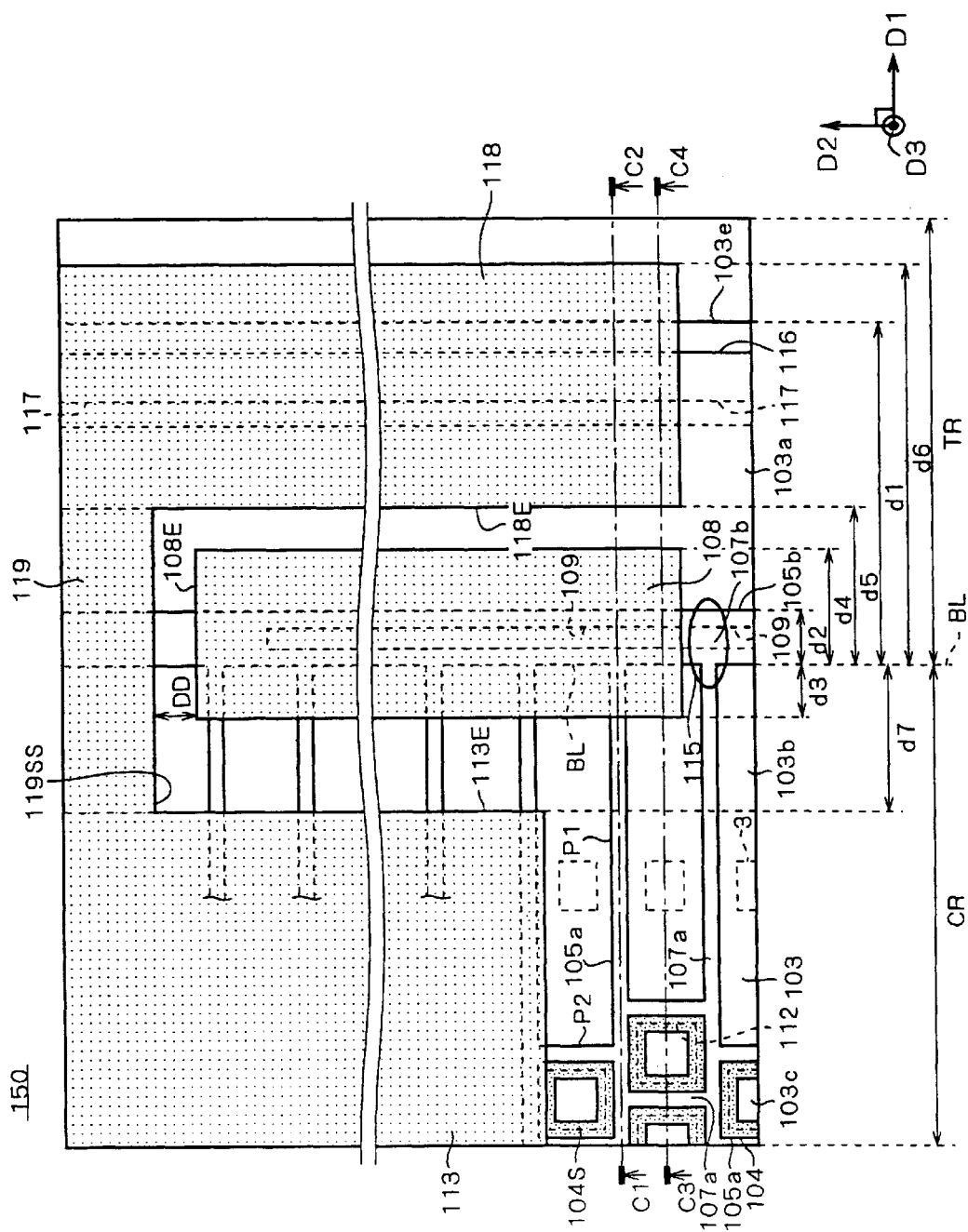

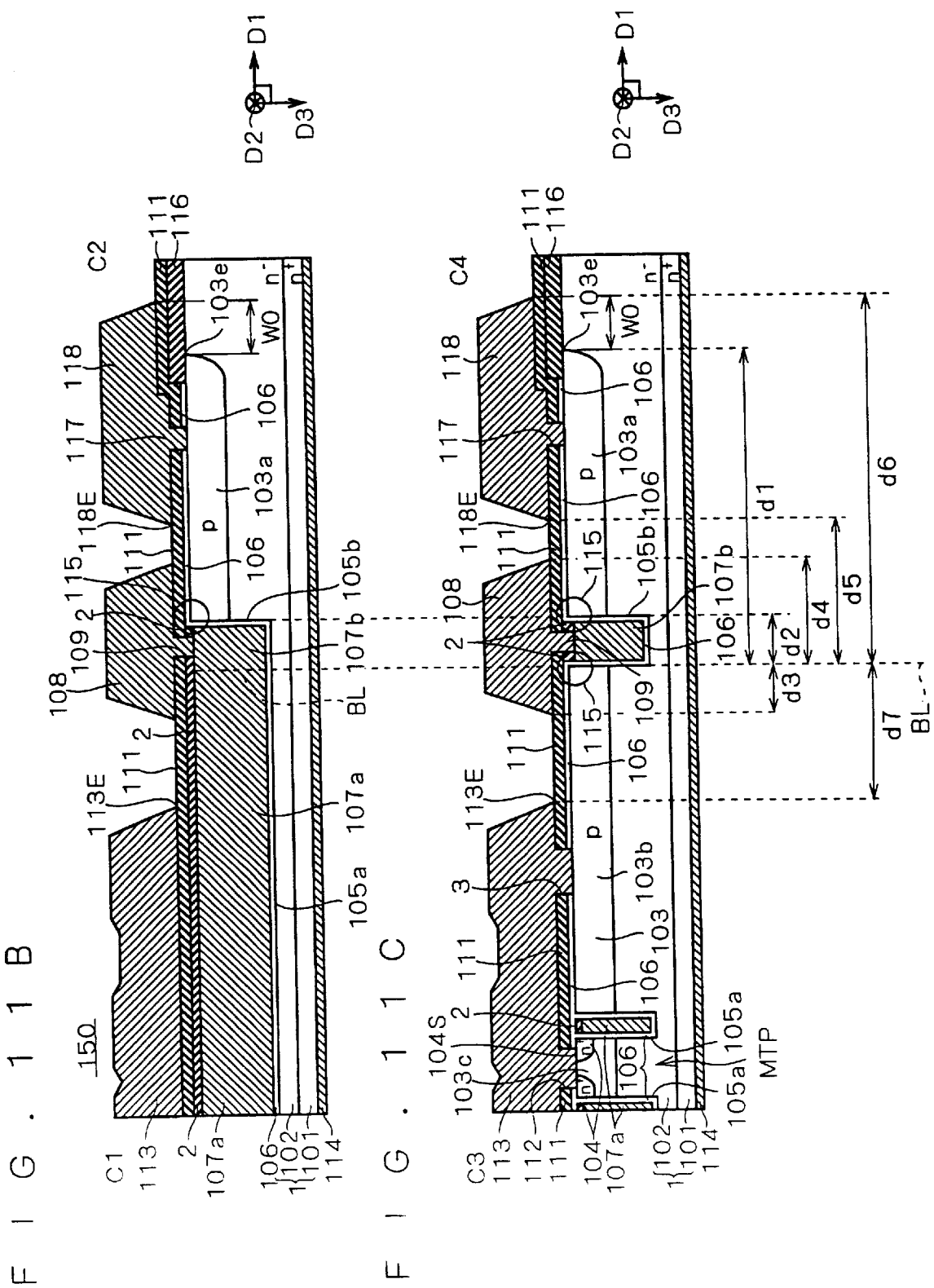

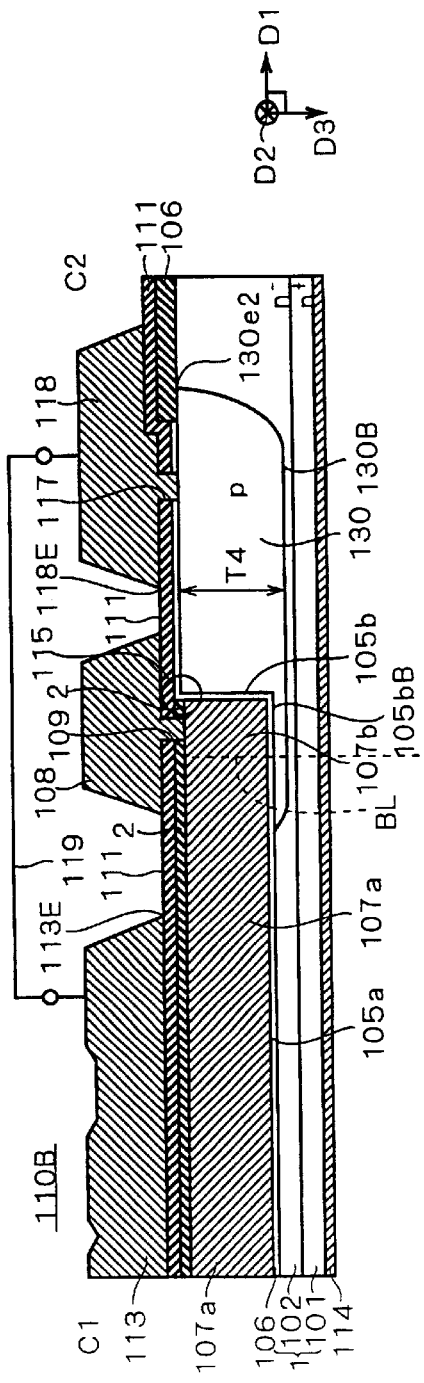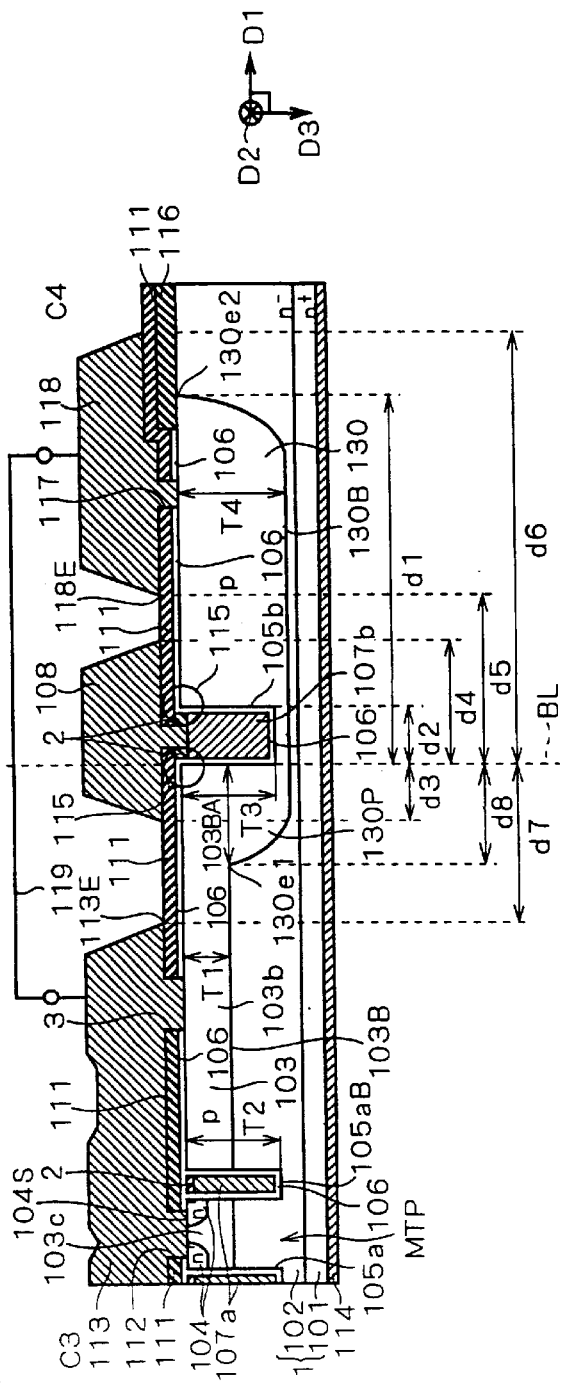

F I G . 3 6
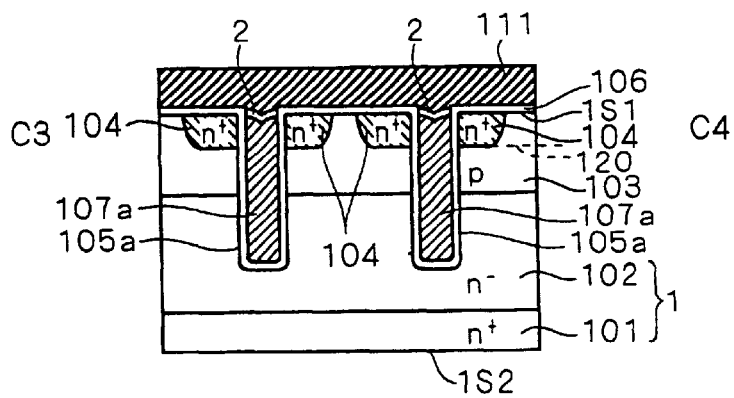
F I G . 3 7 A
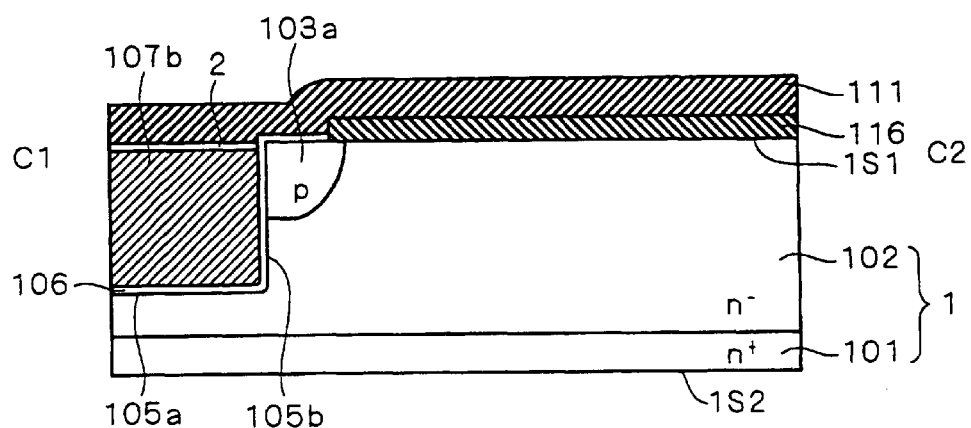
F I G . 3 7 B
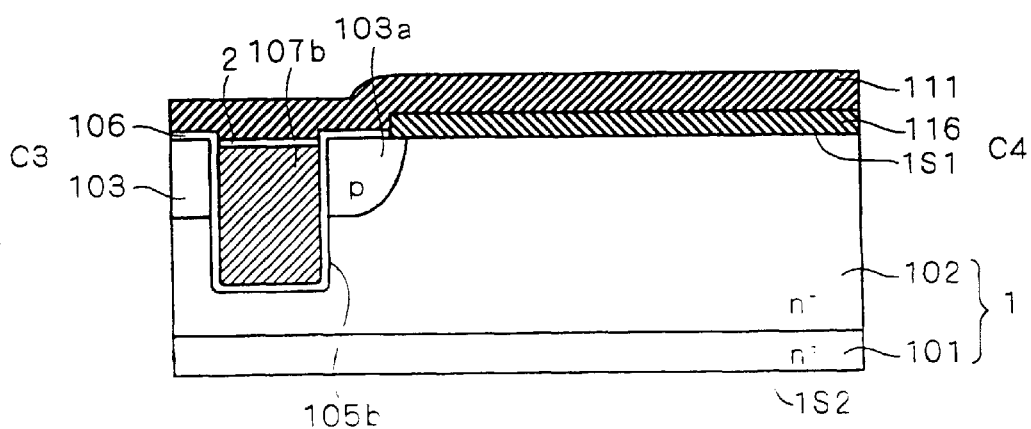

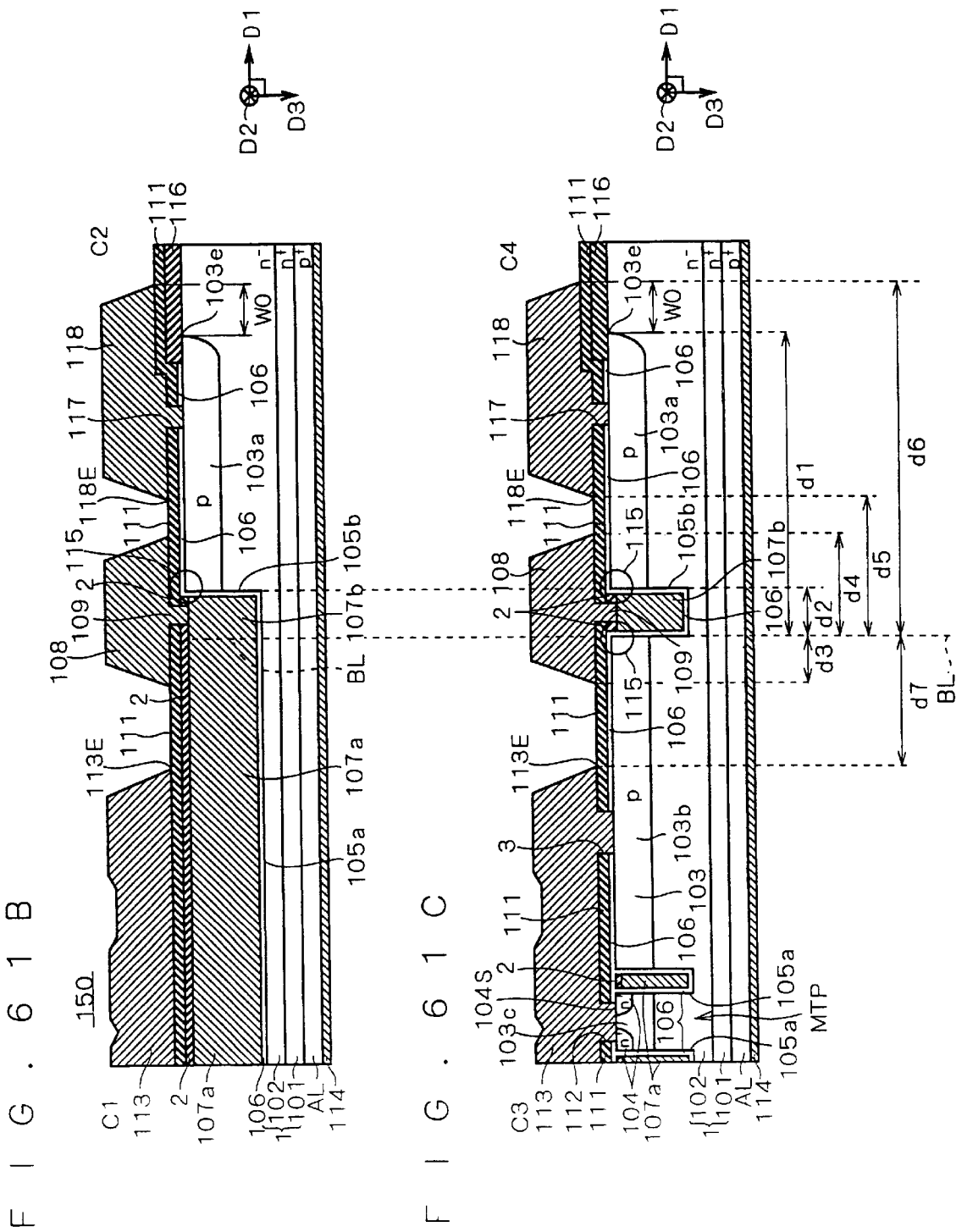

INSULATED GATE SEMICONDUCTOR DEVICE HAVING FIRST TRENCH AND SECOND TRENCH CONNECTED TO THE SAME

BACKGROUND OF THE INVENTION

1. Field of the Invention

The present invention relates to an insulated gate semiconductor device having a trench gate structure, and more particularly to a gate interconnection structure of the same device.

2. Description of the Background Art

An insulated gate semiconductor device having a trench gate structure is generally referred to as a vertical MOS transistor (as a UMOS from the shape of trenches). Since the vertical MOS transistor, having gate electrodes formed in a vertical direction unlike a lateral MOS transistor having planar gates, needs a smaller area for one cell, it allows an increase in the number of cells per unit area through micromachining. The increase in the number of cells per unit area (density) enlarges a channel area, allowing a larger amount of currents to flow in an ON state. The resistance of the UMOS transistor in this case is referred to as "ON-resistance (Ron)", which is a key item of characteristics of a device. Contrastively in the lateral MOS transistor, there is a limitation in reduction of ON-resistance Ron since increasing the cell density leads to an increase in j-FET resistance. For effective use of such a characteristic feature of the UMOS transistor, the gate trench structure is mainly adopted in power devices such as MOSFETs (MOS Field Effect Transistors) or IGBTs (Insulated Gate Bipolar Transistors).

Before pointing out problems to be solved in the present invention, first taken is an overview of a gate interconnection structure of a UMOSFET (no prior art) which is a unpublished product made by the present applicant company. In this unknown structure, a gate control electrode buried inside a trench which penetrates a p-type base layer is drawn up to above a surface of the trench at a cell end portion of the UMOSFET and the drawn-up portion of the gate control electrode is electrically connected to a gate electrode connected to a gate pad through a gate contact portion.

Next, discussion will be presented on a gate reliability test for the UMOSFET, relating to a main problem to be solved in the present invention. Further, a general HTGB test (high temperature gate bias test) will be herein discussed.

First, a UMOSFET is kept at a high temperature by using a constant temperature bath or a hot plate. In this state, a drain electrode and a source electrode are short-circuited by an external interconnection and a gate voltage VGS is applied across a gate electrode and the source electrode. At this time, tests are executed in both cases where the polarity of the gate voltage is positive and where it is negative. Further, with the gate voltage VGS set to a value close to a gate assured-proficiency voltage in a UMOSFET, the test is executed. Then, under this state, with the temperature of the UMOSFET kept constant, the gate voltage VGS is applied for a long time to check deterioration of a gate oxide film and the degree of variations in other characteristics.

In this case, at a corner portion of the trench, an electric field equivalent to the gate voltage VGS occurs against the gate oxide film formed on an inner wall of the trench, like in an ON-operation state. The electric field stress against the gate oxide film at the corner portion is much stronger than that in the ON-operation because of (1) high temperature atmosphere, (2) the value of the gate voltage VGS higher than that in the normal ON-operation and (3) a long-time continuous energization. Therefore, the HTGB test is means for acceleratedly checking the proficiency in withstand insulation voltage of the gate oxide film, and can be used for determinating an original lifetime of the gate oxide film.

In the product UMOSFET having the above gate interconnection structure, an electric field stress is applied to the whole surface of the gate oxide film through the HTGB test, and especially, a much stronger electric field stress is applied to the corner portion of the outermost trench. The reason are (1) that at the portion of the outermost trench, a silicon substrate is opened in a form almost square in order to draw the gate control electrode up to above the trench and the gate oxide film formed along a surface of the silicon substrate having a square bent portion has a film thickness much thinner at the square portion than that of other portions since the oxidation speed decreases at the square portion of the silicon substrate, and (2) that the withstand insulation voltage is lower at the portion of the outermost trench than a flat portion of the oxide film since the gate oxide film has a shape with a relatively large curvature at the portion of the outermost trench and much stronger electric field stress is applied to the gate oxide film at the portion of the outermost trench than that applied to other portions.

The following methods are possible to solve the above problem.

1) A method to make an oxide film at the corner portion thicker than those formed on the inner wall of the trench and the flat portion by implanting As (arsenic) as an $n^+$-type impurity into the portion of the outermost trench, utilizing a phenomenon that the oxidation speed increases in a region in which $n^+$-type impurities are implanted when a gate oxide film is formed by a heat treatment (no prior art).

2) A method to relieve the electric field stress by providing a round at the corner portion through an isotropic silicon etching which is performed immediately after the formation of the trench (no prior art).

3) A method to relieve the electric field stress by making the shape of the oxide film gentler through optimization of process conditions (heat history, gas atmosphere) in the formation of the gate oxide film (no prior art).

The method (1), however, produces an effect in a device which allows a long-time heat treatment, in other words, a device having a gate oxide film which is thick to some degree but can not produce a sufficient effect in a device which does not allow a long-time heat treatment, in other words, a device having a gate oxide film which is relatively thin.

Further, the method (2) raises a problem that the manufacturing process becomes complicate since an etching process is necessarily added. Moreover, in the method (2), the width of the trench becomes larger since the whole of trench is also etched at the same time, and this causes deterioration in yield because of short design margin and also causes a decrease in channel width in a transistor cell having a mesh structure, resulting in an increase in ON-resistance.

Furthermore, in the method (3), similarly in the method (2), since the gate oxide film has a round shape to some degree at the corner portion, it is possible to relieve the electric field stress to some degree but the withstand insulation voltage of the gate oxide film at the corner portion is nowhere near that of the gate oxide film at the flat portion because the film thickness of the gate oxide film at the corner portion does not become thicker. Therefore, the method (3) is not a radical solution.

SUMMARY OF THE INVENTION

It is a first object of the present invention to provide an insulated gate semiconductor device which ensures an improvement in yield through enhancing a withstand insulation voltage and reliability of gates.

It is a second object of the present invention to improve a main breakdown voltage between the first and second main electrodes in the insulated gate semiconductor device.

It is a third object of the present invention to reduce a gate wire resistance.

It is a fourth object of the present invention to reduce the number of process steps in a method of manufacturing such an insulated gate semiconductor device.

The present invention is intended for an insulated gate semiconductor device having an MOS transistor structure.

According to a first aspect of the present invention, the insulated gate semiconductor device having an MOS transistor structure includes a semiconductor substrate of a first conductivity type having a first main surface and a second main surface which are opposed to each other in a third direction, a base layer of a second conductivity type, a first trench, a first gate insulating film and a first main electrode. The base layer of a second conductivity type is formed from a cell region in the first main surface and a region in the first main surface which is defined by one end which is a boundary between the cell region and a terminal region adjacent to the cell region and the other end away from the boundary towards the terminal region by a first distance along a first direction, towards an inside of the semiconductor substrate along the third direction. The first trench is formed from the cell region in the first main surface, through the base layer, up to the inside of the semiconductor substrate along the third direction. The first gate insulating film is formed entirely on a bottom surface and side surfaces of the first trench. The first main electrode is formed on the second main surface. The first direction is parallel to the first main surface and orthogonal to the third direction, and a first depth from the first main surface to a bottom surface of the base layer is smaller than a second depth from the first main surface to the bottom surface of the first trench. The first trench has a plurality of first portions and a plurality of second portions, the plurality of first portions are arranged along a second direction orthogonal to the first direction and the third direction, each of the plurality of first portions has one end portion located on the boundary between the cell region and the terminal region and extends towards the one end portion along the first direction, and each of the plurality of second portions is located between adjacent first portions out of the plurality of first portions and extends along the second direction to connect the adjacent first portions to each other. The insulated gate semiconductor device further includes a plurality of second main electrode regions of the first conductivity type, a first gate control electrode, a second trench, a second gate insulating film, an insulating layer, a plurality of first contact portions, a plurality of second contact portions, a second main electrode, a third contact portion and a gate electrode. The plurality of second main electrode regions of the first conductivity type are each formed from a region in the cell region of the first main surface which is surrounded by the adjacent first portions and adjacent second portions out of the plurality of second portions corresponding to the adjacent first portions towards an inside of the base layer along upper portions of side surfaces of the adjacent first portions and upper portions of side surfaces of the adjacent second portions. The first gate control electrode is so formed inside the first trench as to be located beneath an upper surface of the first trench and fills the first trench with the first gate insulating film interposed therebetween. The second trench is formed from a region in the first main surface which is defined by one end which is the boundary and the other end away from the boundary toward the terminal region by a second distance shorter than the first distance along the first direction, through the base layer, up to the inside of the semiconductor substrate along the third direction, and has a third depth larger than the first depth and extends along the second direction, being connected to the one end portion which each of the plurality of first portions has. The second gate insulating film is formed entirely on a bottom surface and side surfaces of the second trench. The second gate control electrode is so formed inside the second trench as to be located beneath an upper surface of the second trench, fills the second trench with the second gate insulating film interposed therebetween, and is electrically connected to the first gate control electrode at the one end portion which each of the plurality of first portions has. The insulating layer is formed on an upper surface of the base layer, an upper surface of the first gate control electrode, an upper surface of the first gate insulating film, an upper surface of the second gate control electrode, an upper surface of the second gate insulating film and a region in the terminal region of the first main surface which is located outside an end of the base layer. The plurality of first contact portions are each so formed in the insulating layer as to expose part of an upper surface which each of the plurality of second main electrode regions has and an upper surface of a portion in the base layer which is surrounded by each of the plurality of second main electrode regions. The plurality of second contact portions are each so formed in the insulating layer as to expose part of an upper surface of a portion in the base layer which is surrounded by a side surface of the second trench on the side of the boundary, side surfaces of the adjacent first portions and a side surface of an outermost second portion of the plurality of second portions which faces the second trench. The second main electrode is formed in the plurality of first contact portions and the plurality of second contact portions and on a portion in the insulating layer which is located on the cell region of the first main surface, extends along the second direction, and is electrically connected to each of the plurality of second main electrode regions and the base layer. The third contact portion is so formed in the insulating layer as to expose part of the upper surface of the second gate control electrode. The gate electrode is formed inside the third contact portion, on a portion in the insulating layer which is defined by the boundary and a location away from the boundary towards the cell region along the first direction by a third distance not reaching an end portion of the second main electrode and on a portion in the insulating layer which is defined by the boundary and a location away from the boundary towards the terminal region along the first direction by a fourth distance longer than the first distance, extends along the second direction, and is electrically connected to the second gate control electrode through the third contact portion.

The first aspect of the present invention produces (1) an effect of preventing the electric field stress caused by application of the gate voltage from locally concentrating on the second gate insulating film, and further produces (2) an effect of ensuring improvement in main breakdown voltage between the first and second main electrodes by using the field plate effect.

According to a second aspect of the present invention, the insulated gate semiconductor device having an MOS transistor structure includes a semiconductor substrate of a first conductivity type having a first main surface and a second main surface which are opposed to each other in a third direction, a base layer of a second conductivity type, a first trench, a first gate insulating film and a first main electrode. The base layer of a second conductivity type is formed from a cell region in the first main surface and a region in the first main surface which is defined by one end which is a boundary between the cell region and a terminal region adjacent to the cell region and the other end away from the boundary towards the terminal region by a first distance along a first direction, towards an inside of the semiconductor substrate along the third direction. The first trench is formed from the cell region in the first main surface, through the base layer, up to the inside of the semiconductor substrate along the third direction. The first gate insulating film is formed entirely on a bottom surface and side surfaces of the first trench. The first main electrode is formed on the second main surface. The first direction is parallel to the first main surface and orthogonal to the third direction, and a first depth from the first main surface to a bottom surface of the base layer is smaller than a second depth from the first main surface to the bottom surface of the first trench. The first trench has a plurality of first portions and a plurality of second portions, the plurality of first portions are arranged along a second direction orthogonal to the first direction and the third direction, each of the plurality of first portions has one end portion located on the boundary between the cell region and the terminal region and extends towards the one end portion along the first direction, and each of the plurality of second portions is located between adjacent first portions out of the plurality of first portions and extends along the second direction to connect the adjacent first portions to each other. The insulated gate semiconductor device further includes a plurality of second main electrode regions of the first conductivity type, a first gate control electrode, a second trench, a second gate insulating film, a second gate control electrode, an insulating layer, a plurality of first contact portions, a plurality of second contact portions, a first electrode layer for second main electrode, a third contact portion, a gate electrode, a fourth contact portion and a second electrode layer for second main electrode. The plurality of second main electrode regions of the first conductivity type are each formed from a region in the cell region of the first main surface which is surrounded by the adjacent first portions and adjacent second portions out of the plurality of second portions corresponding to the adjacent first portions towards an inside of the base layer along upper portions of side surfaces of the adjacent first portions and upper portions of side surfaces of the adjacent second portions. The first gate control electrode is so formed inside the first trench as to be located beneath an upper surface of the first trench and fills the first trench with the first gate insulating film interposed therebetween. The second trench is formed from a region in the first main surface which is defined by one end which is the boundary and the other end away from the boundary towards the terminal region by a second distance shorter than the first distance along the first direction, through the base layer, up to the inside of the semiconductor substrate along the third direction, and has a third depth larger than the first depth and extends along the second direction, being connected to the one end portion which each of the plurality of first portions has. The second gate insulating film is formed entirely on a bottom surface and side surfaces of the second trench. The second gate control electrode is so formed inside the second trench as to be located beneath an upper surface of the second trench and fills the second trench with the second gate insulating film interposed therebetween, and is electrically connected to the first gate control electrode at the one end portion which each of the plurality of first portions has. The insulating layer is formed on an upper surface of the base layer, an upper surface of the first gate control electrode, an upper surface of the first gate insulating film, an upper surface of the second gate control electrode, an upper surface of the second gate insulating film and a region in the terminal region of the first main surface which is located outside an end of the base layer. The plurality of first contact portions are each so formed in the insulating layer as to expose part of an upper surface which each of the plurality of second main electrode regions has and an upper surface of a portion in the base layer which is surrounded by each of the plurality of second main electrode regions. The plurality of second contact portions are each so formed in the insulating layer as to expose part of an upper surface of a portion in the base layer which is surrounded by a side surface of the second trench on the side of the boundary, side surfaces of the adjacent first portions and a side surface of an outermost second portion of the plurality of second portions which faces the second trench. The first electrode layer for second main electrode is formed in the plurality of first contact portions and the plurality of second contact portions and on a portion in the insulating layer which is located on the cell region of the first main surface, having one end portion away from the boundary by a seventh distance along the first direction, extending along the second direction and being electrically connected to each of the plurality of second main electrode regions and the base layer. The third contact portion is so formed in the insulating layer as to expose part of the upper surface of the second gate control electrode. The gate electrode is formed inside the third contact portion, on a portion in the insulating layer which is defined by the boundary and a location away from the boundary towards the cell region along the first direction by a third distance shorter than the seventh distance and on a portion in the insulating layer which is defined by the boundary and a location away from the boundary towards the terminal region along the first direction by a fourth distance shorter than the first distance, extends along the second direction and is electrically connected to the second gate control electrode through the third contact portion. The fourth contact portion is so formed in the insulating layer as to expose part of an upper surface of a portion in the base layer which is sandwiched between a location away from the boundary towards the terminal region along the first direction by a fifth distance which is shorter than the first distance and longer than the fourth distance and the other end of the base layer away from the boundary by the first distance. The second electrode layer for second main electrode is formed in the fourth contact portion and on a portion in the insulating layer which is defined by the location away from the boundary towards the terminal region along the first direction by the fifth distance and a location away from the boundary towards the terminal region along the first direction by a sixth distance longer than the first distance, extending along the second direction and being electrically connected to the base layer through the fourth contact portion. Both the length of the first electrode layer for second main electrode and that of the second electrode layer for second main electrode along the second direction are longer than the length of the gate electrode along the second direction. The insulated gate semiconductor device further includes a connection layer.

The connection layer having a side surface which is from one end portion of the gate electrode in the second direction by a predetermined distance along the second direction and extends along the first direction, is formed on a portion of the insulating layer which is defined by the one end portion of the first electrode layer for second main electrode and the location away from the boundary towards the terminal region by the fifth distance along the first direction, and configured to electrically connect the first electrode layer for second main electrode and the second electrode layer for second main electrode to each other.

The second aspect of the present invention produces the above effects (1) and (2).

According to a third aspect of the present invention, the insulated gate semiconductor device having an MOS transistor, structure includes a semiconductor substrate of a first conductivity type having a first main surface and a second main surface which are opposed to each other in a third direction, a base layer of a second conductivity type, a well layer of the second conductivity type, a first trench, a first gate insulating film and a first main electrode formed on the second main surface. The base layer of a second conductivity type is formed from a cell region in the first main surface towards a first bottom surface located inside the semiconductor substrate along the third direction, and has one end portion located on a boundary between the cell region and a terminal region adjacent to the cell region and a first depth from the first main surface to the first bottom surface. The well layer of the second conductivity type, being connected to the one end portion of the base layer in the boundary, is formed from a region in the terminal region of the first main surface which is defined by one end which is the boundary and the other end away from the boundary towards the terminal region by a first distance along the first direction, towards a fourth bottom surface located inside the semiconductor substrate along the third direction, and has a fourth depth from the first main surface to the fourth bottom surface. The first trench is formed from the cell region in the first main surface, through the base layer, up to a second bottom surface located inside the semiconductor substrate along the third direction, and has a second depth from the first main surface to the second bottom surface. The first gate insulating film is formed entirely on the second bottom surface and side surfaces of the first trench. The first direction is parallel to the first main surface and orthogonal to the third direction, the first depth is smaller than the second depth, the second depth is smaller than the fourth depth, and the well layer further has a base-layer covering portion formed from a portion in the first bottom surface of the base layer which is sandwiched between the boundary and a location away from the boundary by a fifth distance along the first direction, towards the fourth bottom surface of the well layer up to the inside of the semiconductor substrate. The first trench has a plurality of first portions and a plurality of second portions, the plurality of first portions are arranged along a second direction orthogonal to the first direction and the third direction, each of the plurality of first portions has one end portion located on the boundary between the cell region and the terminal region and extends towards the one end portion along the first direction, and each of the plurality of second portions is located between adjacent first portions out of the plurality of first portions and extends along the second direction to connect the adjacent first portions to each other. The insulated gate semiconductor device further includes a plurality of second main electrode regions of the first conductivity type, a first gate control electrode, a second trench, a second gate insulating film, a second gate control electrode, an insulating layer, a plurality of first contact portions, a plurality of second contact portions, a second main electrode, a third contact portion and a gate electrode. The plurality of second main electrode regions of the first conductivity type are each formed from a region in the cell region of the first main surface which is surrounded by the adjacent first portions and adjacent second portions out of the plurality of second portions corresponding to the adjacent first portions towards an inside of the base layer along upper portions of side surfaces of the adjacent first portions and upper portions of side surfaces of the adjacent second portions. The first gate control electrode is so formed inside the first trench as to be located beneath an upper surface of the first trench and fills the first trench with the first gate insulating film interposed therebetween. The second trench is formed from a region in the first main surface which is defined by the one end which is the boundary and the other end away from the boundary towards the terminal region by a second distance shorter than the first distance along the first direction, up to a third bottom surface located inside the well layer along the third direction, and has a third depth from the first main surface to the third bottom surface and extends along the second direction, being connected to the one end portion which each of the plurality of first portions has. The second gate insulating film is formed entirely on the third bottom surface and side surfaces of the second trench. The second gate control electrode is so formed inside the second trench as to be located beneath an upper surface of the second trench, fills the second trench with the second gate insulating film interposed therebetween, and is electrically connected to the first gate control electrode at the one end portion which each of the plurality of first portions has. The insulating layer is formed on an upper surface of the base layer, an upper surface of the first gate control electrode, an upper surface of the first gate insulating film, an upper surface of the second gate control electrode, an upper surface of the second gate insulating film, an upper surface of the well layer and a region in the terminal region of the first main surface, which is located outside an end of the well layer. The plurality of first contact portions are each so formed in the insulating layer as to expose part of an upper surface which each of the plurality of second main electrode regions has and an upper surface of a portion in the base layer which is surrounded by each of the plurality of second main electrode regions. The plurality of second contact portions are each so formed in the insulating layer as to expose part of an upper surface of a portion in the base layer which is surrounded by a side surface of the second trench on the side of the boundary, side surfaces of the adjacent first portions and a side surface of an outermost second portion of the plurality of second portions which faces the second trench. The second main electrode is formed in the plurality of first contact portions and the plurality of second contact portions and on a portion in the insulating layer which is located on the cell region of the first main surface, and has one end portion away from the boundary by a sixth distance larger than the fifth distance along the first direction and extends along the second direction, being electrically connected to each of the plurality of second main electrode regions and the base layer. The third contact portion is so formed in the insulating layer as to expose part of the upper surface of the second gate control electrode. The gate electrode is formed inside the third contact portion, on a portion in the insulating layer which is defined by the boundary and a location away from the boundary towards the cell region along the first direction by a third distance shorter than the fifth distance and on a portion in the insulating layer which is defined by the boundary and a location away from the boundary towards the terminal region along the first direction by a fourth distance longer than the first distance, extends along the second direction, and is electrically connected to the second gate control electrode through the third contact portion. The third depth is larger than the first depth, and the fourth depth is larger than the third depth.

The third aspect of the present invention produces the above effects (1) and (2), and further produces (3) an effect of relieving the electric field occurring at the tip portion of the second trench on application of the breakdown voltage between the first and second main electrodes and thereby stabilizing the breakdown voltage.

According to a fourth aspect of the present invention, the insulated gate semiconductor device having an MOS transistor structure includes a semiconductor substrate of a first conductivity type having a first main surface and a second main surface which are opposed to each other in a third direction, a base layer of a second conductivity type, a well layer of the second conductivity type, a first trench, a first gate insulating film and a first main electrode. The base layer of a second conductivity type is formed from a cell region in the first main surface towards a first bottom surface located inside the semiconductor substrate along the third direction, and has one end portion located on a boundary between the cell region and a terminal region adjacent to the cell region and a first depth from the first main surface to the first bottom surface. The well layer of the second conductivity type, being connected to the one end portion of the base layer in the boundary, is formed from a region in the terminal region of the first main surface which is defined by one end which is the boundary and the other end away from the boundary towards the terminal region by a first distance along the first direction, towards a fourth bottom surface located inside the semiconductor substrate along the third direction, and has a fourth depth from the first main surface to the fourth bottom surface. The first trench is formed from the cell region in the first main surface, through the base layer, up to a second bottom surface located inside the semiconductor substrate along the third direction, and has a second depth from the first main surface to the second bottom surface. The first gate insulating film is formed entirely on the second bottom surface and side surfaces of the first trench. The first main electrode is formed on the second main surface. The first direction is parallel to the first main surface and orthogonal to the third direction, the first depth is smaller than the second depth and the second depth is smaller than the fourth depth. The well layer further has a base-layer covering portion formed from a portion in the second bottom surface of the base layer which is sandwiched between the boundary and a location away from the boundary by an eighth distance along the first direction, towards the fourth bottom surface of the well layer up to an inside of the semiconductor substrate. The first trench has a plurality of first portions and a plurality of second portions, the plurality of first portions are arranged along a second direction orthogonal to the first direction and the third direction, each of the plurality of first portions has one end portion located on the boundary between the cell region and the terminal region and extends towards the one end portion along the first direction, and each of the plurality of second portions is located between adjacent first portions out of the plurality of first portions and extends along the second direction to connect the adjacent first portions to each other. The insulated gate semiconductor device further includes a plurality of second main electrode regions of the first conductivity type, a first gate control electrode, a second trench, a second gate insulating film, a second gate control electrode, an insulating layer, a plurality of first contact portions, a plurality of second contact portions, a first electrode layer for second main electrode, a third contact portion, a gate electrode, a fourth contact portion and a second electrode layer for second main electrode. The plurality of second main electrode regions of the first conductivity type are each formed from a region in the cell region of the first main surface, which is surrounded by the adjacent first portions and adjacent second portions out of the plurality of second portions corresponding to the adjacent first portions towards an inside of the base layer along upper portions of side surfaces of the adjacent first portions and upper portions of side surfaces of the adjacent second portions. The first gate control electrode is so formed inside the first trench as to be located beneath an upper surface of the first trench and fills the first trench with the first gate insulating film interposed therebetween. The second trench is formed from a region in the first main surface which is defined by the one end which is the boundary and the other end away from the boundary towards the terminal region by a second distance shorter than the first distance along the first direction, up to a third bottom surface located inside the well layer along the third direction, and has a third depth from the first main surface to the third bottom surface and extends along the second direction, being connected to the one end portion which each of the plurality of first portions has. The second gate insulating film is formed entirely on the third bottom surface and side surfaces of the second trench. The second gate control electrode is so formed inside the second trench as to be located beneath an upper surface of the second trench and fills the second trench with the second gate insulating film interposed therebetween, and is electrically connected to the first gate control electrode at the one end portion which each of the plurality of first portions has. The insulating layer is formed on an upper surface of the base layer, an upper surface of the first gate control electrode, an upper surface of the first gate insulating film, an upper surface of the second gate control electrode, an upper surface of the second gate insulating film, an upper surface of the well layer and a region in the terminal region of the first main surface which is located outside an end of the well layer. The plurality of first contact portions are each so formed in the insulating layer as to expose part of an upper surface which each of the plurality of second main electrode regions has and an upper surface of a portion in the base layer which is surrounded by each of the plurality of second main electrode regions. The plurality of second contact portions are each so formed in the insulating layer as to expose part of an upper surface of a portion in the base layer which is surrounded by a side surface of the second trench on the side of the boundary, side surfaces of the adjacent first portions and a side surface of an outermost second portion of the plurality of second portions which faces the second trench. The first electrode layer for second main electrode is formed in the plurality of first contact portions and the plurality of second contact portions and on a portion in the insulating layer which is located on the cell region of the first main surface, and has one end portion away from the boundary by a seventh distance longer than the eighth distance along the first direction and extends along the second direction, being electrically connected to each of the plurality of second main electrode regions and the base layer. The third contact portion is so formed in the insulating layer as to expose part of the upper surface of the second gate control electrode. The gate electrode is formed inside the third contact portion, on a portion in the insulating layer which is defined by the boundary and a location away from the boundary towards the cell region along the first direction by a third distance shorter than the eighth distance and on a portion in the insulating layer which is defined by the boundary and a location away from the boundary towards the terminal region along the first direction by a fourth distance shorter than the first distance, extends along the second direction, and is electrically connected to the second gate control electrode through the third contact portion. The fourth contact portion is so formed in the insulating layer as to expose part of an upper surface of a portion in the well layer which is sandwiched between a location away from the boundary towards the terminal region along the first direction by a fifth distance which is shorter than the first distance and longer than the fourth distance and the other end of the well layer away from the boundary by the first distance. The second electrode layer for second main electrode is formed in the fourth contact portion and on a portion in the insulating layer which is defined by the location away from the boundary towards the terminal region along the first direction by the fifth distance and a location away from the boundary towards the terminal region along the first direction by a sixth distance longer than the first distance, extending along the second direction and being electrically connected to the well layer through the fourth contact portion. Both the length of the first electrode layer for second main electrode and that of the second electrode layer for second main electrode along the second direction are longer than the length of the gate electrode along the second direction. The insulated gate semiconductor device further includes a connection layer. The connection layer having a side surface which is away from one end portion of the gate electrode in the second direction by a predetermined distance along the second direction and extends along the first direction, is formed on a portion of the insulating layer which is defined by the one end portion of the first electrode layer for second main electrode and the location away from the boundary towards the terminal region by the fifth distance along the first direction, and configured to electrically connect the first electrode layer for second main electrode and the second electrode layer for second main electrode to each other. The third depth is larger than the first depth, and the fourth depth is larger than the third depth.

The fourth aspect of the present invention produces the above effects (1), (2) and (3).

According to a fifth aspect of the present invention, the insulated gate semiconductor device having an MOS transistor structure includes a semiconductor substrate of a first conductivity type having a first main surface and a second main surface which are opposed to each other in a third direction, a base layer of a second conductivity type, a first trench, a first gate insulating film and a first main electrode formed on the second main surface. The base layer of a second conductivity type is formed from a cell region in the first main surface towards a first bottom surface located inside the semiconductor substrate along the third direction, and has one end portion located on a boundary between the cell region and a terminal region adjacent to the cell region and a first depth from the first main surface to the first bottom surface. The first trench is formed from the cell region in the first main surface, through the base layer, up to a second bottom surface located inside the semiconductor substrate along the third direction, and has a second depth from the first main surface to the second bottom surface. The first gate insulating film is formed entirely on the second bottom surface and side surfaces of the first trench. The first direction is parallel to the first main surface and orthogonal to the third direction, and the first depth is smaller than the second depth. The first trench has a plurality of first portions and a plurality of second portions, the plurality of first portions are arranged along a second direction orthogonal to the first direction and the third direction, each of the plurality of first portions has one end portion located on the boundary between the cell region and the terminal region and extends towards the one end portion along the first direction, and each of the plurality of second portions is located between adjacent first portions out of the plurality of first portions and extends along the second direction to connect the adjacent first portions to each other. The insulated gate semiconductor device further includes a plurality of second main electrode regions of the first conductivity type, a first gate control electrode, a second trench, a second gate insulating film, a second gate control electrode, an insulating layer, a plurality of first contact portions, a plurality of second contact portions, a second main electrode, a third contact portion and a gate electrode. The plurality of second main electrode regions of the first conductivity type are each formed from a region in the cell region of the first main surface, which is surrounded by the adjacent first portions and adjacent second portions out of the plurality of second portions corresponding to the adjacent first portions, towards an inside of the base layer along upper portions of side surfaces of the adjacent first portions and upper portions of side surfaces of the adjacent second portions. The first gate control electrode is so formed inside the first trench as to be located beneath an upper surface of the first trench and fills the first trench with the first gate insulating film interposed therebetween. The second trench is formed from a region in the first main surface which is defined by the one end which is the boundary and the other end away from the boundary toward the terminal region by a first distance along the first direction, up to a third bottom surface located inside the semiconductor substrate along the third direction, and has a third depth from the first main surface to the third bottom surface and extends along the second direction, being connected to the one end portion which each of the plurality of first portions has. The second gate insulating film is formed entirely on the third bottom surface and side surfaces of the second trench. The second gate control electrode is so formed inside the second trench as to be located beneath an upper surface of the second trench and fills the second trench with the second gate insulating film interposed therebetween, and is electrically connected to the first gate control electrode at the one end portion which each of the plurality of first portions has. The insulating layer is formed on an upper surface of the base layer, an upper surface of the first gate control electrode, an upper surface of the first gate insulating film, an upper surface of the second gate control electrode, an upper surface of the second gate insulating film and a portion of the first main surface which is located outside one of the side surfaces of the second trench on the side of the terminal region. The plurality of first contact portions are each so formed in the insulating layer as to expose part of an upper surface which each of the plurality of second main electrode regions has and an upper surface of a portion in the base layer which is surrounded by each of the plurality of second main electrode regions. The plurality of second contact portions are each so formed in the insulating layer as to expose part of an upper surface of a portion in the base layer which is surrounded by a side surface of the second trench on the side of the boundary, side surfaces of the adjacent first portions and a side surface of an outermost second portion of the plurality of second portions which faces the second trench. The second main electrode is formed in the plurality of first contact portions and the plurality of second contact portions and on a portion in the insulating layer which is located on the cell region of the first main surface, has one end portion away from the boundary by a fourth distance along the first direction and extends along the second direction, and is electrically connected to each of the plurality of second main electrode regions and the base layer. The third contact portion is so formed in the insulating layer as to expose part of the upper surface of the second gate control electrode. The gate electrode is formed inside the third contact portion, on a portion in the insulating layer which is defined by the boundary and a location away from the boundary towards the cell region along the first direction by a third distance shorter than the fourth distance and on a portion in the insulating layer which is defined by the boundary and a location away from the boundary towards the terminal region along the first direction by a second distance longer than the first distance, extends along the second direction, and is electrically connected to the second gate control electrode through the third contact portion. The third depth is larger than the first depth. No semiconductor layer of the second conductivity type is formed in a portion of the semiconductor substrate which is located immediately below the gate electrode, which is defied by a side surface of the second trench on the side of the terminal region and the location away from the boundary towards the terminal region by the second distance along the first direction.

The fifth aspect of the present invention produces the above effects (1) and (2) and further produces (4) an effect of avoiding deterioration in main breakdown voltage due to the curvature of the base layer located outside the second trench and thereby ensuring further improvement in main breakdown voltage.

According to a sixth aspect of the present invention, the insulated gate semiconductor device having an MOS transistor structure includes a semiconductor substrate of a first conductivity type having a first main surface and a second main surface which are opposed to each other in a third direction, a base layer of a second conductivity type, a trench, a gate insulating film and a first main electrode. The base layer of a second conductivity type is formed from a cell region in the first main surface and a region in the first main surface which is defined by one end which is a boundary between the cell region and a terminal region adjacent to the cell region and the other end away from the boundary towards the terminal region by a first distance along a first direction, towards an inside of the semiconductor substrate along the third direction. The trench is formed from the cell region in the first main surface, through the base layer, up to the inside of the semiconductor substrate along the third direction. The gate insulating film is formed entirely on a bottom surface and side surfaces of the trench. The first main electrode is formed on the second main surface. The first direction is parallel to the first main surface and orthogonal to the third direction, and a first depth from the first main surface to a bottom surface of the base layer is smaller than a second depth from the first main surface to the bottom surface of the trench. The trench has a plurality of first portions and a plurality of second portions, the plurality of first portions are arranged along a second direction orthogonal to the first direction and the third direction, each of the plurality of first portions has one end portion located on the boundary between the cell region and the terminal region and extends towards the one end portion along the first direction, and each of the plurality of second portions is located between adjacent first portions out of the plurality of first portions and extends along the second direction to connect the adjacent first portions to each other. The insulated gate semiconductor device further includes a plurality of second main electrode regions of the first conductivity type, a gate control electrode, an insulating layer, a plurality of first contact portions, a plurality of second contact portions, a second main electrode, a plurality of third contact portions and a gate electrode. The plurality of second main electrode regions of the first conductivity type are each formed from a region in the cell region of the first main surface which is surrounded by the adjacent first portions and adjacent second portions out of the plurality of second portions corresponding to the adjacent first portions towards an inside of the base layer along upper portions of side surfaces of the adjacent first portions and upper portions of side surfaces of the adjacent second portions. The gate control electrode is so formed inside the trench as to be located beneath an upper surface of the trench and fills the trench with the gate insulating film interposed therebetween. The insulating layer is formed on an upper surface of the base layer, an upper surface of the gate control electrode, an upper surface of the gate insulating film and a region in the terminal region of the first main surface which is located outside an end of the base layer. The plurality of first contact portions are each so formed in the insulating layer as to expose part of an upper surface which each of the plurality of second main electrode regions has and an upper surface of a portion in the base layer which is surrounded by each of the plurality of second main electrode regions. The plurality of second contact portions are each so formed in the insulating layer as to expose part of an upper surface of a portion in the base layer which is defined by the boundary, side surfaces of the adjacent first portions and a side surface of an outermost second portion of the plurality of second portions which faces the boundary. The second main electrode is formed in the plurality of first contact portions and the plurality of second contact portions and on a portion in the insulating layer which is located on the cell region of the first main surface, extends along the second direction, and is electrically connected to each of the plurality of second main electrode regions and the base layer. The plurality of third contact portions which are provided for the plurality of first portions, respectively, are each so formed in the insulating layer as to expose a portion which is sandwiched between a first location away from the boundary along the first direction by a fourth distance and a second location away from the boundary along the first direction by a fifth distance longer than the fourth distance in an upper surface of a portion of the gate control electrode filling each of the plurality of first portions. The gate electrode is formed inside each of the plurality of third contact portions, on a portion in the insulating layer which is defined by the boundary and a location away from the boundary towards the cell region along the first direction by a third distance longer than the fifth distance and on a portion in the insulating layer which is defined by the boundary and a location away from the boundary towards the terminal region along the first direction by a second distance longer than the first distance, extends along the second direction, and is electrically connected to the gate control electrode through the plurality of third contact portions.

The sixth aspect of the present invention produces the above effects (1) and (2) and further produces (5) an effect of eliminating the $\mu$ loading effect in trench etching because of no second trench and thereby uniformizing the depths of trenches.

The present invention is also intended for a method of manufacturing a gate interconnection structure.

According to a seventh aspect of the present invention, the method of manufacturing a gate interconnection structure includes the following steps (a) to (g). The step (a) is to form a base layer of a second conductivity type from a main surface of a semiconductor substrate of a first conductivity type up to an inside of the semiconductor substrate along a third direction. The step (b) is to form a first trench penetrating the base layer, extending along a first direction which is in parallel with the main surface and orthogonal to the third direction and having a bottom surface inside the semiconductor substrate and a second trench penetrating the base layer, extending along a second direction orthogonal to the first direction and the third direction while being connected to one end portion of the first trench in the first direction and having a bottom surface inside the semiconductor substrate. The step (c) is to form a first gate oxide film on the bottom surface and side surfaces of the first trench and a second gate oxide film on the bottom surface and side surfaces of the second trench. The step (d) is to form a first gate control electrode which fills the first trench with the first gate oxide film interposed therebetween and a second gate control electrode which fills the second trench with the second gate oxide film interposed therebetween. The step (e) is to form an insulating layer, which covers an upper surface of the first gate control electrode and an upper surface of the second gate control electrode, on the main surface of the semiconductor substrate. The step (f) is to form a gate contact portion in the insulating layer, the gate contact portion exposing the upper surface of the second gate control electrode. The step (g) is to form a gate electrode on an upper surface of the insulating layer, the gate electrode filling the gate contact portion and having one end portion protruding outside beyond an end portion of the base layer in the first direction.

The seventh aspect of the present invention produces an effect of reducing the number of process steps as compared with the method of manufacturing the unpublished product made by the present applicant company in which the gate control electrode is drawn up to above the trench at the corner portion of the trench.

According to an eighth aspect of the present invention, the method of manufacturing a gate interconnection structure includes the following steps (a) to (g). The step (a) is to form a base layer of a second conductivity type from a main surface of a semiconductor substrate of a first conductivity type up to an inside of the semiconductor substrate along a third direction. The step (b) is to form a first trench penetrating the base layer, extending along a first direction which is in parallel with the main surface and orthogonal to the third direction and having a bottom surface inside the semiconductor substrate and a second trench penetrating the base layer, extending along a second direction orthogonal to the first direction and the third direction while being connected to one end portion of the first trench in the first direction and having a bottom surface inside the semiconductor substrate. The step (c) is to form a first gate oxide film on the bottom surface and side surfaces of the first trench and a second gate oxide film on the bottom surface and side surfaces of the second trench. The step (d) is to form a first gate control electrode which fills the first trench with the first gate oxide film interposed therebetween and a second gate control electrode which fills the second trench with the second gate oxide film interposed therebetween. The step (e) is to form an insulating layer, which covers an upper surface of the first gate control electrode and an upper surface of the second gate control electrode, on the main surface of the semiconductor substrate. The step (f) is to form a gate contact portion and a source contact portion in the insulating layer, the gate contact portion exposing the upper surface of the second gate control electrode, the source contact portion exposing an upper surface of the base layer located outside the second trench. The step (g) is to form a gate electrode and a source electrode on an upper surface of the insulating layer, the gate electrode filling the gate contact portion, the source electrode filling the source contact portion and having one end portion protruding outside beyond an end portion of the base layer in the first direction.

The eighth aspect of the present invention produces an effect of easily manufacturing a gate interconnection structure in which the source electrode itself serves as a field plate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph of measurement result, showing a relation between a depth of a trench and a breakdown voltage;

FIG. 3 is a graph showing a simulation result for demonstrating an effect of the first preferred embodiment;

FIG. 7 is a view showing a structure of a semiconductor device in accordance with a fourth variation of the present invention;

FIG. 10 is a plan view showing a structure of a semiconductor device in accordance with a second preferred embodiment of the present invention;

FIGS. 11B and 11C are longitudinal sections showing the structure of the semiconductor device in accordance with the second preferred embodiment of the present invention;

FIGS. 14B and 14C are views showing a structure of a semiconductor device in accordance with an eighth variation of the present invention;

FIGS. 20, 21A and 21B, 22, 23A and 23B, 24, 25A and 25B, 26, 27A and 27B, 28, 29A and 29B, 30, 31A and 31B, 32, 33A and 33B, 34, 35A and 35B, 36, 37A and 37B, 38, 39A and 39B, 40, 41A and 41B, 42 and 43A and 43B are longitudinal sections each showing a process step of manufacturing a semiconductor device in accordance with a sixth preferred embodiment of the present invention;

FIGS. 61B and 61C are both longitudinal sections, each showing the state in which the subject matter of the second preferred embodiment of the present invention is applied to a trench gate type IGBT;

DESCRIPTION OF THE PREFERRED EMBODIMENTS

For convenience of discussion, in the following preferred embodiments taken is a UMOSFET which is a vertical power transistor as an example of an insulated gate semiconductor device having an MOS transistor structure in accordance with the present invention. It is natural, however, that the present invention is not limited to the UMOSFET but can be generally applied to an insulated gate semiconductor device having a gate trench structure. Among another examples of such an insulated gate semiconductor device are a VMOSFET and an IGBT.

The First Preferred Embodiment

Figure 1A:
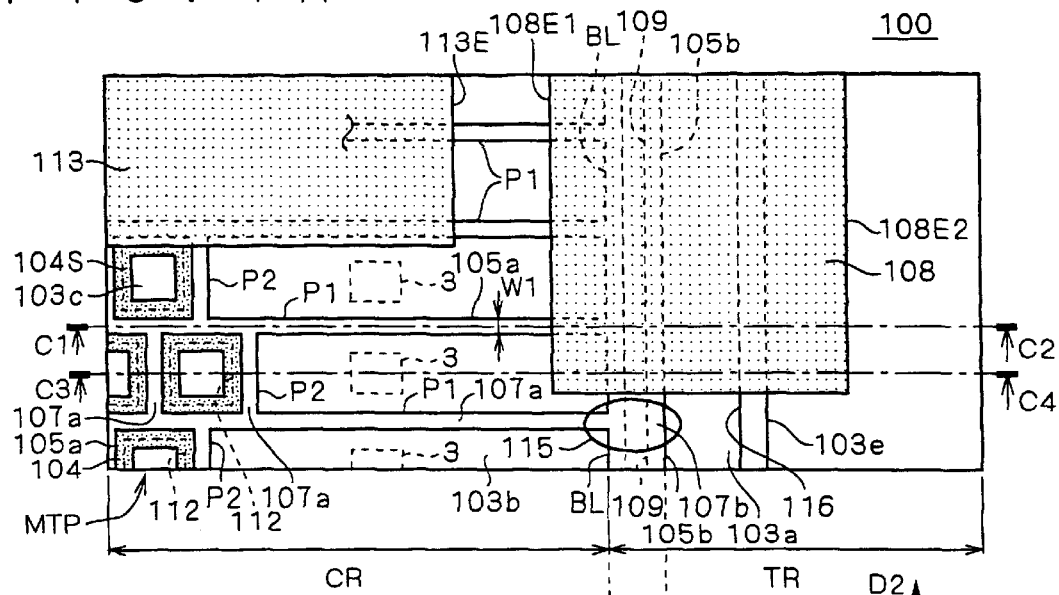
FIGS. 1A, 1B and 1C are views showing a structure of a semiconductor device in accordance with a first preferred embodiment of the present invention.
Figure 1B:
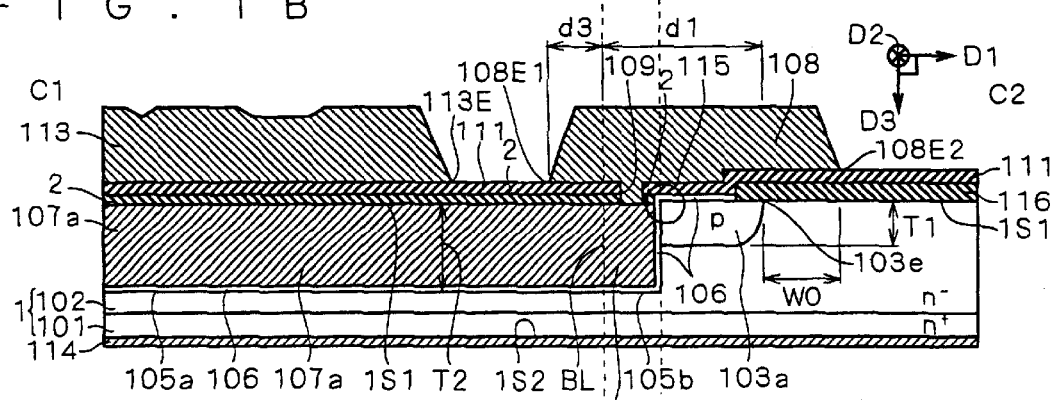
Figure 1C:
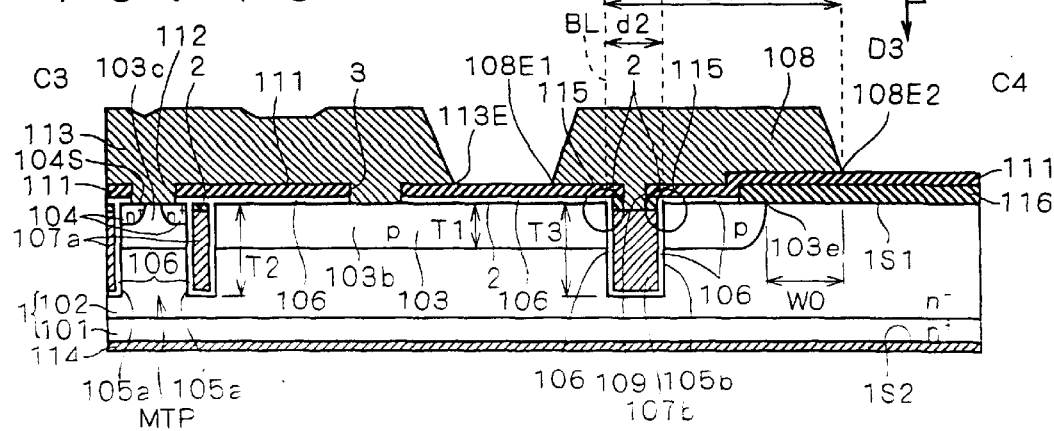

FIGS. 1A, 1B and 1C are views schematically and enlargedly showing a gate interconnection structure 100 which is part of an n-channel UMOSFET in accordance with the first preferred embodiment of the present invention. In particular, FIG. 1A is a plan view of the gate interconnection structure 100 and FIG. 1B is a longitudinal section taken along a line C1–C2 in FIG. 1A showing an arrangement of constituent elements as the inner structure of first portion P1 of a first trench 105a discussed later is viewed. Further, FIG. 1C is a longitudinal section taken along a line C3–C4 in FIG. 1A, showing a silicon mesa region outside the first portion P1 of the first trench 105a. Furthermore, in FIG. 1A, for convenience of illustration, a second main electrode 113 and a gate electrode 108 discussed later are shown being each divided.

As shown in FIG. 1A, a cell region CR is a core region including an MOS transistor portion MTP in which elements of the UMOSFET are formed, and a terminal region TR adjacent to the cell region CR with a boundary BL interposed therebetween is a region sandwiched between a channel stopper region (not shown) located at a peripheral edge of a semiconductor substrate 1 discussed later and the cell region CR. Constituent elements discussed later, such as a second trench 105b, the gate electrode 108, a peripheral edge side p base layer 103a and a gate bonding electrode or a gate pad electrode (not shown), are formed in the terminal region TR.

Referring to FIGS. 1A, 1B and 1C, constituent elements will be described below.

As shown in FIGS. 1B and 1C, first, the semiconductor substrate 1 of the first conductivity type whose base material is silicon has a double-layer structure constituted of a semiconductor layer 101 which is a base and a semiconductor layer 102 formed on the semiconductor layer 101, and has a first main surface 1S1 and a second main surface 1S2 which are opposed to each other in a third direction D3, i.e., a direction of thickness of the semiconductor substrate 1. Herein, the first conductivity type corresponds to an n type. The semiconductor layer 101 is an $n^+$-type substrate containing n-type impurities of relatively high concentration and on the other hand, the semiconductor layer 102 is an epitaxial layer containing n-type impurities of relatively low concentration formed entirely on an upper main surface of the semiconductor layer 101 by an epitaxial growth method. On the main surface 1S2 of the semiconductor substrate 1, a first main electrode 114 serving as a drain electrode is provided.

Further, in the semiconductor layer 102 formed is a semiconductor layer (referred to as a p base layer) 103 containing impurities of the second conductivity type (which corresponds to p type herein). Specifically, the base layer 103 of the second conductivity type is formed (1) from the cell region CR of the first main surface 1S1 towards the inside of the semiconductor substrate 1 along the third direction D3 and further (2) from a region in the terminal region TR of the first main surface 1S1 which is defined or drawn by one end which is the boundary BL and the other end away from the boundary BL by a first distance d1 along a first direction D1, towards the inside of the semiconductor substrate 1 immediately therebelow along the third direction D3. Herein, the first direction D1 is a direction parallel to the first main surface 1S1 and the second main surface 1S2 and orthogonal to the third direction D3. In particular, a portion of the base layer 103 which is formed beneath the terminal region TR of the first main surface 1S1 and partially separated from a portion immediately below the cell region CR by the second trench 105b discussed later is referred to as a "peripheral edge side base layer 103a". The peripheral edge side base layer 103a has a corner portion with a predetermined curvature.

Furthermore, the ladder-like first trench 105*a* is formed from the cell region CR of the first main surface 1S1, through the base layer 103, up to the inside of the semiconductor substrate 1 along the third direction D3. Therefore, a second depth T2 from the first main surface 1S1 to a bottom surface of the first trench 105*a* is larger than a first depth T1 from the first main surface 1S1 to a bottom surface of the base layer 103 (T1<T2). In more detail, the first trench 105*a* has a plurality of first portions P1 and a plurality of second portions P2. A plurality of first portions P1 are arranged at predetermined intervals along a second direction D2 orthogonal to the first direction D1 and the third direction D3, and each of the first portions P1 has one end portion located on the boundary BL between the cell region CR and the terminal region TR, extending towards the one end portion along the first direction D1. On the other hand, each of the second portions P2 is arranged between adjacent ones of the first portions P1, extending along the second direction D2 to connect the adjacent first portions P1 to each other.

A gate oxide film 106 is formed entirely on bottom surfaces and side surfaces of the first portions P1 and second portions P2 of the first trench 105*a* and on an upper surface of the base layer 103. Herein, a portion of the gate oxide film 106 which is formed entirely on the bottom surface and side surfaces of the first trench 105*a* is referred to as "a first gate insulating film".

Further, a first gate control electrode 107*a* is formed uniformly inside the first trench 105*a* in which the first gate insulating film 106 is formed so that its upper surface should be located slightly beneath an upper surface of the first trench 105*a*. In other words, the first gate control electrode 107*a* fills the first trench 105*a* with the first gate insulating film 106 interposed therebetween. The first gate control electrode 107*a* directly contributes to driving of an MOS transistor, and is formed of polysilicon of high concentration. Further, on an upper surface of the first gate control electrode 107*a*, a cap oxide film 2 is formed.

Next, in the MOS transistor portion MTP, a source region (hereinafter, referred to as a "second main electrode region") 104 which is a semiconductor layer containing n-type impurities is selectively so formed inside the base layer 103 as to be completely surrounded by the first trench 105*a*. Specifically, the second main electrode region 104 of the first conductivity type is formed from a region in the cell region CR of the first main surface 1S1 which is surrounded by the adjacent first portions P1 corresponding to the region 104 and the adjacent second portions P2 corresponding to the region 104 up to the inside of the base layer 103 along upper portions of the opposed side surfaces of the adjacent first portions P1 and upper portions of the opposed side surfaces of the adjacent second portions P2. Therefore, the plan-view shape or the cross-sectional shape of the respective second main electrode regions 104 is a quadrangle with a hollow center portion. On a portion of an upper surface of the second main electrode region 104 near an edge or the upper surface of the first trench 105*a*, the gate oxide film 106 is formed.

Further, a second trench 105*b* is formed from a region in the terminal region TR of the first main surface 1S1 which is defined (drawn) by an end which is the boundary BL and the other end away from the boundary BL by a second distance d2 along the first direction D1, through the base layer 103 immediately therebelow, towards the inside of the semiconductor substrate 1 along the third direction D3. Herein, the second distance d2 is shorter than the first distance d1 (d2<d1). Moreover, the second trench 105*b* has a third depth T3 larger than the first depth T1, and extends along the second direction D2, being connected to the one end portion of each first portion P1. Furthermore, though not shown in FIG. 1A, the second trench 105*b* is separated by part of the base layer 103 at a midpoint of extension along the second direction D2. In other words, the peripheral edge side base layer 103*a* is electrically and mechanically connected to a portion 103*b* of the base layer 103 immediately below the cell region CR through a separating portion (not shown) of the second trench 105*b*. The second trench 105*b* is formed at the same time when the first trench 105*a* is formed.

The gate oxide film 106 is further formed entirely on a bottom surface and side surfaces of the second trench 105*b*. In particular, the gate oxide film 106 formed entirely on an inner wall of the second trench 105*b* is referred to as a "second gate insulating film" in distinction from the gate oxide film 106 formed on other portions.

Further, a second gate control electrode 107*b* is formed uniformly inside the second trench 105*b* so that its upper surface should be located slightly beneath an upper surface or an edge of the second trench 105*b*. Herein, the second gate control electrode 107*b* is formed of polysilicon of high concentration. With this structure, the second gate control electrode 107*b* fills the second trench 105*b* with the second gate insulating film 106 interposed therebetween and is electrically and mechanically connected to the first gate control electrode 107*a* at the one end portion of each first portion P1 which corresponds to a connection portion of the both trenches. Furthermore, on an upper surface of the second gate control electrode 107*b*, the cap oxide film 2 is formed. The cap oxide film 2 is continuous with the gate oxide film 106 on the upper surface of the base layer 103 (103*b*) and also continuous with the cap oxide film 2 on the upper surface of the first gate control electrode 107*a*.

In a region of the first main surface 1S1 which is located outside an end 103*e* of the peripheral edge side base layer 103*a* and extends towards the channel stopper, an insulating oxide film 116 is formed and further the insulating oxide film 116 is continuously formed on a region in the upper surface of the peripheral edge side base layer 103*a* from a location slightly closer to the second trench 105*b* than a location above a bottom surface of the corner portion of the peripheral edge side base layer 103*a* up to the end 103*e* thereof. Further, the gate oxide film 106 is formed on a region in the upper surface of the peripheral edge side base layer 103*a* which is sandwiched between the cap oxide film 2 on the upper surface of the second gate control electrode 107*b* and an end of the insulating oxide film 116, and this gate oxide film 106 is continuous with the cap oxide film 2 and the insulating oxide film 116. Furthermore, a protection film 111 is formed entirely above the first main surface 1S1, and this protection film 111 covers all of the cap oxide film 2, the gate oxide film 106 and the insulating oxide film 116 which are sandwiched between a lower surface of the protection film 111 and the first main surface 1S1. The protection film 111 is formed of, e.g., BPSG film. Herein, the cap oxide film 2, the gate oxide film 106, the insulating oxide film 116 and the protection film 111 are generally referred to as "an insulating layer". Therefore, according to this definition, the insulating layer forms a film which is entirely provided on the upper surface of the base layer 103 (103*a*, 103*b*, 103*c*), the upper surface of the first gate control electrode 107*a*, the upper surface of the first gate insulating film 106 inside the first trench 105*a*, the upper surface of the second gate control electrode 107*b*, the upper surface of the second gate insulating film 106 inside the second trench 105*b* and a region in the terminal region TR of the first main surface 1S1 which is located outside the end 103e of the peripheral edge side base layer 103a.

Further, a plurality of first contact portions or first source contact portions 112 are each so formed in a hole shape (with cross section of quadrangle) in the insulating layer (106+111) as to expose part 104S of the upper surface of each second main electrode region (source region) 104 and an upper surface of portion located in a portion 103c of the base layer 103 which is sandwiched between the adjacent second portions P2 and surrounded by the respective second main electrode regions 104. Moreover, a plurality of second contact portions or second source contact portions 3 are each so formed in a hole shape (with cross section of quadrangle) in the insulating layer (106+111) as to expose part of an upper surface of each portion 103b of the base layer 103 which is surrounded by a side surface of the second trench 105b on the side of the boundary BL, the opposed side surfaces of the adjacent first portions P1 and a side surface on the side of the second trench of the second portion P2 facing the second trench 105b.

A second main electrode 113 is formed in a plurality of first contact portions 112 and a plurality of second contact portions 3 and on a portion of the insulating layer (106+111) (2+111) which is located on the cell region CR of the first main surface 1S1. Moreover, the second main electrode 113 extends along the second direction D2 while keeping a predetermined space between one end portion 113E thereof on the side of the boundary BL and one end portion 108E1 of the gate electrode 108 discussed later. Herein, in order to reduce a wire resistance, the second main electrode 113 is formed of, e.g., aluminum. Therefore, the second main electrode 113 is also referred to as a source aluminum electrode. Thus, since the second main electrode 113 completely fills both the source contact portions 112 and 3, the second main electrode 113 is electrically connected to each of the second main electrode regions (source regions) 104 and the base layer 103c immediately below the first source contact portion 112 through the first source contact portion 112 and also electrically connected to the base layer 103b immediately below the second source contact portion 3 through the second source contact portion 3.

Further, a third contact portion or a gate contact portion 109 is so formed in the insulating layer (2+111) on the side of the terminal region TR as to expose part of the upper surface of the second gate control electrode 107b. Moreover, the gate contact portion 109 has a stripe shape extending in parallel with the second trench 105b along the second direction D2 herein. By providing the gate contact portion 109 of stripe shape thus, it becomes possible to dramatically increase the area for electric connection (connection region) between the gate electrode 108 discussed later and the second gate control electrode 107b through the gate contact portion 109 and this consequently provides an advantage of reduction in gate wire resistance.

The gate electrode 108, filling the inside of the gate contact portion 109, is formed on a portion (2+111), (106+111) in the insulating layer which is defined by the boundary BL and the location 108E1 away from the boundary BL towards the cell region CR along the first direction D1 by a third distance d3 not reaching the one end portion 113E of the second main electrode 113, and further is continuously formed on a portion in the insulating layer which is defined by the boundary BL and a location 108E2 away from the boundary BL towards the terminal region TR along the first direction D1 by a fourth distance d4 larger than the first distance d1 (d4>d1). Therefore, the other end 108E2 of the gate electrode 108 on the side of the terminal region TR protrudes towards the channel stopper beyond the end 103e of the peripheral edge side base layer 103a by a distance WO (>0). Moreover, the gate electrode 108 extends in parallel with the second main electrode 113 along the second direction D2. With such a structure, the gate electrode 108 is electrically connected to the second gate control electrode 107b and accordingly the first gate control electrode 107a through the gate contact portion 109. Herein, in order to reduce a wire resistance, the gate electrode 108 is formed of aluminum. Therefore, the gate electrode 108 is also referred to as a gate aluminum electrode. Further, the gate electrode 108 is electrically and mechanically connected to the gate bonding electrode (gate pad) (not shown) formed in the terminal region TR.

With the above structure, the semiconductor device or the gate interconnection structure 100 of the present invention produces the following actions and effects. (1) First, the gate oxide film 106 formed on the upper portion of the side surfaces of the second trench 105b and a peripheral portion thereof is covered only with the cap oxide film 2 and the protection film 111, and moreover the second gate control electrode 107b is electrically connected to the gate aluminum electrode 108 through the gate contact portion 109 immediately above the second gate control electrode 107b. For this reason, a trench end corner portion 115 is not covered with the first gate control electrode 107a and the second gate control electrode 107b. Therefore, no gate control electrode is present at a portion where the gate oxide film 106 becomes thinner due to the curvature of the trench end corner portion 115, and it is possible to avoid the case where the electric field stress caused by application of the gate voltage is locally concentrated on the gate oxide film 106. (2) In the first preferred embodiment, since the gate contact portion 109 is provided immediately above the second trench 105b, it is required that a width d2 of the second trench 105b should be larger than a width W1 of the first trench 105a from the viewpoint of easily achieving such a structure. Then, when a dry etching is performed in a process of manufacturing the trench to obtain the trench width d2 which is larger than the trench width W1 in order to satisfy the above requirement, the depth T3 of the second trench 105b (which corresponds to the distance from the first main surface 1S1 to the bottom surface of the second trench 105b) becomes larger than the depth T2 of the first trench 105a due to the $\mu$ loading effect in the dry etching. In FIGS. 1B and 1C, however, for convenience of illustration, it is shown that these depths T2 and T3 are equal to each other, but actually the relation the depth T3>the depth T2 holds. For example, when the width W1 of the first portion P1 of the first trench 105a is 0.6 $\mu$m and the width d2 of the second trench 105b is 3 $\mu$m, the ratio of difference in depth (T3−T2)/(T2) reaches about 10%. Further, as shown in FIG. 2 (no prior art), the experimental result by the present inventors proves that a main breakdown voltage between a drain and a source becomes lower as the trench gets deeper.

Then, in the first preferred embodiment, in order to simultaneously solve such a problem adopted is a structure in which the other end 108E2 of the gate aluminum electrode 108 provided above the first main surface 1S1 with the insulating layer (116+111) interposed therebetween protrudes outside or towards the channel stopper beyond the end 103e of the peripheral edge side base layer 103a by the distance WO. With such a structure, the protrusion of the gate aluminum electrode 108 serves as a field plate, and it is possible to increase the main breakdown voltage between the drain and the source through the field plate effect of the gate aluminum electrode 108. Therefore, it is possible to compensate the decrease in main breakdown voltage due to the increase in depth of the trench by the increase in main breakdown voltage caused by this effect.

FIG. 3 is a graph showing a calculation result in a simulation of drain-source main breakdown voltage VDSS using a device simulator Medici on cases of a power UMOSFET with rating of 30 V whose distance WO of FIG. 1B is 10 μm and a power UMOSFET with rating of 30 V whose distance WO is 0 μm. As shown in FIG. 3, the drain-source main breakdown voltage VDSS is 37.5 V in the power UMOSFET whose distance WO is 0 μm while the drain-source main breakdown voltage VDSS is 44 V in the power UMOSFET whose distance WO is 10 μm, and in the latter case, the decrease in main breakdown voltage due to the increase in depth of the trench is compensated and a further increase in main breakdown voltage is achieved. Thus, it is easily understood from the simulation result of FIG. 3 that use of the field plate effect produced by the protrusion of the gate aluminum electrode 108 is very helpful.

Further, though calculation is performed on the case where the protrusion size WO is 10 μm in the simulation of FIG. 3, the present inventors verify that the same effect can be produced only if the protrusion size WO has a positive value (WO>0). (3) Further, since the gate interconnection is achieved by forming the gate aluminum electrode 108 having resistance lower than those of the first and second gate control electrodes 107a and 107b, a decrease in gate wire resistance can be expected and further an effect of improvement in efficiency at on/off switching can be expected.

The First Variation

The first variation is intended for improvement of the first preferred embodiment, and the characteristic feature thereof lies in that another contact portions are provided for the first portions P1, respectively, to expose the upper surfaces of the first gate control electrodes 107a located immediately below the gate aluminum electrode 108 on the side of cell region CR in the first preferred embodiment. Characteristic features other than that are the same as those of the structure of the first preferred embodiment. Referring to figures, detailed discussion will be presented below on a specific example of the first variation.

Figure 4A:
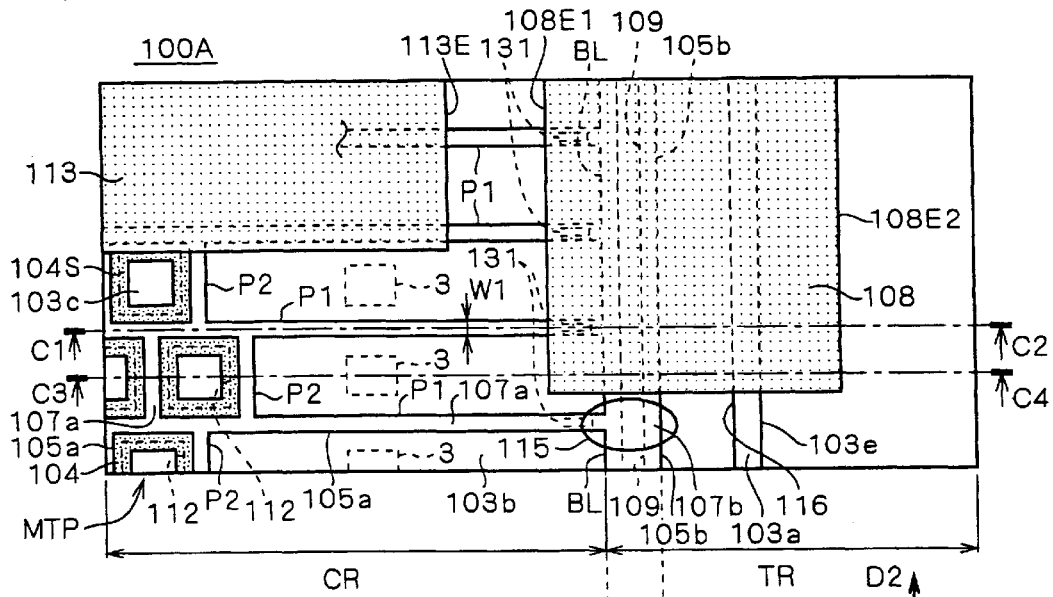
FIGS. 4A, 4B and 4C are views showing a structure of a semiconductor device in accordance with a first variation of the present invention.
Figure 4B:
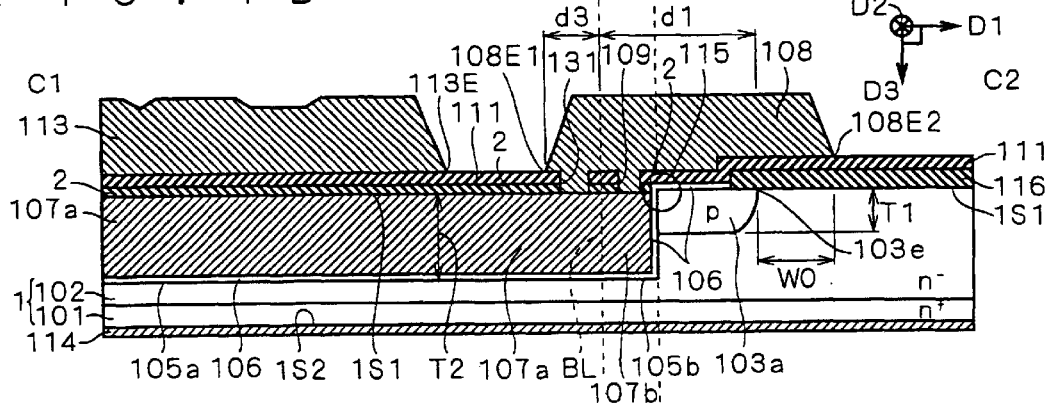
Figure 4C:
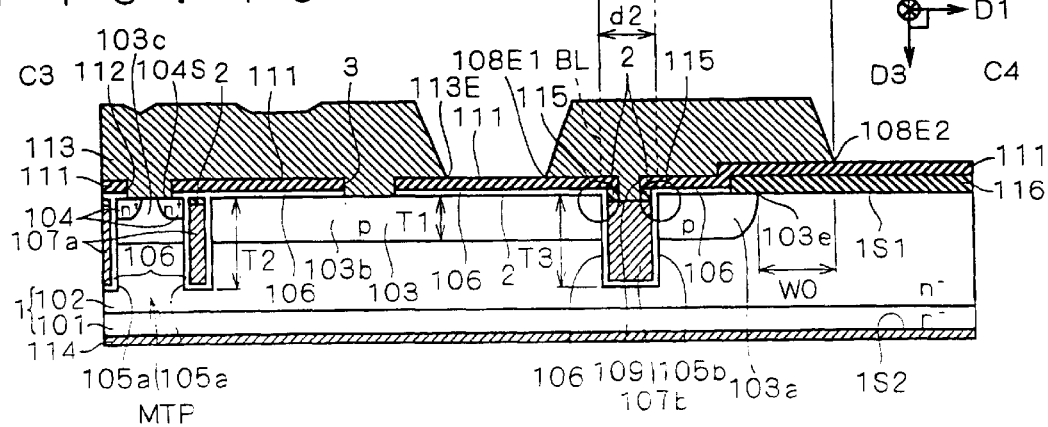

FIG. 4A is a plan view schematically showing a gate interconnection structure 100A of the first variation, FIG. 4B is a longitudinal section taken along the line C1–C2 of FIG. 4A and FIG. 4C is a longitudinal section taken along the line C3–C4 of FIG. 4A. FIGS. 4A, 4B and 4C correspond to FIGS. 1A, 1B and 1C, respectively. Reference signs in FIGS. 4A, 4B and 4C identical to those in FIGS. 1A, 1B and 1C represent the same constituent elements as those described in the first preferred embodiment.

The characteristic constituent elements in FIGS. 4A, 4B and 4C, which are not provided in the first preferred embodiment, are a plurality of fourth contact portions 131. Specifically, a plurality of fourth contact portions 131 are each so formed in a hole shape in the insulating layer (2+111) as to expose a part of an upper surface of a portion in the first gate control electrode 107a filling each of the first portions P1 which is defined or drawn by the boundary BL and a location away from the boundary BL towards the cell region CR by the third distance d3 along the first direction D1. Moreover, the fourth contact portions 131 are completely filled with the gate electrode 108. With such a structure, the gate electrode 108 also has an electric connection with the first gate control electrode 107a through each fourth contact portion 131.

Therefore, the first variation produces the same effects (1) to (3) as discussed in the first preferred embodiment and further produces an advantage (4) that it becomes possible to further reduce the gate wire resistance by increasing a contact region between the gate control electrode and the gate electrode 108 as compared with that of the first preferred embodiment and a further improvement in efficiency at on/off switching can be expected.

The Second Variation

The second variation is intended for improvement of the first preferred embodiment, and the characteristic feature thereof lies in that the second trench 105b has a second width d2 equal to the first width W1 of each first portion P1. Characteristic features other than that are the same as those of the structure of the first preferred embodiment. Referring to figures, detailed discussion will be presented below on a specific example of the second variation.

Figure 5:
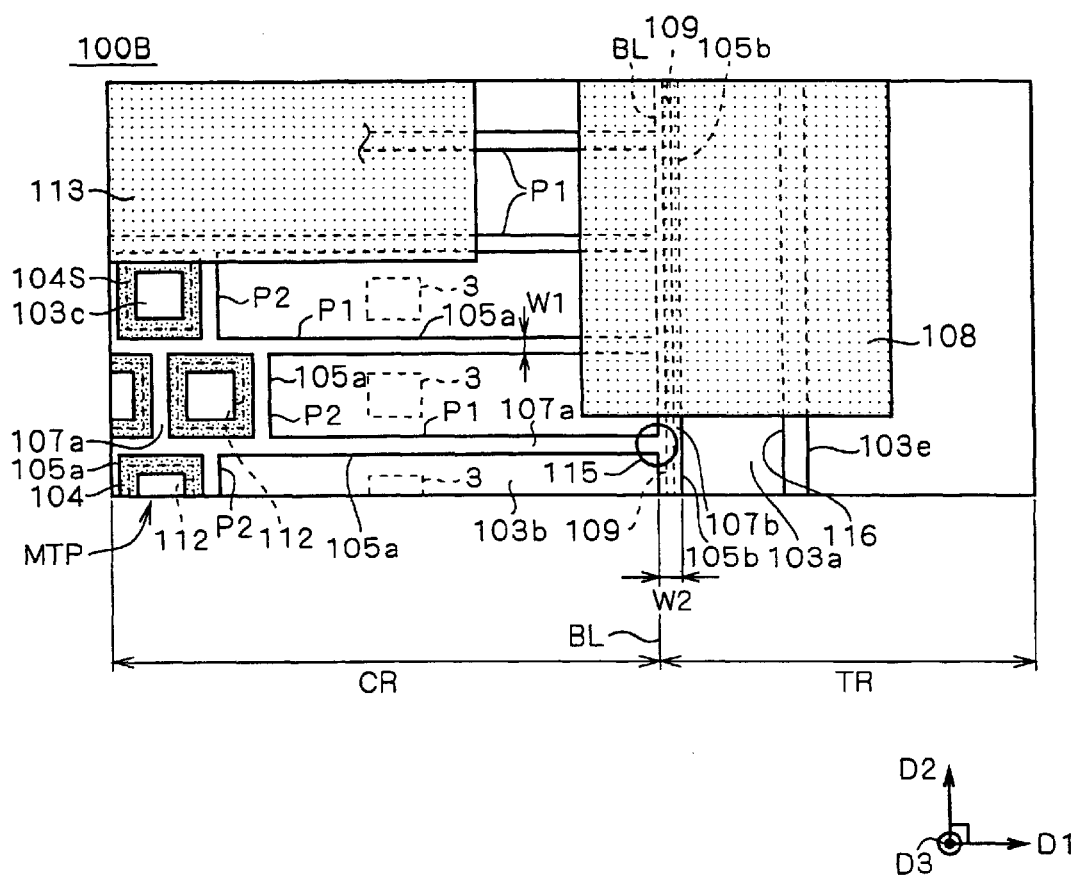
FIG. 5 is a view showing a structure of a semiconductor device in accordance with a second variation of the present invention.

FIG. 5 is a plan view schematically showing a gate interconnection structure 100B of the second variation, which corresponds to FIG. 1A. Therefore, reference signs in FIG. 5 identical to those in FIG. 1A represent the same constituent elements as those described in the first preferred embodiment.

As shown in FIG. 5, the second width W2 (which corresponds to the width d2 of FIG. 1A) of the second trench 105b is set to be equal to the first width W1 of the first trench 105a.

Therefore, the second variation produces the same effects (1) to (3) as discussed in the first preferred embodiment and further produces an advantage (4) that it is possible to eliminate ununiformity in trench depth due to the μ loading effect in etching the trenches by uniformly setting all of the trench widths and a further improvement in main breakdown voltage is consequently expected.

Further, the characteristic feature of the first variation (provision of the fourth contact portions 131) can be naturally applied to the second variation.

The Third Variation

The third variation is intended for improvement of the first preferred embodiment, and the characteristic feature thereof, in summary, lies in that a third gate control electrode is further provided in the insulating layer located on a region in the terminal region TR of the first main surface 1S1 which is located outside the end 103e of the peripheral edge side base layer 103a in the first preferred embodiment and a portion of the insulating layer which is located immediately thereabove is opened to further electrically connect the gate aluminum electrode 108 to the third gate control electrode. Characteristic features other than that are the same as those of the structure of the first preferred embodiment. Referring to figures, detailed discussion will be presented below on a specific example of the third variation with a particular emphasis on the characteristic feature thereof.

Figure 6A:
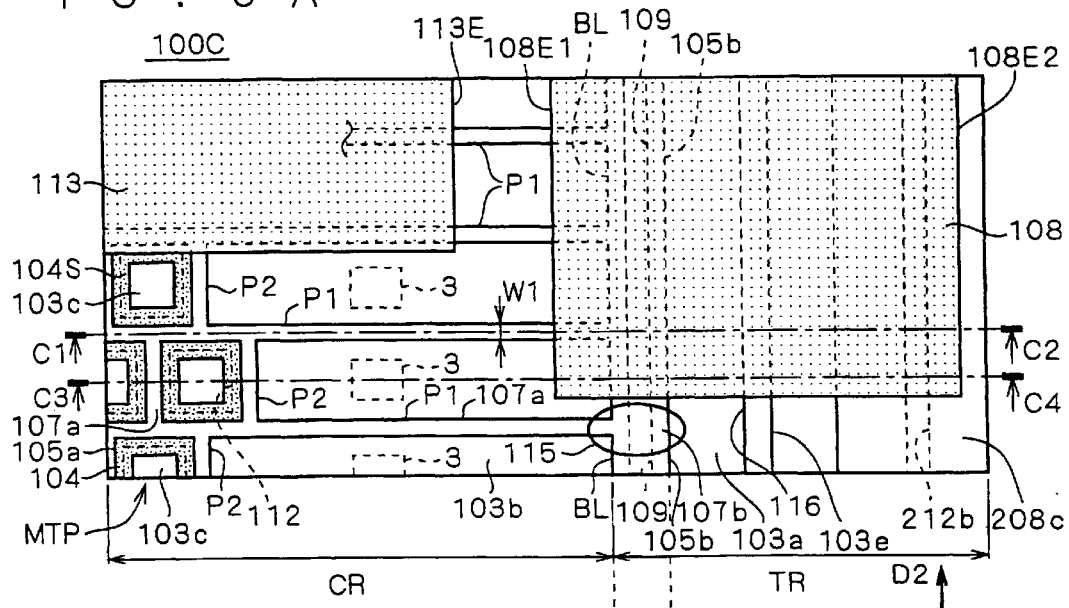
FIGS. 6A, 6B and 6C are views showing a structure of a semiconductor device in accordance with a third variation of the present invention.
Figure 6B:
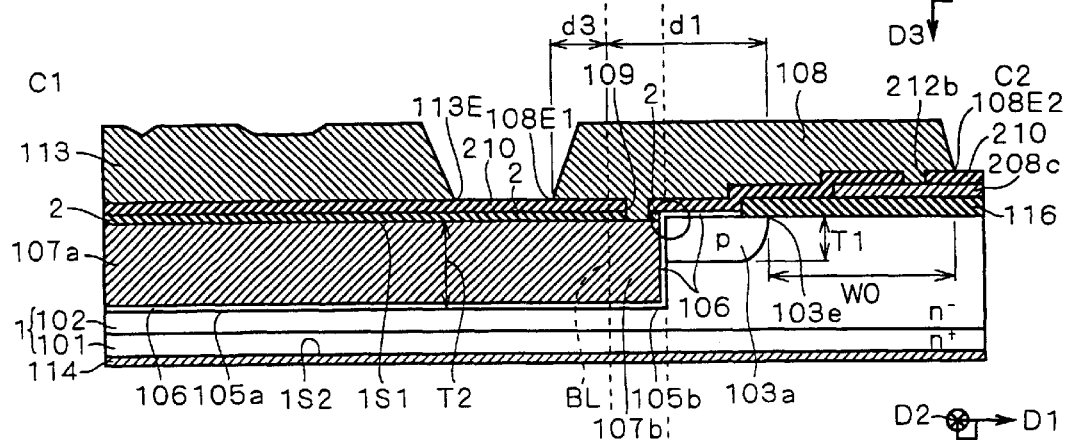
Figure 6C:
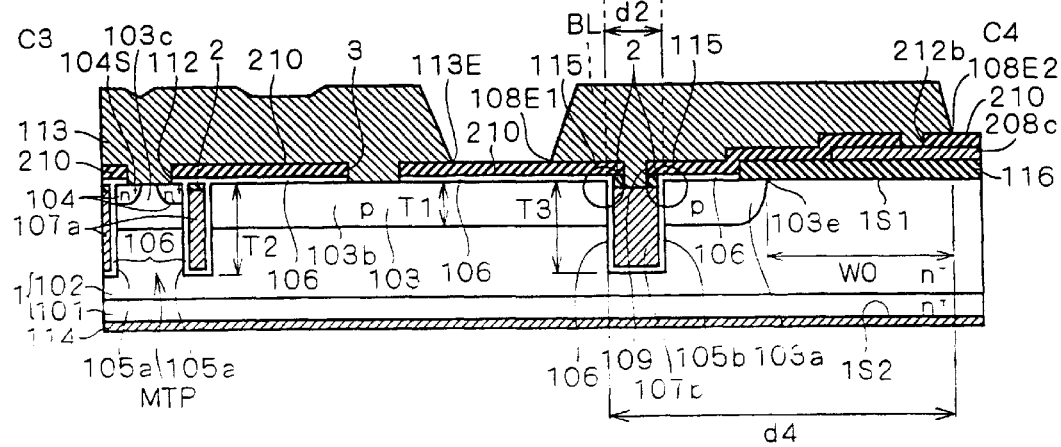

FIG. 6A is a plan view schematically showing a gate interconnection structure 100C of the third variation, FIG. 6B is a longitudinal section taken along the line C1–C2 of FIG. 6A and FIG. 6C is a longitudinal section taken along the line C3–C4 of FIG. 6A. FIGS. 6A, 6B and 6C correspond to FIGS. 1A, 1B and 1C, respectively. Reference signs in FIGS. 6A, 6B and 6C identical to those in FIGS. 1A, 1B and 1C represent the same constituent elements as those described in the first preferred embodiment.

The characteristic constituent elements in FIGS. 6A, 6B and 6C, which are not provided in the first preferred embodiment, are a third gate control electrode 208c, a protection film 210 and a fourth contact portion 212b.

Specifically, the third gate control electrode 208c is provided inside the insulating layer (116+210) formed on a region in the terminal region TR of the first main surface 1S1 which is located outside the end 103e and includes at least a portion located below the gate electrode 108. In other words, the third gate control electrode 208c is provided above an upper surface of the semiconductor layer. 102 with the insulating film 116 interposed therebetween. Further, the third gate control electrode 208c extends along the second direction D2. The third gate control electrode 208c is formed of, e.g., polysilicon. Furthermore, the other end (not shown) of the third gate control electrode 208c on the outer side in the first direction D1 is located outside the other end 108E2 (the location away from the boundary BL by the fourth distance d4) of the gate electrode 108.

Further, the fourth contact portion 212b is so formed in a stripe shape in the insulating layer 210 which is a protection film along the second direction D2 as to expose part of an upper surface of the third gate control electrode 208c located immediately below the gate electrode 108, and moreover completely filled with the gate electrode 108. Therefore, the gate electrode 108 also has an electric connection with the third gate control electrode 208c through the fourth contact portion 212b. Moreover, since the fourth contact portion 212b has a trench-like shape extending in stripe, the contact area or the contact region between the gate electrode 108 and the third gate control electrode 208c is larger than that in the case of contact hole. With such a structure, there is an electric continuity between the first and second gate control electrodes 107a and 107b and the third gate control electrode 208c. Further, if the fourth contact portion 212b is referred to as "the second gate contact portion", the third contact portion 109 is referred to as "the first gate contact portion".

With the above structure, the third variation produces the same effects (1) to (3) as discussed in the first preferred embodiment and further produces an advantage (4) that it is possible to further reduce the gate wire resistance by adding the electric connection between the gate electrode 108 and the third gate control electrode 208c and a further improvement in efficiency at on/off switching can be expected.

The Fourth Variation

The fourth variation is a modification of the third variation, and the characteristic feature thereof lies in that the fourth contact portion is constituted of a plurality of contact holes. Though this structure reduces the contact area between the gate electrode 108 and the third gate control electrode 208c as compared with that in the third variation, the following effect is produced instead. Characteristic features other than that are the same as those of the structure of the first preferred embodiment and the third variation. Referring to figures, detailed discussion will be presented below on a specific example of the fourth variation with a particular emphasis on the characteristic feature thereof.

FIG. 7 is a plan view schematically showing a gate interconnection structure 100D of the fourth variation, which corresponds to FIG. 1A. Therefore, reference signs in FIG. 7 identical to those in FIGS. 1A and FIG. 6A represent the same constituent elements as those described in the first preferred embodiment and the third variation.

As schematically shown in FIG. 7, fourth contact portions or second gate contact portions 216 are contact holes each having a cross section of rectangle whose longitudinal direction is the second direction D2 and lateral direction is the first direction D1, and a plurality of fourth contact portions 216 are aligned along the second direction D2 at predetermined intervals DH. Further, the fourth contact portions 216 are completely filled with the gate aluminum electrode 108.

With the above structure, the fourth variation produces the same effects (1) to (3) as discussed in the first preferred embodiment and further produces an advantage (4) that it is possible to alleviate the damage in the insulating oxide film 116 caused by the dry etching step in the manufacturing process by reduction in contact area between the gate aluminum electrode 108 and the respective fourth contact portions 216 as compared with that in the third variation and an improvement in yield and reliability of the gates can be consequently expected.

The Fifth Variation

The fifth variation is intended for improvement of the first preferred embodiment, and the characteristic feature thereof lies in that a third trench in a mesh shape penetrating the peripheral edge side base layer 103a is provided in a range from an outer side surface of the second trench 105b to the end 103e. Constituent elements other than that are the same as those of the structure of the first preferred embodiment. Referring to figures, detailed discussion will be presented below on a specific example of the fifth variation with a particular emphasis on the characteristic feature thereof.

Figure 8A:
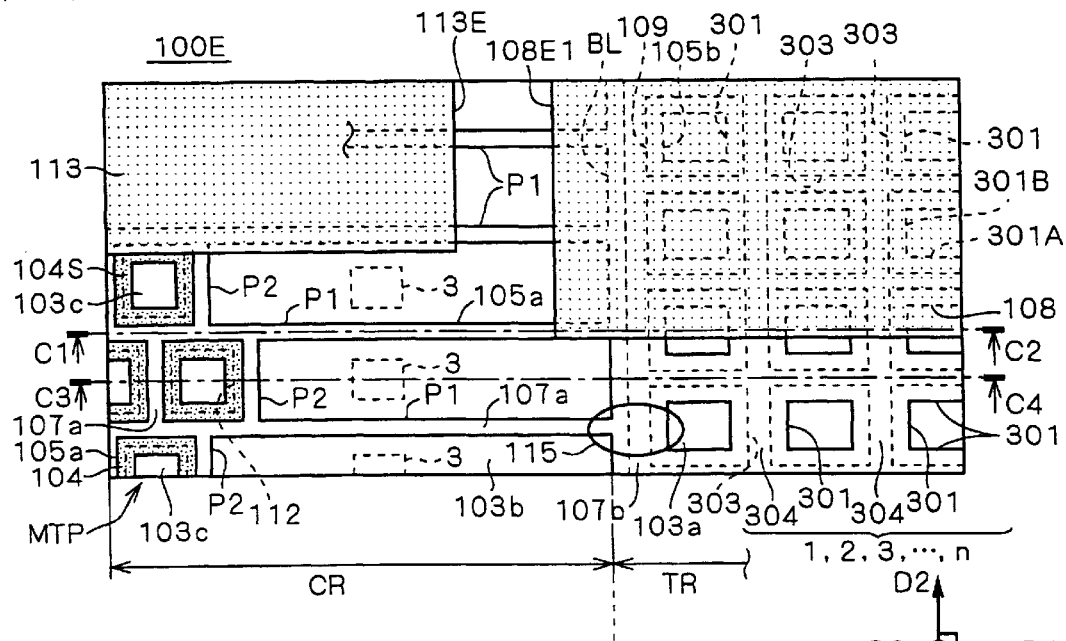
FIGS. 8A, 8B and 8C are views showing a structure of a semiconductor device in accordance with a fifth variation of the present invention.
Figure 8B:
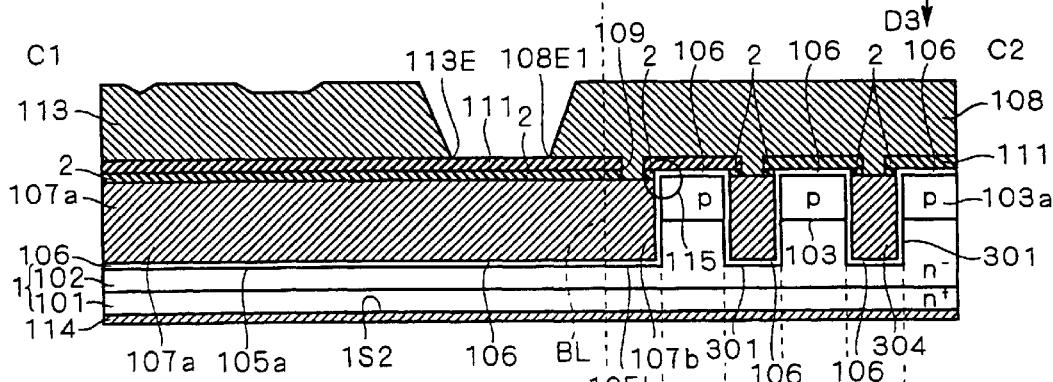
Figure 8C:
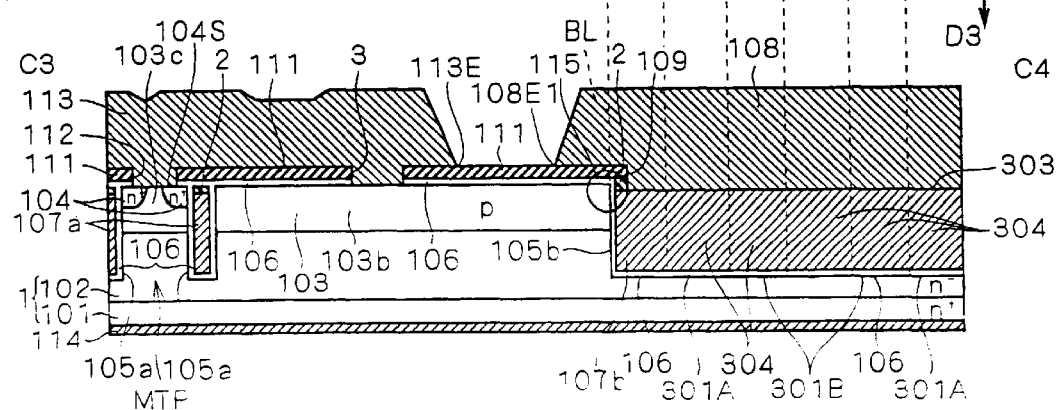

FIG. 8A is a plan view schematically showing a gate interconnection structure 100E of the fifth variation, FIG. 8B is a longitudinal section taken along the line C1–C2 of FIG. 8A and FIG. 8C is a longitudinal section taken along the line C3–C4 of FIG. 8A. FIGS. 8A, 8B and 8C correspond to FIGS. 1A, 1B and 1C, respectively. Reference signs in FIGS. 8A, 8B and 8C identical to those in FIGS. 1A, 1B and 1C represent the same constituent elements as those described in the first preferred embodiment.

As shown in FIGS. 8A, 8B and 8C, a third trench 301 in a mesh shape is formed from a region in the terminal region TR of the first main surface 1S1 which ranges from an outside portion of the side surface of the second trench 105b on the side of the channel stopper to the end 103e of the peripheral edge side base layer 103a, through the base layer 103a located beneath the terminal region TR, up to the inside of the semiconductor substrate 1 along the third direction D3. Moreover, the third trench 301 has a plurality of first portions (lateral portions) 301A extending along the first direction D1 while being connected to the side surface of the second trench 105b on the side of the channel stopper and n second portions (longitudinal portions) 301B (n is a natural number) each extending along the second direction D2 while being perpendicular to the first portions 301A.

Further, a third gate insulating film 106 formed of, e.g., an oxide film is formed entirely on bottom surfaces and side surfaces of the first portions 301A and the second portions 301B of the third trench 301. The third gate insulating film 106 is continuous with the second gate insulating film 106 formed entirely inside the second trench 105b as a unit at connecting portions between the first portions 301A and the second trench 105b.

Furthermore, a third gate control electrode 304 having a mesh plan view is so formed inside the third trench 301 as to be located beneath an upper surface of the third trench 301, and moreover the gate control electrode 304 fills the third trench 301 with the third gate insulating film 106 interposed therebetween. The third gate control electrode 304 is electrically connected to the second gate control electrode 107b at the connecting portions between the second trench 105b and the first portions 301A of the third trench 301. The third gate control electrode 304 is formed of the same material as the second gate control electrode 107b is formed of.

Further, a fourth contact portion or second gate contact portion 303 is so formed in the insulating layer (2+111) as to expose part of an upper surface of the third gate control electrode 304 while extending along the first direction D1 and the second direction D2 to make a mesh shape. Moreover, the fourth contact portion 303 is completely filled with the gate aluminum electrode 108, and the respective lateral portions of the fourth contact portion 303 each extending along the first direction D1 are connected to the third contact portion or the first gate contact portion 109 in a stripe shape extending in parallel with the second trench 105b along the second direction D2. Therefore, the gate aluminum electrode 108 also has an electric connection with the third gate control electrode 304 through the fourth contact portion 303 extending in a mesh shape.

With the above structure, the fifth variation produces the same effects (1) to (3) as discussed in the first preferred embodiment and further produces an advantage (4) that it is possible to increase the contact area between the gate aluminum electrode 108 and the third gate control electrode 304 by increasing the number of first portions 301A and second portions 301B of the third trench 301 and therefore a further reduction in gate wire resistance is achieved.

The Sixth Variation

The sixth variation is a modification of the fifth variation, and the characteristic feature thereof lies in that the third contact portion and the fourth contact portion are each constituted of a plurality of contact holes located at crossing portions of the trenches. Constituent elements other than that are the same as those of the structure of the first preferred embodiment and the fifth variation. Referring to figures, detailed discussion will be presented below on a specific example of the sixth variation with a particular emphasis on the characteristic feature thereof.

Figure 9A:
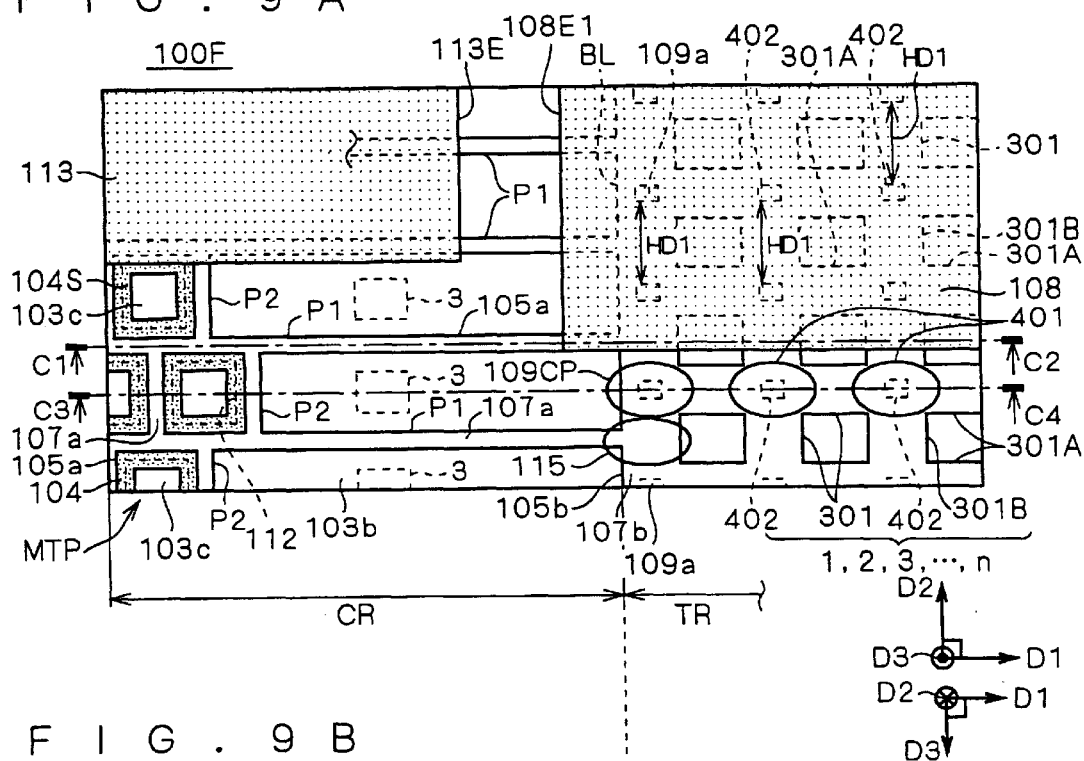
FIGS. 9A, 9B and 9C are views showing a structure of a semiconductor device in accordance with a sixth variation of the present invention.
Figure 9B:
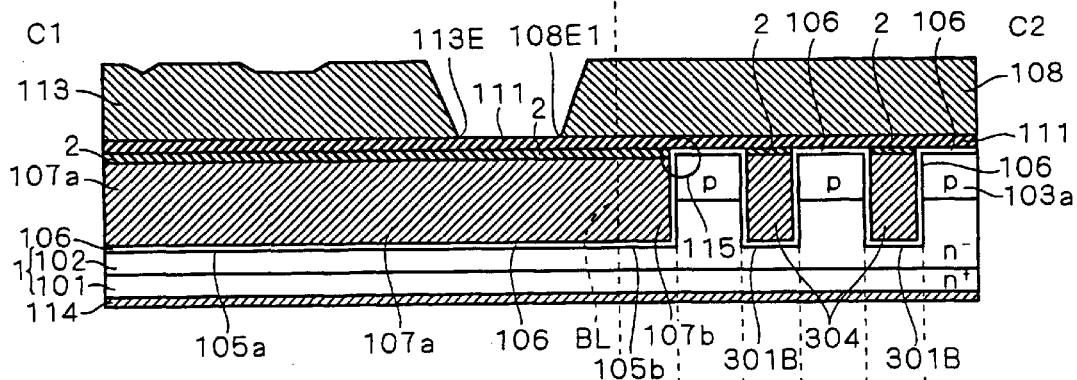
Figure 9C:
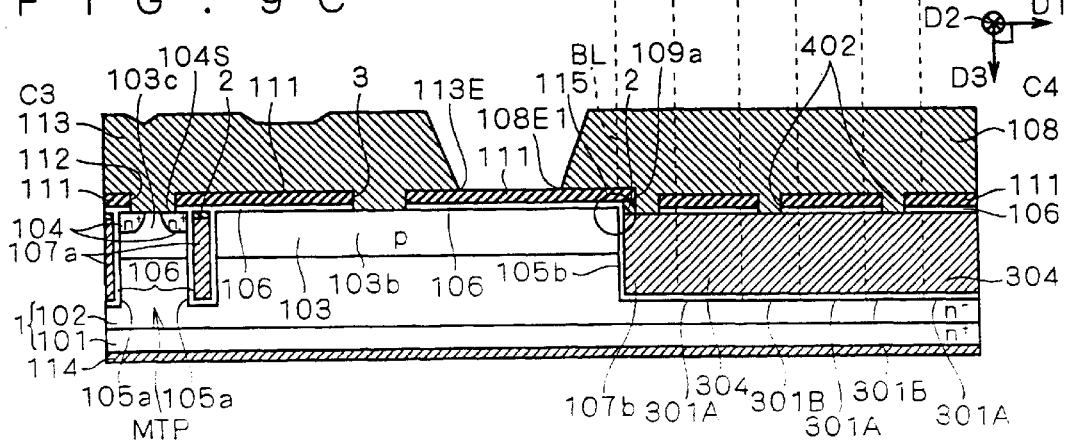

FIG. 9A is a plan view schematically showing a gate interconnection structure 100F of the sixth variation, FIG. 9B is a longitudinal section taken along the line C1–C2 of FIG. 9A and FIG. 9C is a longitudinal section taken along the line C3–C4 of FIG. 9A. FIGS. 9A, 9B and 9C correspond to FIGS. 8A, 8B and 8C, respectively. Reference signs in FIGS. 9A, 9B and 9C identical to those in FIGS. 8A, 8B and 8C represent the same constituent elements as those described in the first preferred embodiment and the fifth variation.

As shown in FIGS. 9A, 9B and 9C, a third contact portion 109a is constituted of a plurality of contact holes each formed near a connecting portion or crossing portion 109CP between the second trench 105b and each lateral portion 301A of the third trench 301. Moreover, a plurality of contact holes 109a are aligned along the second direction D2 at predetermined intervals HD1.

Further, a fourth contact portion 402 is so formed in the insulating layer (106+111) as to expose part of an upper surface of the third gate control electrode 304, and moreover the inside of the fourth contact portion 402 is completely filled with the gate electrode 108. Therefore the gate electrode 108 also has an electric connection with the third gate control electrode 304 through the fourth contact portion 402.

The fourth contact portion 402 is constituted of a plurality of contact holes formed at crossing portions 401 between the lateral portions 301A of the third trench 301 extending along the first direction D1 and the longitudinal portions 301B of the third trench 301 extending along the second direction D2, respectively. Similarly, a plurality of contact holes 402 are aligned along the second direction D2 at predetermined intervals HD1.

With the above structure, the sixth variation produces the same effects (1) to (3) as discussed in the first preferred embodiment and further produces an advantage (4) that it is possible to improve an overlap margin of manufacture in forming the contacts since the crossing portions 401 are less susceptible to an effect of lateral or vertical misregistration of the contact holes than the lateral portions 301A and consequently an improvement in yield and reliability of the gates is achieved.

The Second Preferred Embodiment

The second preferred embodiment follows the basic concept of the first preferred embodiment to provide the second trench extending along the second direction and being connected to the first portions of the first trench and the gate aluminum electrode being electrically connected to the second gate control electrode filling the inside of the second trench through the gate contact portion formed in stripe immediately above the second trench, and modifies the structure of the first preferred embodiment. A main point of its characteristic feature lies in that another source electrode being electrically connected to the source electrode in the cell region CR is provided above the terminal region TR outside the gate aluminum electrode and the additionally-provided source electrode is electrically connected to the peripheral edge side base layer through a contact portion immediately therebelow, and moreover the additionally-provided source electrode has a function as a field plate with the other end on the side of channel stopper protruding towards the channel stopper beyond the end of the peripheral edge side base layer. Referring to figures, a characteristic structure of the second preferred embodiment will be discussed below in detail.

FIG. 10 is a plan view schematically and enlargedly showing a gate interconnection structure 150 which is part of an n-channel UMOSFET in accordance with the second preferred embodiment of the present invention. FIGS. 11B and 11C are longitudinal sections taken along the lines C1–C2 and C3–C4 of FIG. 10, respectively. In FIG. 10, like in FIG. 1A, for convenience of illustration, a first electrode layer for second main electrode 113, a second electrode layer for second main electrode 118 and a gate electrode 108 discussed later are shown being each divided.

Reference signs in FIGS. 10, 11B and 11C identical to those in FIGS. 1A, 1B and 1C represent the same constituent elements as those described in the first preferred embodiment. For this reason, the description in the first preferred embodiment is used for description on these constituent elements. Therefore, the constituent elements of the second preferred embodiment will be discussed below, with a particular emphasis on the characteristic feature different from that of the first preferred embodiment.

As shown in FIGS. 10, 11B and 11C, the first electrode layer for second main electrode or the first source aluminum electrode 113 is formed in the respective first contact portions 112 and the respective second contact portions 3 and on a portion in the insulating layer (2+111), (106+111) which is located on the cell region CR of the first main surface 1S1.

Moreover, the first electrode layer for second main electrode 113 has one end portion 113E away from the boundary BL towards the cell region CR by a seventh distance d7 along the first direction D1, and extends along the second direction D2, being electrically connected to the second main electrode regions 104 and the base layers 103c and 103b.

Further, the gate electrode 108 is formed inside the third contact portion 109, on a portion in the insulating layer (2+111), (106+111) which is defined by the boundary BL and a location away from the boundary BL towards the cell region CR by a third distance d3 shorter than the seventh distance d7 (d3<d7) along the first direction D1 and on a portion in the insulating layer which is defined by the boundary BL and a location away from the boundary BL towards the terminal region TR by a fourth distance d4 shorter than the first distance d1 (d2<d4<d1) along the first direction D1. Moreover, the gate electrode 108 extends in parallel with the second trench 105b along the second direction D2 and is electrically connected to the second gate control electrode 107b through the third contact portion 109 in stripe extending along the second direction D2. Thus, the second preferred embodiment is different from the first preferred embodiment in that the protrusion size d4 of the gate electrode 108 towards the channel stopper is smaller than the protrusion size d1 of the base layer 103 from the boundary BL towards the channel stopper.

Furthermore, a fourth contact portion 117 is so formed in the insulating layer (106+111) as to expose part of an upper surface of a portion in the peripheral edge side base layer 103a which is sandwiched between a location away from the boundary BL towards the terminal region TR by a fifth distance d5 shorter than the first distance d1 and longer than the fourth distance d4 (d4<d5<d1) along the first direction D1 and the other end 103e of the base layer 103 away from the boundary BL by the first distance d1. Moreover, the fourth contact portion 117 extends in parallel with the second trench 105b and the third contact portions 119 in stripe along the second direction D2 to make a stripe shape. Herein, if the first contact portion 112 and the second contact portion 3 are referred to as the "first and second source contact portions", the fourth contact portion 117 is also referred to as a "third source contact portion".

Further, the second electrode layer for second main electrode or the second source aluminum electrode 118 which is a core portion of the second preferred embodiment is formed in the fourth contact portion 117 and on a portion in the insulating layer (106+111), (116+111) which is defined by the location away from the boundary BL towards the terminal region TR by the fifth distance d5 along the first direction D1 and a location away from the boundary BL towards the terminal region TR by a sixth distance d6 longer than the first distance d1 (d6>d1) along the first direction D1. Moreover, the second electrode layer for second main electrode 118 extends in parallel with the first electrode layer for second main electrode 113 along the second direction D2 and is electrically connected to the peripheral edge side base layer 103a through the fourth contact portion 117.

Furthermore, in the second preferred embodiment, since both the lengths of the first electrode layer for second main electrode 113 and the second electrode layer for second main electrode 118 along the second direction D2 are longer than the length of the gate electrode 108 along the second direction D2 and one end portion of the third contact portion 109 along the second direction D2 is located on this side of the one end portion 108E of the gate electrode 108 along the second direction D2, the length of the fourth contact portion 117 along the second direction D2 is longer than the length of the third contact portion 109 along the second direction D2.

In the second preferred embodiment, a connection layer 119 is formed extending from the cell region CR and the terminal region TR across the boundary BL along the second direction D2, on a portion in the insulating layer (106+111), (2+111) which is defined by one end portion 113E of the first electrode layer for second main electrode 113 and one end portion 118E of the second electrode layer for second main electrode 118 away from the boundary BL towards the terminal region TR by the fifth distance d5 along the first direction D1. Moreover, the connection layer 119 has a side surface 119S which is located away from the one end portion 108E of the gate electrode 108 along the second direction D2 by a predetermined distance DD and extends along the first direction D1. With such a structure, the connection layer 119 couples these electrode layers 113 and 118, to thereby electrically connecting these electrode layers 113 and 118 to each other. As a result, a voltage equivalent to that applied to the first electrode layer for second main electrode 113 is applied to the peripheral edge side base layer 103a.

Further, in the second preferred embodiment, it is not always necessary to divide the second trench 105b by the base layer 103.

As is clear from the above discussion, the second preferred embodiment produces basically the same effects (1) to (3) as discussed in the first preferred embodiment. Specifically, (1) in the gate interconnection structure 150, since the second gate control electrode 107b is electrically connected to the gate aluminum electrode 108 through the gate contact portion 109 immediately above the second gate control electrode 107b, the trench end corner portion 115 is not covered with the gate control electrodes. Therefore, no gate control electrode is present at the portion where the gate oxide film 106 becomes thinner due to the curvature, and it is possible to prevent the electric field stress caused by application of the gate voltage from concentrating on the gate oxide film 106. Additionally, (2) since the other end of the second source aluminum electrode 118 protrudes towards the channel stopper beyond the end 103e of the peripheral edge side base layer 103a (by the distance WO in FIGS. 11B and 11C), the drain-source main breakdown voltage is improved by the field plate effect and it is thereby possible to prevent the decrease in breakdown voltage due to ununiformity of trench depths. Further, (3) since the gate aluminum electrode 108 having resistance lower than those of the first and second gate control electrodes 107a and 107b is formed, it is possible to achieve a decrease in gate wire resistance and further an effect of improvement in efficiency at on/off switching can be produced.

The Third Preferred Embodiment

The third preferred embodiment is intended for improvement of the first preferred embodiment, following the basic concept of the first preferred embodiment, and the characteristic feature thereof lies in that a well layer of the second conductivity type (which herein corresponds to p type) is formed, instead of the peripheral edge side base layer 103a of the first preferred embodiment, which is formed deeper than the base layer 103 to cover a peripheral portion of an end of the base layer 103 and includes the second trench 105b therein. Referring to figures, detailed discussion will be presented on a structure of gate interconnection in the semiconductor device of the third preferred embodiment.

Figure 12A:
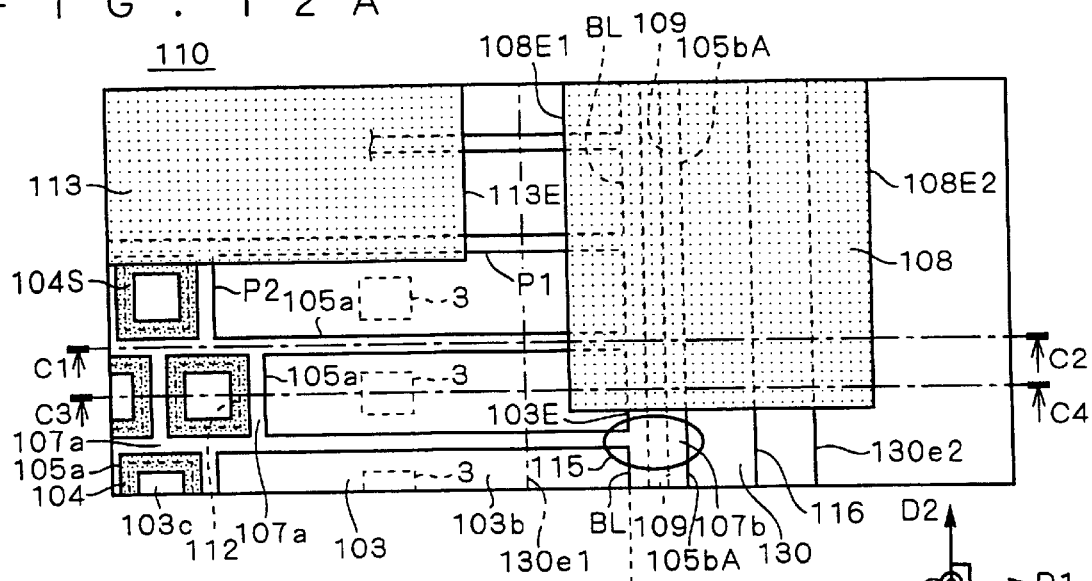
FIGS. 12A, 12B and 12C are views showing a structure of a semiconductor device in accordance with a third preferred embodiment of the present invention.
Figure 12B:
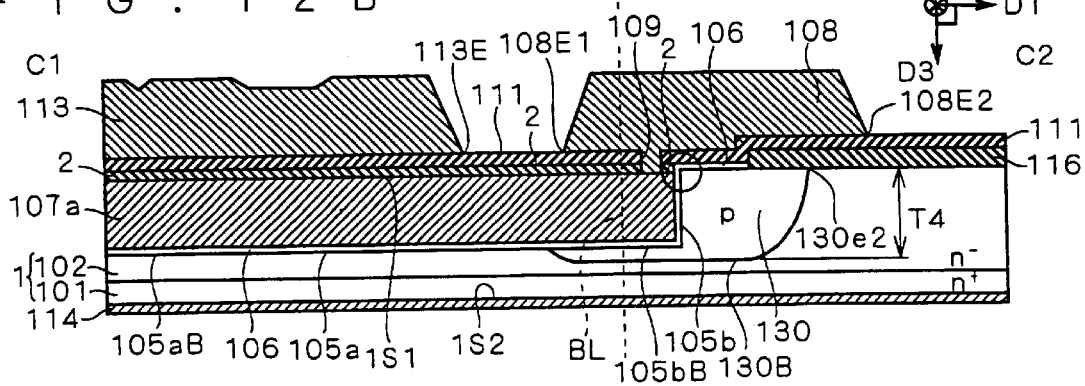
Figure 12C:
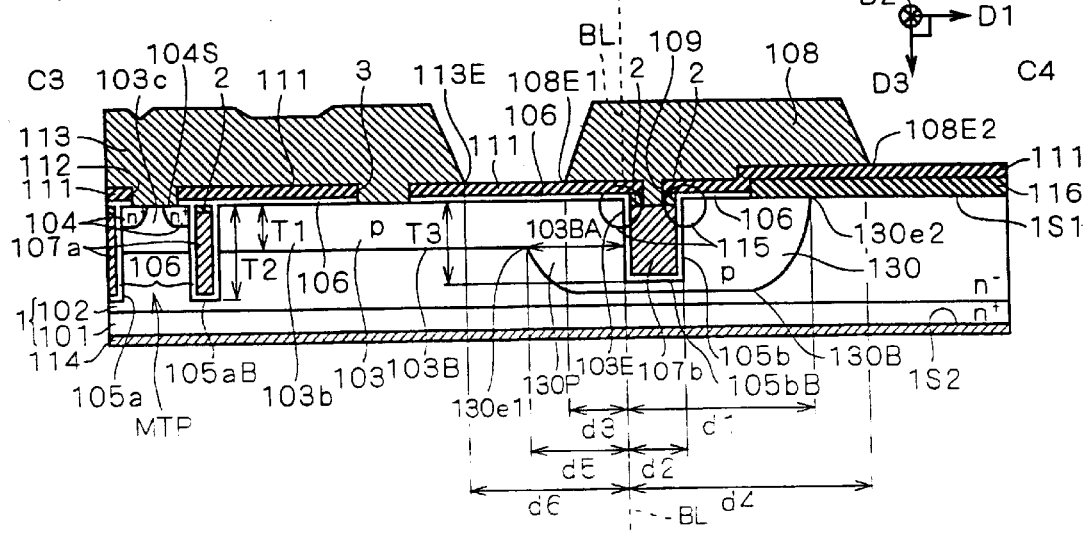

FIG. 12A is a plan view schematically and enlargedly showing a gate interconnection structure 110 which is part of an n-channel UMOSFET in accordance with the third preferred embodiment of the present invention. FIGS. 12B and 12C are longitudinal sections taken along the lines C1–C2 and C3–C4 of FIG. 12A, respectively. In FIG. 12A, like in FIG. 1A, for convenience of illustration, the second main electrode 113 and the gate electrode 108 are shown being each divided. Further, reference signs in FIGS. 12A, 12B and 12C identical to those in FIGS. 1A, 1B and 1C represent the same constituent elements as those described in the first preferred embodiment. For this reason, the description in the first preferred embodiment is used for description on these constituent elements. Therefore, the constituent elements of the third preferred embodiment will be discussed below, with a particular emphasis on the characteristic feature different from that of the first preferred embodiment.

As shown in FIGS. 12A, 12B and 12C, the base layer 103 of the second conductivity type (herein, p type) is formed from the cell region CR of the first main surface 1S1 towards a first bottom surface 103B located inside the semiconductor substrate 1 (in particular, the semiconductor layer 102) along the third direction D3, and has one end portion 103E located on the boundary BL and a first depth T1 from the first main surface 1S1 to the first bottom surface 103B.

Further, a well layer 130 of the second conductivity type (herein, p type) which is a core portion of the third preferred embodiment is formed, being connecting to the one end portion 103E of the base layer 103 in the boundary BL, from a region in the terminal region TR of the first main surface 1S1 which is defined by one end which is the boundary BL and the other end or an end away from the boundary BL towards the terminal region TR by the first distance d1 along the first direction D1 towards a fourth bottom surface 130B located inside the semiconductor layer 102 along the third direction D3. Moreover, the p-type well layer 130 has a fourth depth T4 from the first main surface 1S1 to the fourth bottom surface 130B. Additionally, the well layer 130 further has a base-layer covering portion 130P formed from a portion 103BA inside the first bottom surface 130B of the base layer 103 which is sandwiched between the boundary BL and a location or one end (starting point) 130e1 away from the boundary BL by the fifth distance d5 along the first direction D1 towards the fourth bottom surface 130B of the well layer 130 up to the inside of the semiconductor layer 102, having a corner portion with a predetermined curvature. In other words, the well layer 130 is electrically connected to the base layer 103 by completely covering the bottom surface portion 103BA of the base layer 103 with the base-layer covering portion 130P. That is, a potential applied to the well layer 130 is equivalent to that applied to the source aluminum electrode 113.

The fifth distance d5 is shorter than a sixth distance d6 between the boundary BL and the one end portion 113E of the second main electrode 113 on the side of the boundary BL in the first direction D1. Moreover, among the first depth T1, a second depth T2 from the first main surface 1S1 to a second bottom surface 105aB and a fourth depth T4, the relation T1<T2<T4 holds.

Further, in the third preferred embodiment, the second trench 105b is formed from a region in the first main surface 1S1 which is defined by one end which is the boundary BL and the other end away from the boundary BL towards the terminal region TR by a second distance d2 shorter than the first distance d1 along the first direction D1 up to a third bottom surface 105bB located inside the well layer 130 along the third direction D3, and moreover the second trench 105b has a third depth T3 from the first main surface 1S1 to the third bottom surface 105bB. The essential point herein is that the relation T1<T3<T4 holds between the third depth T3 and the fourth depth T4. In other words, the third bottom surface 105bB of the second trench 105b does not penetrate the well layer 130 and the third bottom surface 105bB of the second trench 105b and a portion thereabove are completely included in and completely surrounded by the well layer 130 which has the same potential as the base layer 103.

Furthermore, in the third preferred embodiment, the insulating layer (106+111), (116+111) is formed on an upper surface of the well layer 130 and on a region in the terminal region TR of the first main surface 1S1 which is located outside an end 130e2 of the well layer 130.

Like in the first preferred embodiment, the relation (the fourth distance d4)>(the first distance d1) also holds.

Further, the technical characteristic feature of the third preferred embodiment (provision of the p-type well layer 130) may be naturally applied to the first variation discussed earlier.

The third preferred embodiment produces the same effects (1) to (3) as discussed in the first preferred embodiment and further produces an advantage (4) that it is possible to relieve the electric field occurring at a tip portion of the second trench 105b on application of a drain-source breakdown voltage since the whole of the second trench 105b is completely covered with the p-type well layer 130 having a potential equivalent to that of the base layer 103 and the source aluminum electrode 113 and consequently the breakdown voltage can be stabilized.

The Seventh Variation

Figure 13A:
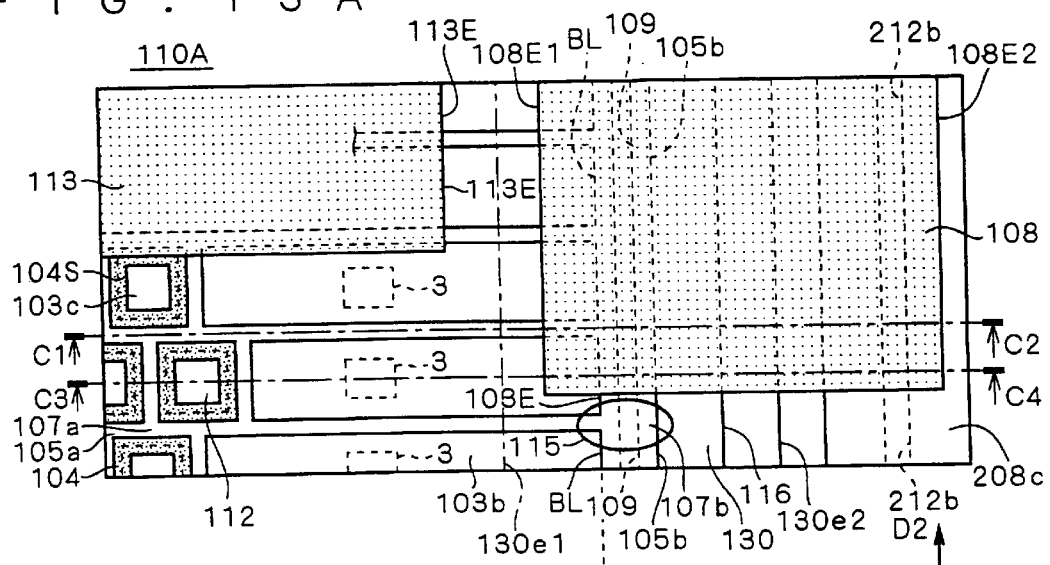
FIGS. 13A, 13B and 13C are views showing a structure of a semiconductor device in accordance with a seventh variation of the present invention.
Figure 13B:
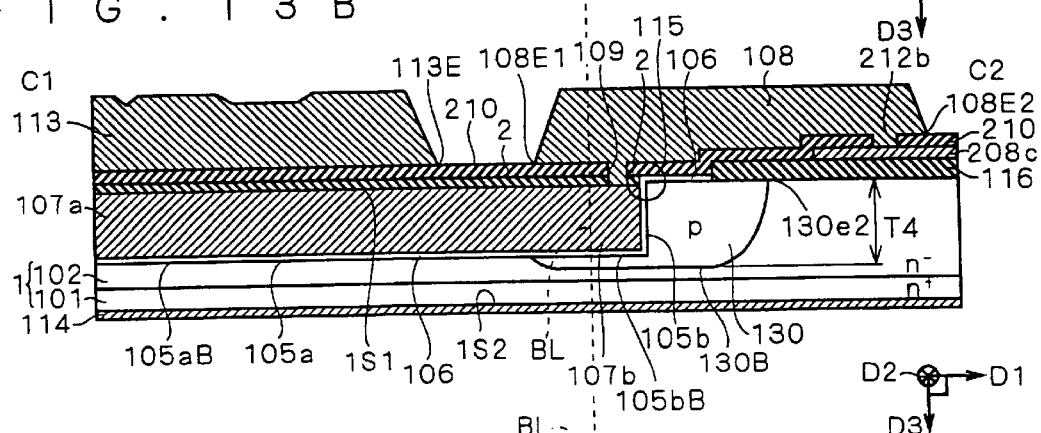
Figure 13C:
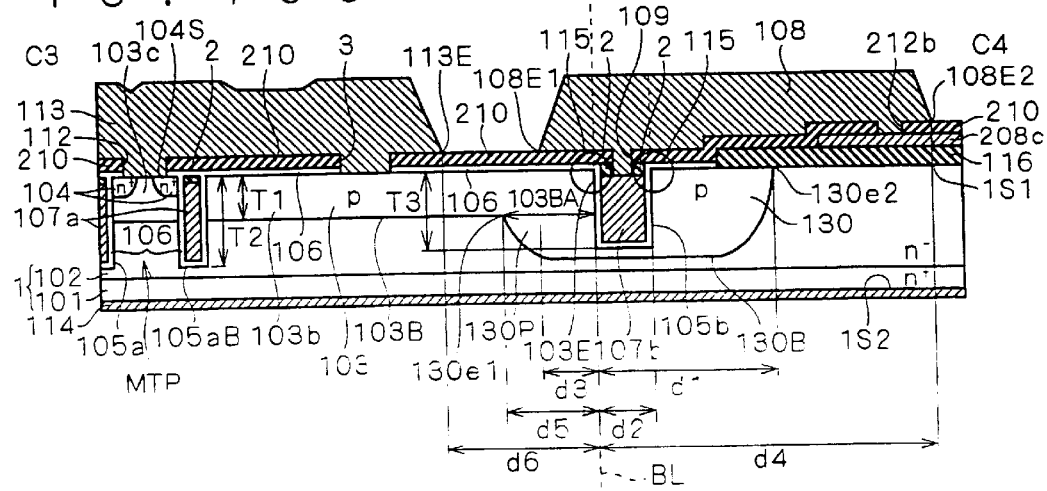

The seventh variation applies the technical characteristic feature of the third preferred embodiment (provision of the p-type well layer 130) to the third variation discussed earlier (see FIGS. 6A, 6B and 6C). FIG. 13A is a plan view showing a gate interconnection structure 110A which is a specific example thereof, FIG. 13B is a longitudinal section taken along the line C1–C2 of FIG. 13A and FIG. 13C is a longitudinal section taken along the line C3–C4 of FIG. 13A. Herein used are the reference signs in the first preferred embodiment, the third variation thereof and the third preferred embodiment.

The seventh variation (i) produces the same effects (1) to (4) as discussed in the third variation and (ii) further produces the same effect (4) as discussed in the third preferred embodiment.

Further, it is naturally possible to apply the technical characteristic feature of the third preferred embodiment to the fourth variation (see FIG. 7) discussed earlier.

The Eighth Variation

The eighth variation applies the technical characteristic feature of the third preferred embodiment (provision of the p-type well layer 130) to the second preferred embodiment discussed earlier (see FIGS. 10, 11B and 11C). FIG. 14B is a longitudinal section showing a gate interconnection structure 110B which is a specific example thereof, taken along the line C1–C2 of FIG. 10 and FIG. 14C is a longitudinal section taken along the line C3–C4 of FIG. 10. Herein, the plan view of the gate interconnection structure 110B is omitted, using FIG. 10 of the second preferred embodiment, and the reference signs in the first to third preferred embodiments are used to represent the constituent elements of the eighth variation.

The eighth variation (i) produces the same effects (1) to (3) as discussed in the second preferred embodiment and (ii) further produces the same effect (4) as discussed in the third preferred embodiment.

The Fourth Preferred Embodiment

The fourth preferred embodiment is intended for improvement of the first preferred embodiment, and the characteristic feature thereof lies in that the peripheral edge side base layer 103a of the base layer 103 of the first preferred embodiment (see FIG. 1B) is not provided. As a result, in the fourth preferred embodiment, the second trench is opened in the semiconductor substrate 1 not through the base layer, and moreover no semiconductor layer of the second conductivity type is formed in the semiconductor substrate 1 of the first conductivity type located in a region outside the second trench. Referring to figures, detailed discussion will be presented below on the fourth preferred embodiment with a particular emphasis on the characteristic feature thereof.

Figure 15A:
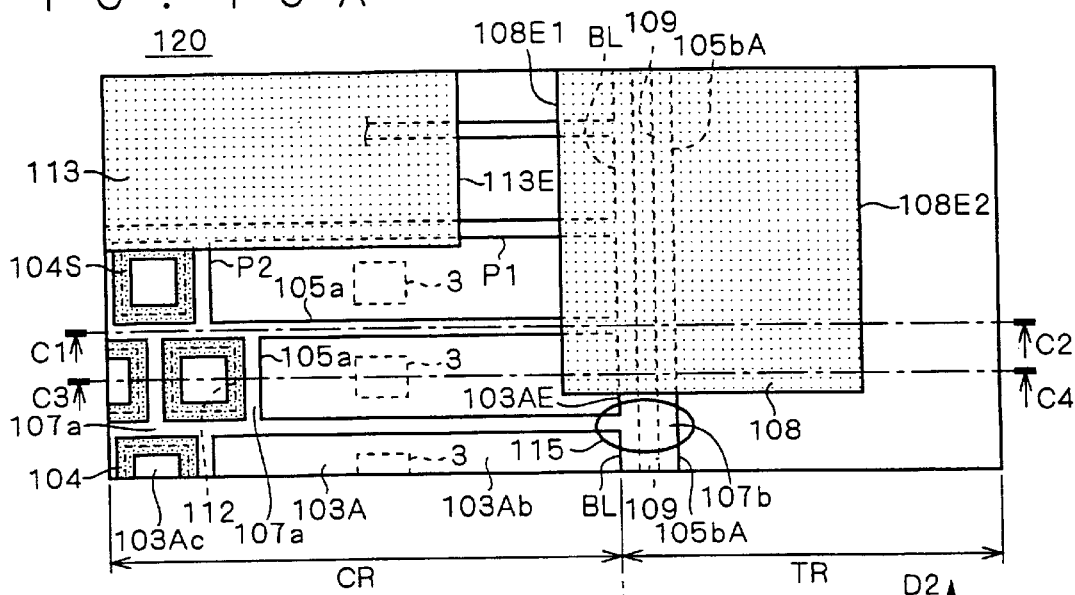
FIGS. 15A, 15B and 15C are views showing a structure of a semiconductor device in accordance with a fourth preferred embodiment of the present invention.
Figure 15B:
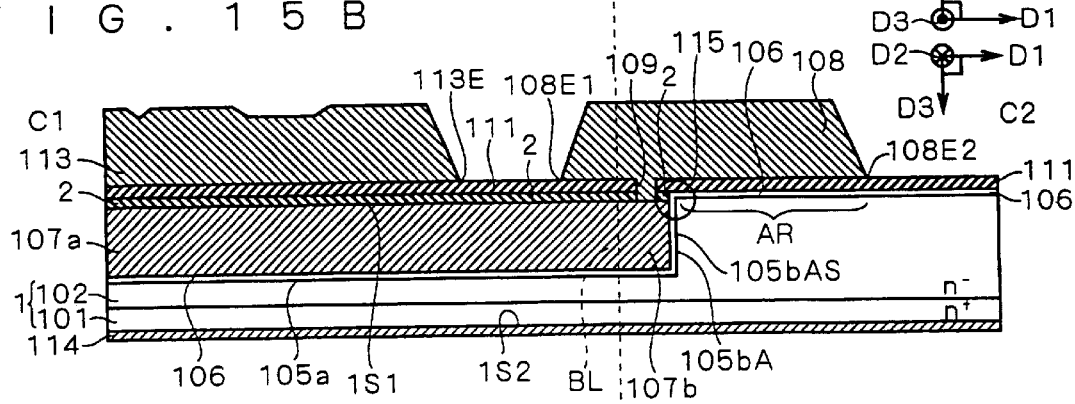
Figure 15C:
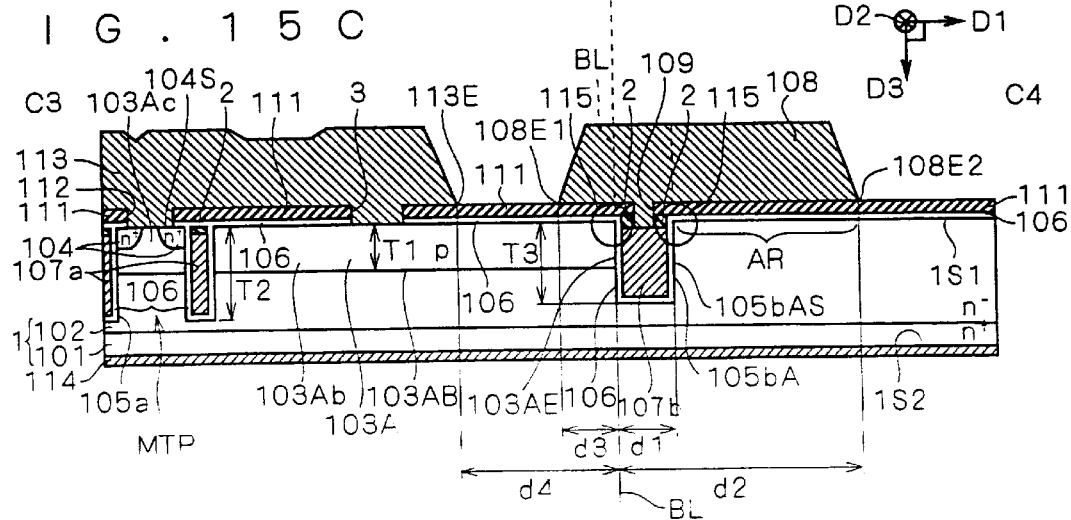

FIG. 15A is a plan view schematically showing a gate interconnection structure 120 of a semiconductor device of the fourth preferred embodiment, FIG. 15B is a longitudinal section taken along the line C1–C2 of FIG. 15A and FIG. 15C is a longitudinal section taken along the line C3–C4 of FIG. 15A. FIGS. 15A, 15B and 15C correspond to FIGS. 1A, 1B and 1C, respectively. Reference signs in FIGS. 15A, 15B and 15C identical to those in FIGS. 1A, 1B and 1C represent the same constituent elements as those described in the first preferred embodiment. Then, description on the constituent elements represented by the same reference signs is omitted, using the description of the first preferred embodiment, and the constituent elements different from those of the first preferred embodiment will be described below.

As shown in FIGS. 15A, 15B and 15C, a base layer 103A of the second conductivity type (herein, p type) is formed from the cell region CR of the first main surface 1S1 towards a first bottom surface 103AB located inside the semiconductor substrate 1 along the third direction D3, and the layer 103A has one end portion 103AE located on the boundary BL and a first depth T1 from the first main surface 1S1 to the first bottom surface 103AB (T1<T2).

Further, a second trench 105bA is formed from a region in the first main surface 1S1 which is defined by one end which is the boundary BL and the other end away from the boundary BL towards to the terminal region TR by the first distance d1 along the first direction D1 up to the third bottom surface located inside the semiconductor substrate 1 (in particular, the semiconductor layer 102) along the third direction D3. The second trench 105b A has a third depth T3 from the first main surface 1S1 to the third bottom surface (T3>T1) and a stripe shape extending along the second direction D2, being connected to one end portions of the first portions P1.

Furthermore, the gate electrode 108 is formed inside the third contact portion 109 and on a portion in the insulating layer (106+111), (2+111) which is defined by the boundary BL and a location away from the boundary BL towards the cell region CR by a third distance d3 shorter than the fourth distance d4 along the first direction D1 and on a portion in the insulating layer which is defined by the boundary BL and a location away from the boundary BL towards the terminal region TR by a second distance d2 longer than the first distance d1 along the first direction D1.

As a result, no semiconductor layer of the second conductivity type is formed in a portion AR of the semiconductor substrate 1 which is defined by a side surface 105b AS of the second trench 105b A on the side of the terminal region and the location away from the boundary BL towards the terminal region TR by the second distance d2 along the first direction D1 and located immediately below the gate electrode 108.

Figure 16:
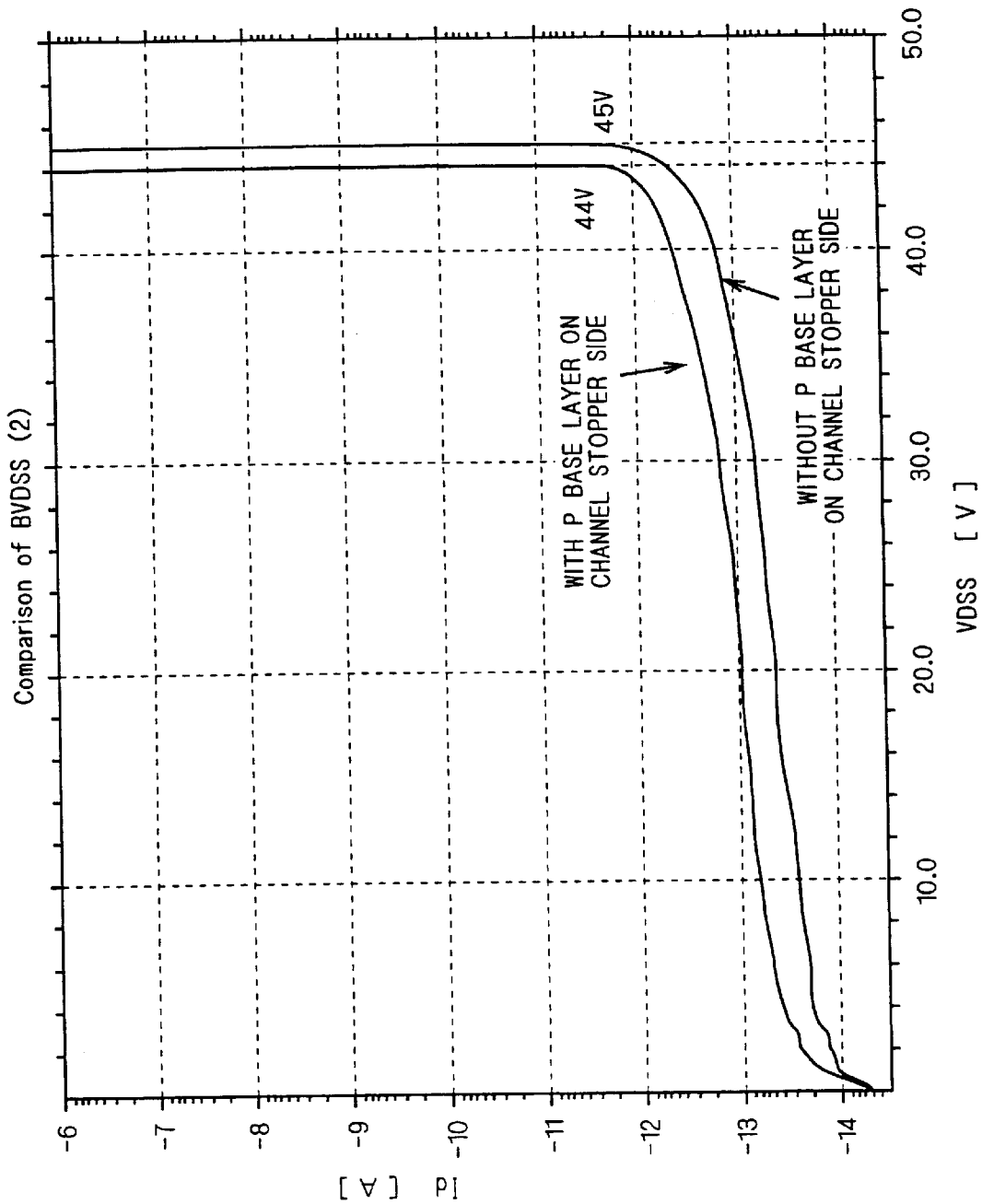
FIG. 16 is a graph showing a simulation result for demonstrating an effect of the fourth preferred embodiment.

With the above structure, the fourth preferred embodiment produces the same effects (1) to (3) as discussed in the first preferred embodiment and further produces a characteristic effect (4). Specifically, in the fourth preferred embodiment, since the corner portion near the end of the peripheral edge side base layer 103a in the first preferred embodiment does not exist, there arises no deterioration in main breakdown voltage due to the curvature of the corner portion of the peripheral edge side base layer 103a. Therefore, the fourth preferred embodiment makes it possible to further improve the main breakdown voltage. This effect is manifested in FIG. 16 showing a calculation result obtained by a device simulator Medici.

The Ninth Variation

Figure 17A:
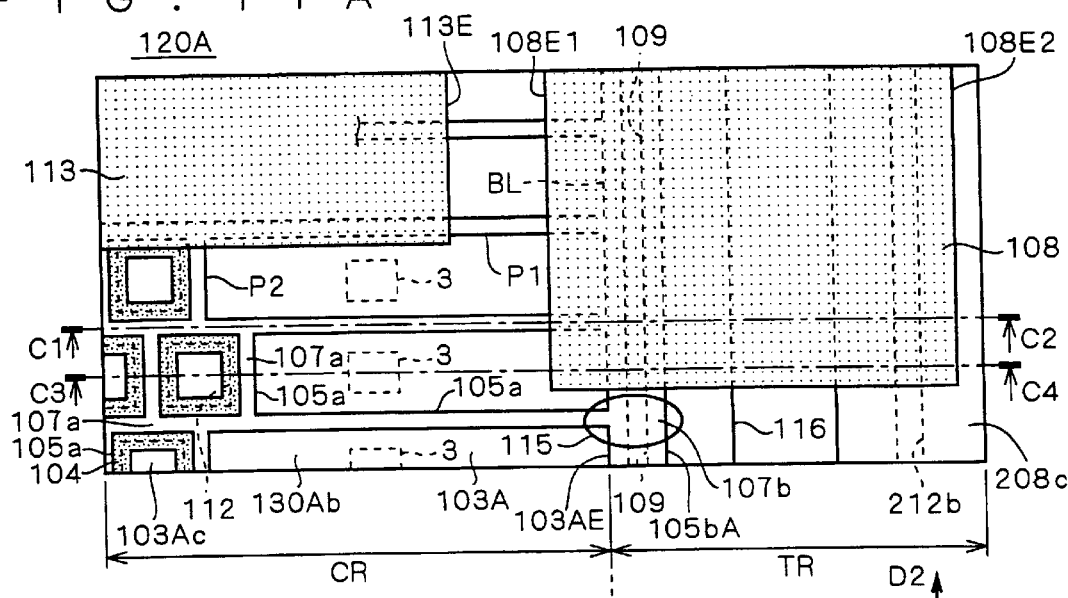
FIGS. 17A, 17B and 17C are views showing a structure of a semiconductor device in accordance with a ninth variation of the present invention.
Figure 17B:
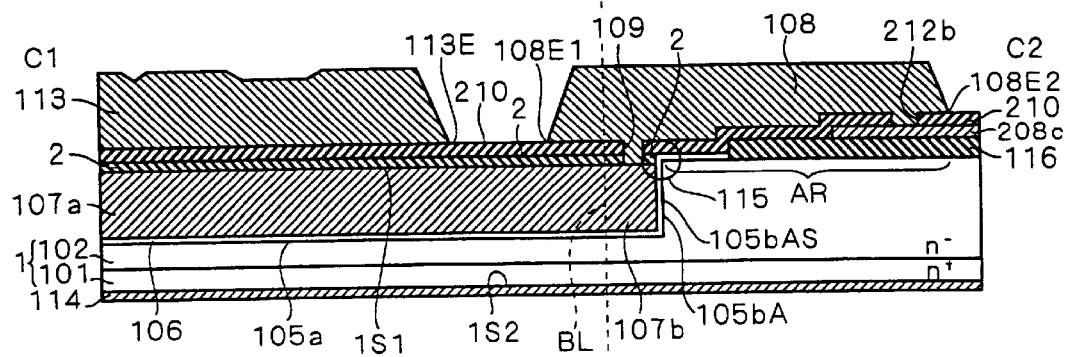
Figure 17C:
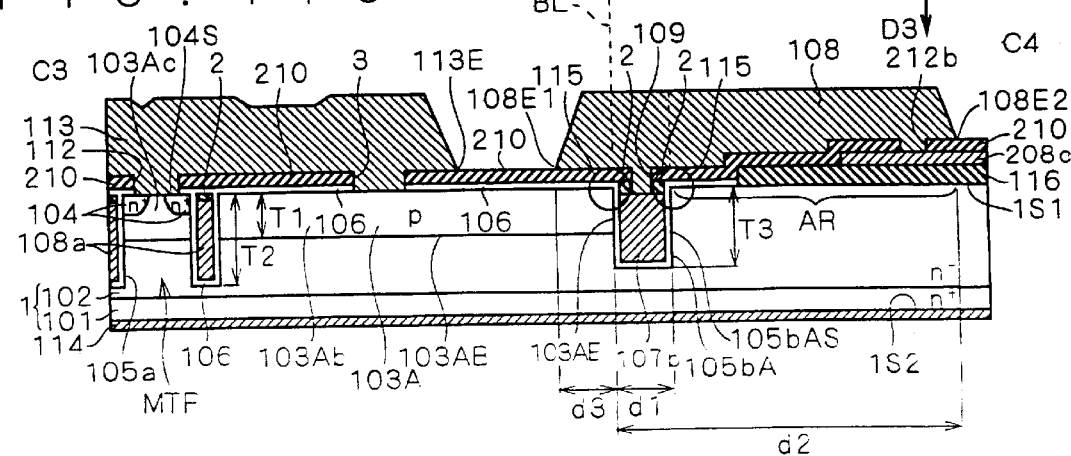

The ninth variation applies the technical concept or the technical characteristic feature of the fourth preferred embodiment (elimination of the peripheral edge side base layer) to the third variation discussed earlier. FIG. 17A is a plan view showing a gate interconnection structure 120A which is a specific example thereof, FIG. 17B is a longitudinal section taken along the line C1–C2 of FIG. 17A and FIG. 17C is a longitudinal section taken along the line C3–C4 of FIG. 17A.

Naturally, the ninth variation produces the same effects (1) to (4) as discussed in the third variation and further produces the characteristic effect (4) of the fourth preferred embodiment.

The Fifth Preferred Embodiment

The fifth preferred embodiment is intended for improvement of the first preferred embodiment, and the improved point thereof lies in that the second trench 105b, the second gate control electrode 107b formed inside the second trench 105b and the stripe-shaped gate contact portion 109 of the first preferred embodiment are eliminated and instead another hole-like gate contact portions are provided immediately above the gate control electrode 107a filling the first portions P1 of the first trench 105a, through which the gate aluminum electrode 108 and the gate control electrode 107a are electrically connected to each other. Other constituent elements are not changed. Referring to figures, the characteristic feature of the fifth preferred embodiment will be discussed below.

Figure 18A:
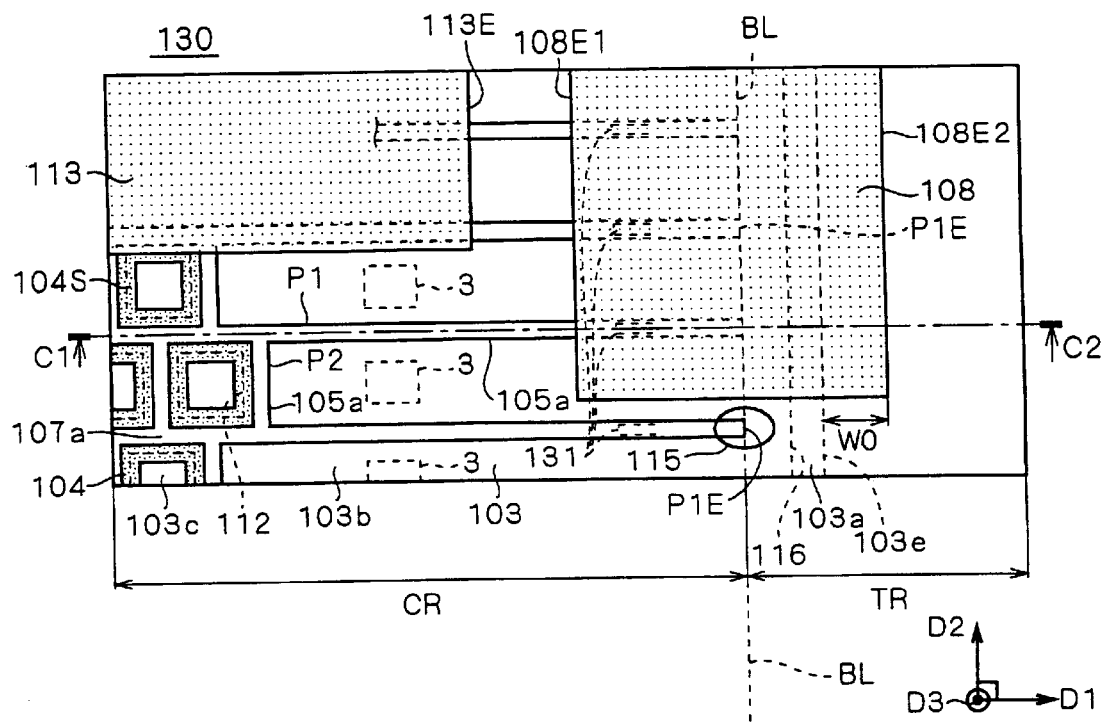
FIGS. 18A and 18B are views showing a structure of a semiconductor device in accordance with a fifth preferred embodiment of the present invention.
Figure 18B:
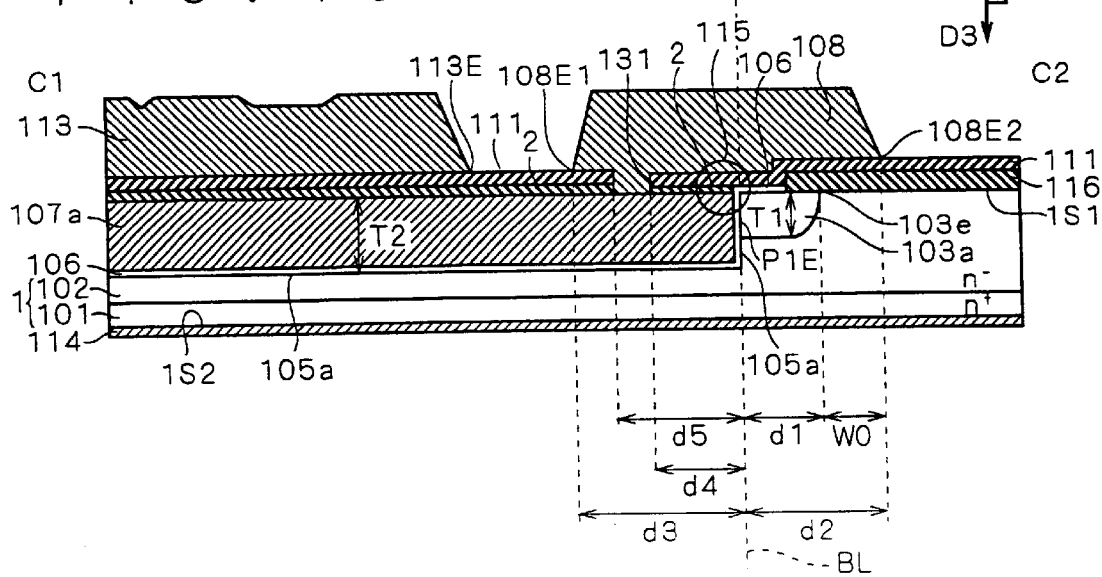

FIGS. 18A and 18B are views corresponding to FIGS. 1A and 1B, and constituent elements in FIGS. 18A and 18B identical to those in FIGS. 1A and 1B are represented by the corresponding reference signs, for convenience. Therefore, description on the common features in the first and fifth preferred embodiments are omitted, and the constituent elements of the fifth preferred embodiment will be discussed below, with a particular emphasis on the characteristic feature different from that of the first preferred embodiment.

As shown in FIGS. 18A and 18B, one end portion P1E of each first portion P1 extending along the first direction D1 serves as the boundary BL between the cell region CR and the terminal region TR. Then, the base layer 103 of the second conductivity type (herein, p type) is formed from the cell region CR and a region in the first main surface 1S1 which is defined by one end which is the boundary BL and the other end or the end 103e away from the boundary BL towards the terminal region TR by the first distance d1 along the first direction D1 towards the inside of the semiconductor layer 102 along the third direction D3.

Moreover, hole-like third contact portions 131 are so formed for the first portions P1, respectively, in the insulating layer (2+111), (106+111) as to expose part of a portion in upper surfaces of portions of the gate control electrode 107a filling the first portions P1, which is sandwiched between a first location away from the boundary BL by the fourth distance d4 along the first direction D1 and a second location away from the boundary BL by a fifth distance d5 longer than the fourth distance d4 along the first direction D1.

Further, the gate electrode 108 is formed inside the third contact portions 131 and on a portion in the insulating layer which is defined by the boundary BL and a location away from the boundary BL towards the cell region CR by a third distance d3 longer than the fifth distance d5 along the first direction D1 and on a portion in the insulating layer which is defined by the boundary BL and a location away from the boundary BL towards the terminal region TR by a second distance d2 (difference WO) longer than the first distance d1 along the first direction D1, and extends along the second direction D2, being electrically connected to the gate control electrode 107a through the third contact portions 131.

The gate interconnection structure 130 having the above structure produces the same effects (1) to (3) as discussed in the first preferred embodiment and further produces a characteristic effect (4). Specifically, in the fifth preferred embodiment, since the second trench of the first preferred embodiment is not provided, it is possible to uniformize the widths of the first portions and the second portions of the trench and this consequently eliminates ununiformity in trench depth caused by the p loading effect in trench etching.

The Tenth Variation

Figure 19:
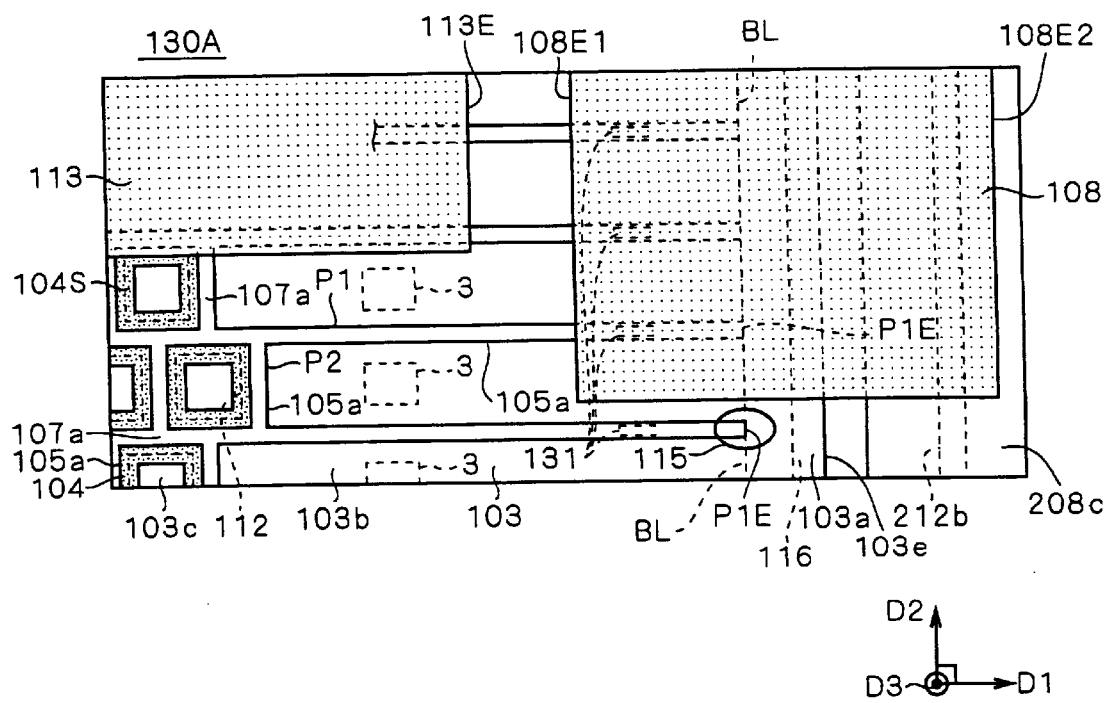
FIG. 19 is a view showing a structure of a semiconductor device in accordance with a tenth variation of the present invention.

The tenth variation applies the fifth preferred embodiment to the third variation discussed earlier. FIG. 19 is a plan view showing a gate interconnection structure 130A which is a specific example thereof.

The tenth variation produces the same effects (1) to (4) as discussed in the third variation and further produces the characteristic effect (4) of the fifth preferred embodiment.

The Sixth Preferred Embodiment

The sixth preferred embodiment relates to an exemplary method of manufacturing the gate interconnection structure 100 (see FIGS. 1A, 1B and 1C) of the first preferred embodiment. Hereafter, process steps for manufacturing the MOS transistor portion MTP of FIG. 1A are shown in the longitudinal sections of FIGS. 20, 22, 24, 26, 28, 30, 32, 34, 36, 38, 40 and 42, taken along the line C3–C4 of FIG. 1A. On the other hand, process steps for manufacturing a region around the boundary BL including the second trench 105b and the gate electrode 108 in FIG. 1A are shown in the longitudinal sections of FIGS. 21A, 23A, 25A, 27A, 29A, 31A, 33A, 35A, 37A, 39A, 41A and 43A taken along the line C1–C2 of FIG. 1A and the longitudinal sections of FIGS. 21B, 23B, 25B, 27B, 29B, 31B, 33B, 35B, 37B, 39B, 41B and 43B taken along the line C3–C4 of FIG. 1A.

Figure 20:
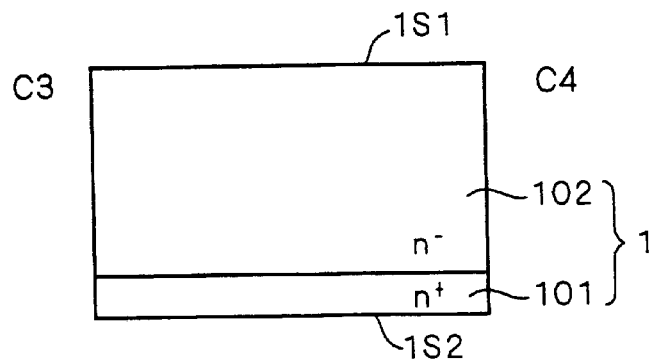
Figure 21A:
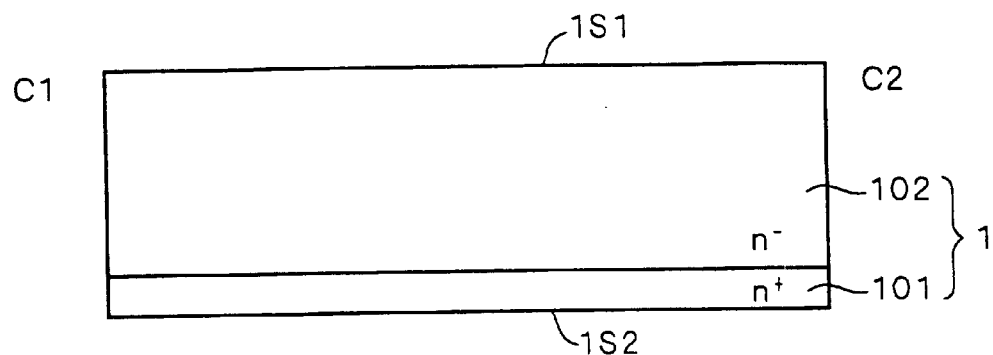
Figure 21B:
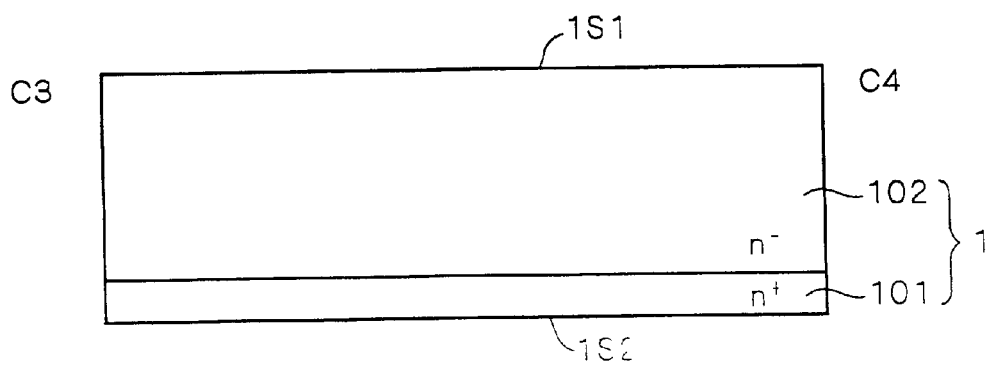

(Step 1) FIGS. 20, 21A and 21B

First, a semiconductor substrate containing $n^+$-type impurities of high concentration is prepared. This semiconductor substrate corresponds to the $n^+$-type semiconductor layer 101 of FIG. 1A. Next, the n-type semiconductor layer 102 is formed on the upper surface of the $n^+$-type semiconductor layer 101 by the epitaxial growth method. Consequently achieved is the plate-like semiconductor substrate 1 whose base material is silicon. The upper surface of the semiconductor substrate is the first main surface 1S1 and the lower surface thereof is the second main surface 1S2. Further, the semiconductor substrate 1 can be bought from a semiconductor wafer maker.

Figure 22:
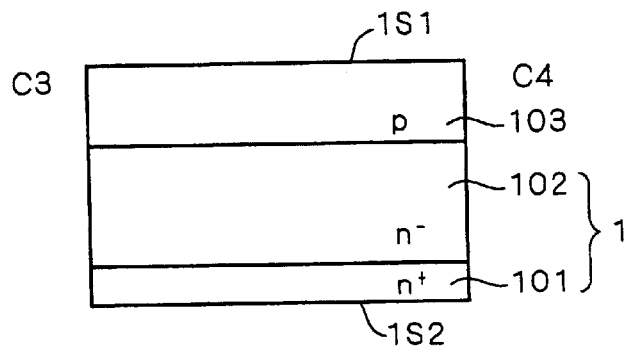
Figure 23A:
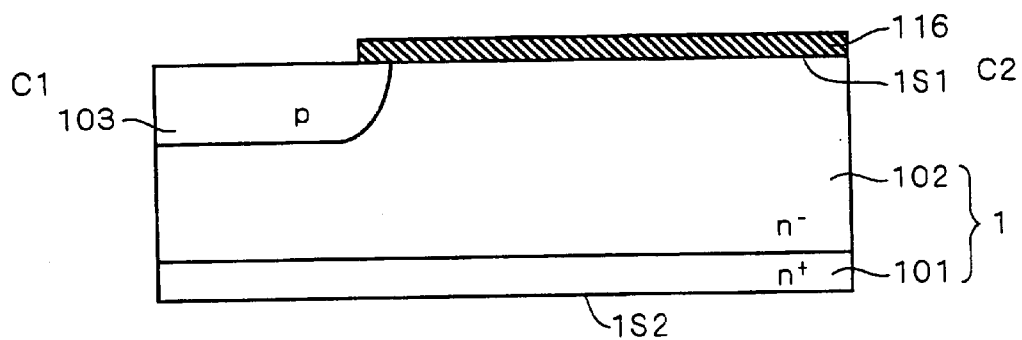
Figure 23B:
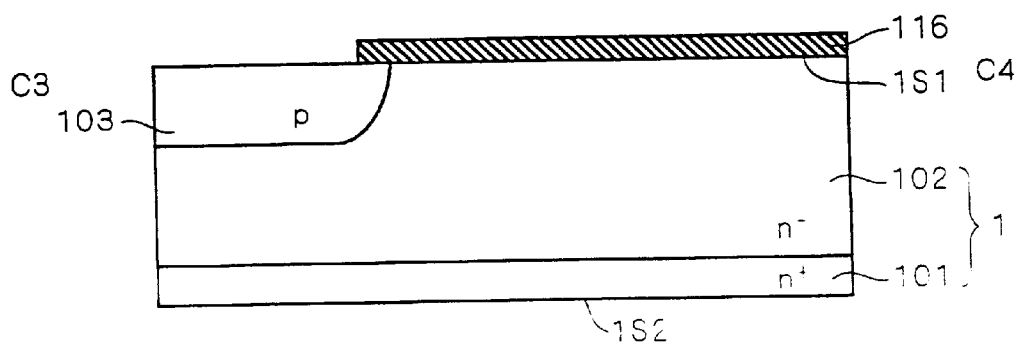

(Step 2) FIGS. 22, 23A and 23B

Next, an insulating film such as an oxide film is formed entirely on the first main surface 1S1 of the semiconductor substrate 1 and then a photoresist pattern (not shown) is selectively formed by photolithography. With the photoresist pattern used as a mask, the insulating film is etched to form the insulating film 116 and the photoresist is removed. After that, p-type impurities (e.g., boron) are ion-implanted from the exposed first main surface 1S1 into the inside of the semiconductor layer 102 and a heat treatment is performed on the semiconductor substrate 1 after the ion-implantation, to selectively form the p-type base layer 103 inside the semiconductor layer 102. In the MOS transistor portion, however, the base layer 103 is entirely formed.

Figure 24:
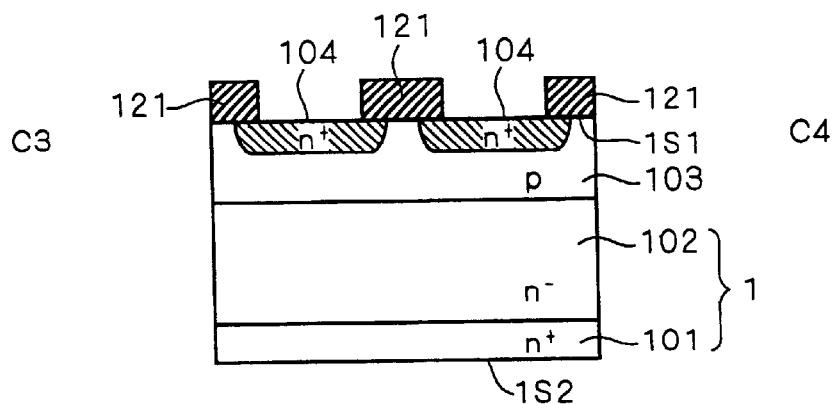
Figure 25A:
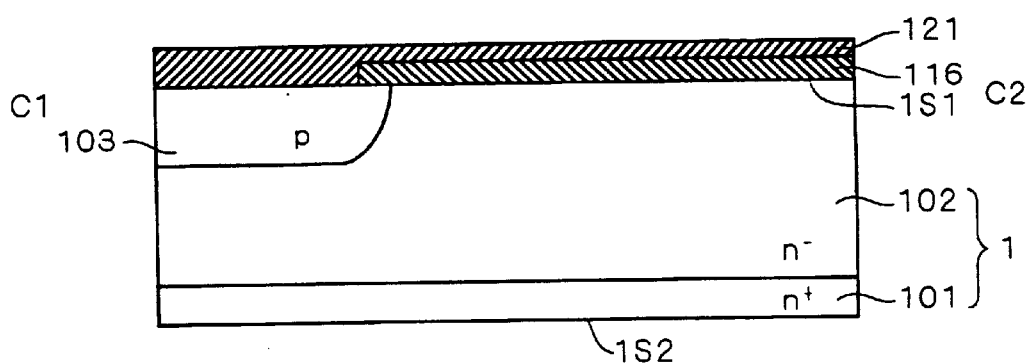
Figure 25B:
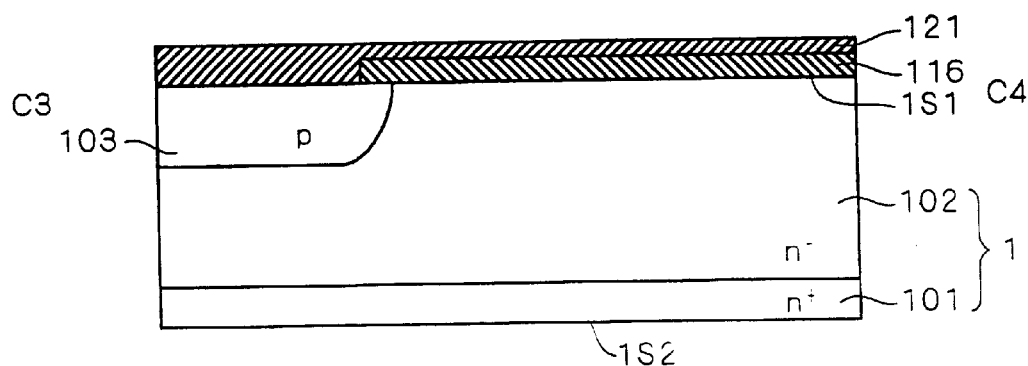

(Step 3) FIGS. 24, 25A and 25B

Next, a photoresist is formed entirely on the first main surface 1S1 and the insulating film 116, and a photoresist pattern 121 is selectively formed on part of the upper surface of the base layer 103 in the MOS transistor portion. With the photoresist pattern 121 used as a mask, an arsenic which is an n-type impurity is implanted into the inside of the exposed base layer 103 and the implanted n-type impurities are diffused, to form an $n^+$-type semiconductor layer 104. After that, the photoresist pattern 121 is removed.

Figure 26:
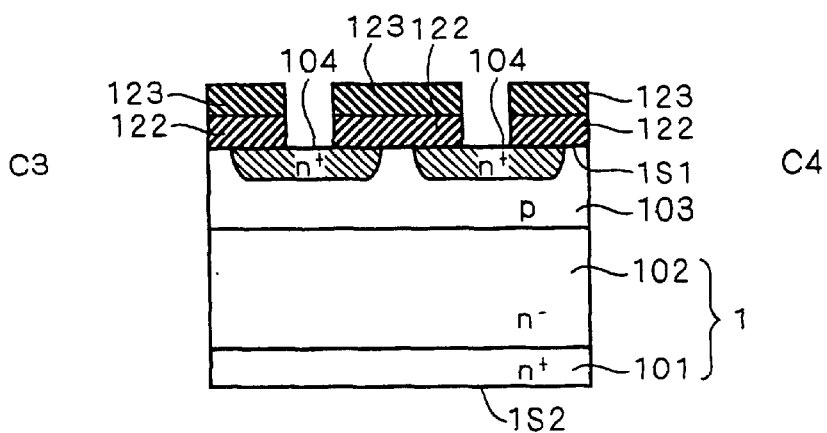
Figure 27A:
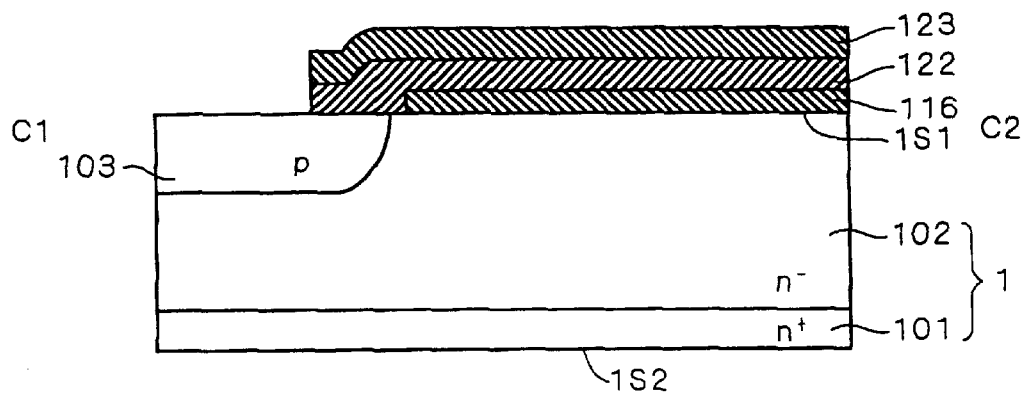
Figure 27B:
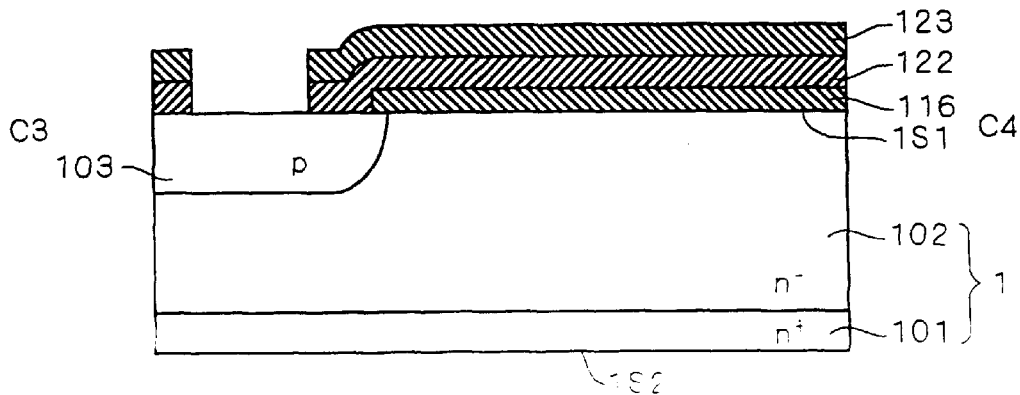

(Step 4) FIGS. 26, 27A and 27B

Next, an oxide film 122 is vapor-deposited entirely on the first main surface 1S1 and the insulating film 116 by the CVD method, and a photoresist is formed entirely on the oxide film 122. Then, a portion in the photoresist located above part of the upper surface of the base layer 103 and a portion in the photoresist located above part of an upper surface of the semiconductor layer 104 are opened by photolithography, to form a photoresist pattern 123. With the photoresist pattern 123 used as a mask, the oxide film 122 is dry-etched, to expose the above part on the upper surface of the base layer 103 and the above part of the upper surface of the semiconductor layer 104. After that, the photoresist pattern 123 is removed.

Figure 28:
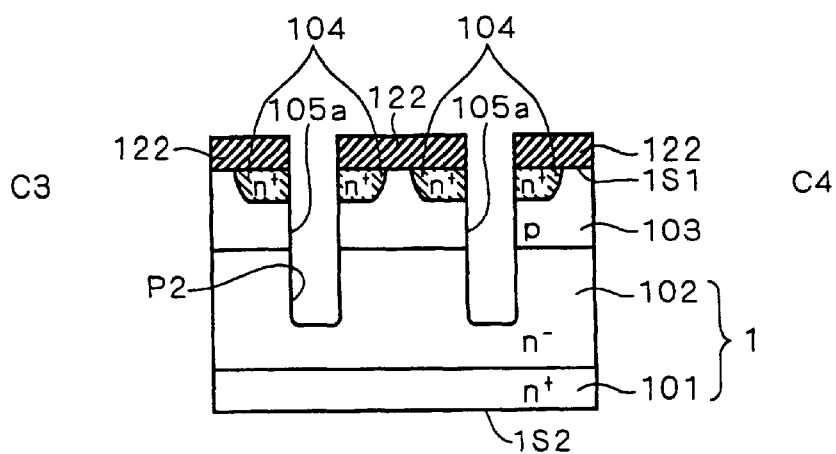
Figure 29A:
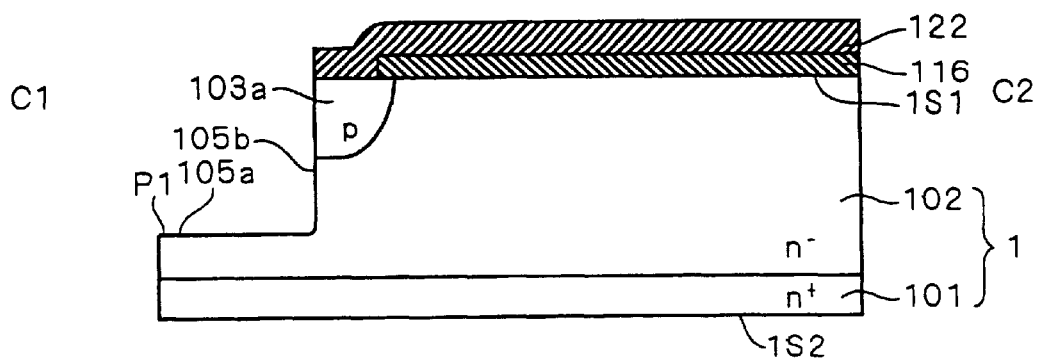
Figure 29B:
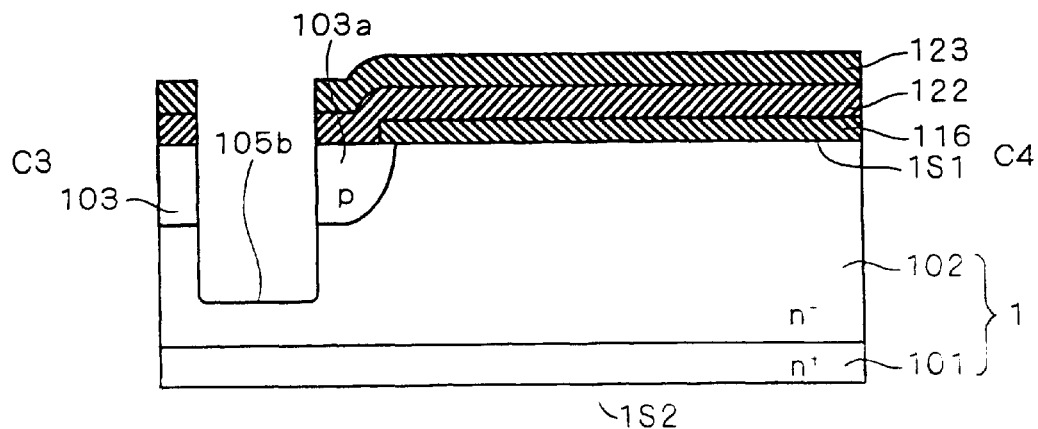

(Step 5) FIGS. 28, 29A and 29B

Next, with the patterned oxide film 122 used as a mask, a silicon etching is performed, to form the first trench 105a and the second trench 105b both of which penetrate the base layer 103 to have bottom surfaces thereof in the semiconductor layer 102. Herein, the first portions P1 of the first trench 105a extend along the first direction discussed earlier, the second trench 105b extends along the second direction discussed earlier while being connected to end portions of the first portions P1 in the first direction and the second portions P2 of the first trench 105a extend along the second direction to act as a bridge between adjacent first portions P1. After that, the oxide film 122 is removed.

Figure 30:
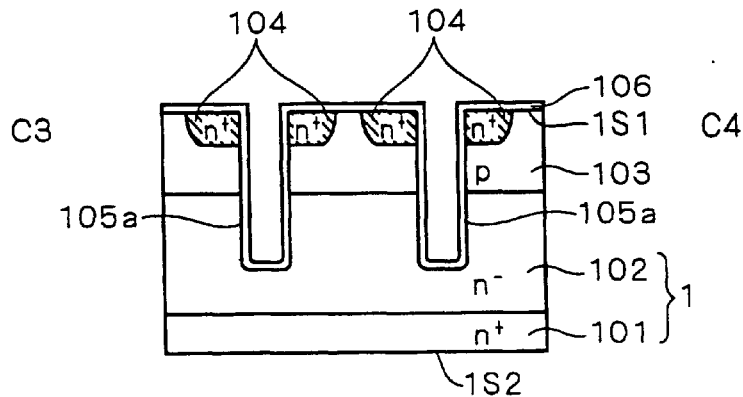
Figure 31A:
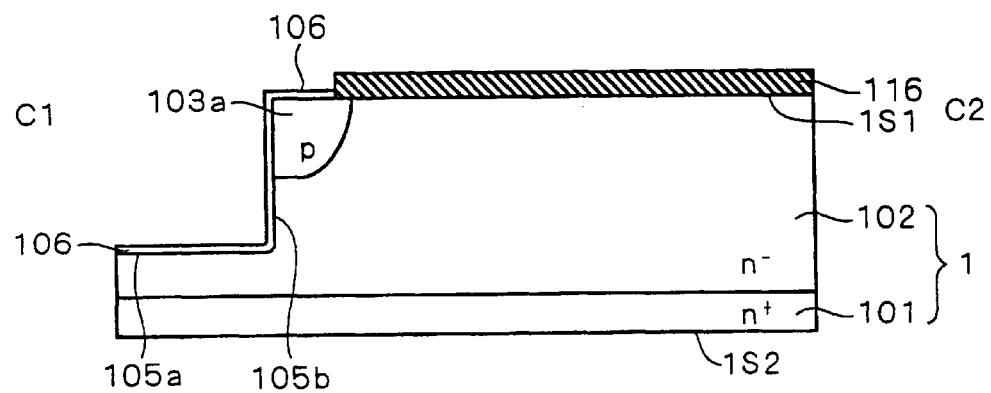
Figure 31B:
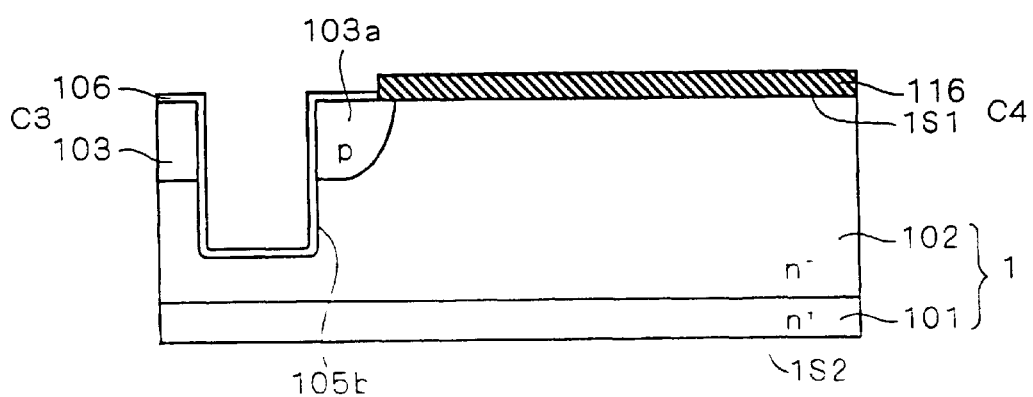

(Step 6) FIGS. 30, 31A and 31B

Next, a gate oxide film 106 is formed entirely on the exposed first main surface 1S1 and the side surfaces and the bottom surfaces of the first trench 105a and the second trench 105b.

Figure 32:
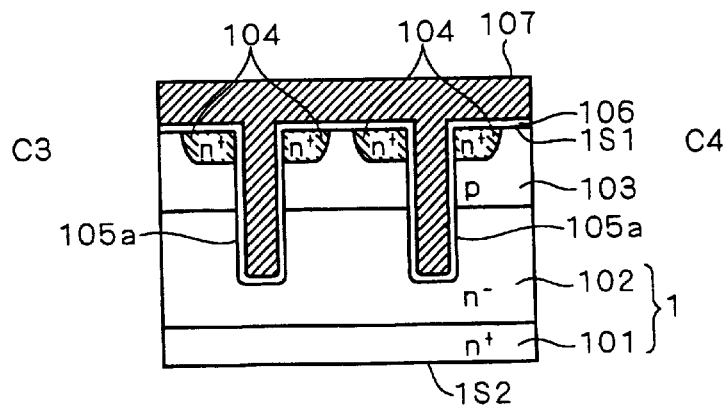
Figure 33A:
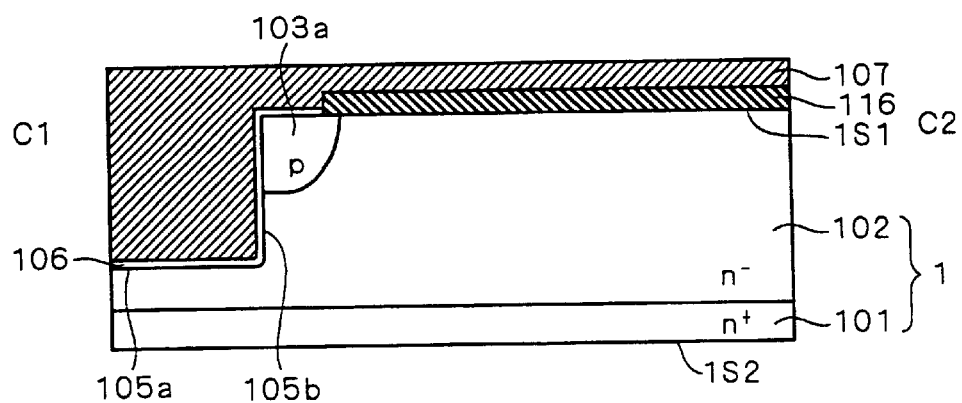
Figure 33B:
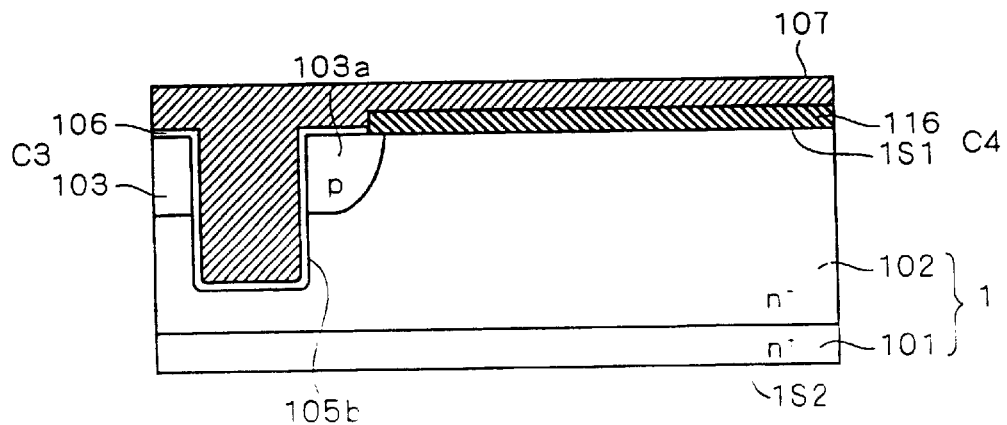

(Step 7) FIGS. 32, 33A and 33B

Next, a polysilicon layer 107 doped with an n-type impurity is vapor-deposited entirely on the exposed gate oxide film 106 and the exposed insulating film 116 by the CVD method.

Figure 34:
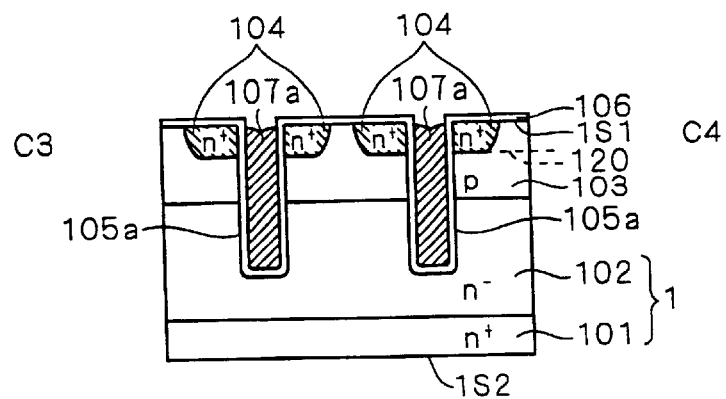
Figure 35A:
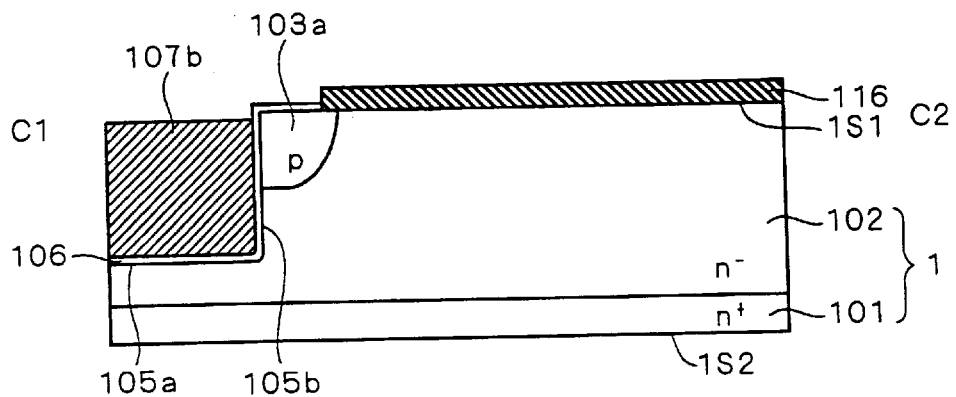
Figure 35B:
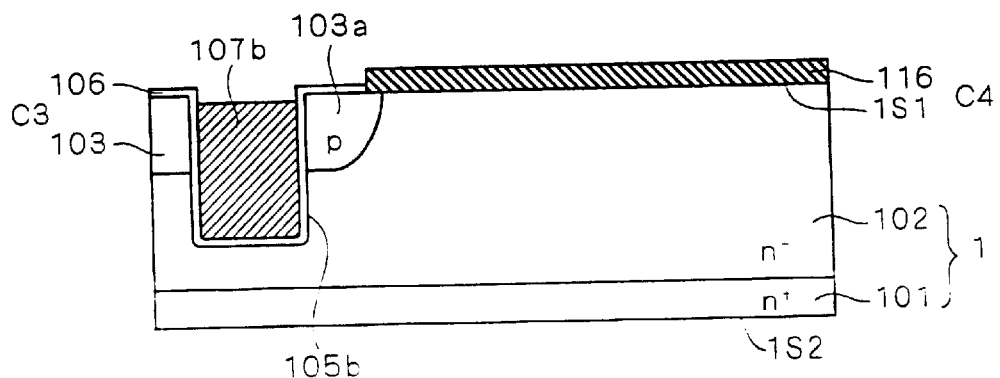

(Step 8) FIGS. 34, 35A and 35B

Next, for a normal operation of the MOS transistor, the polysilicon layer is etched back so that an upper surface of a polysilicon layer (the first gate control electrode) 107a should be located inside the first trench 105a, above a junction face 120 between the semiconductor layer 103 and the semiconductor layer 104 and slightly below the first main surface 1S1. Through this etchback, an upper surface of a polysilicon layer (the second gate control electrode) 107b inside the second trench 105b is also located slightly below the first main surface 1S1.

(Step 9) FIGS. 36, 37A and 37B

Next, a cap oxidation is performed in order to insulate the whole of exposed surfaces, to thereby form the cap oxide film 2 on the upper surfaces of the polysilicon layers 107a and 107b. After that, the protection film 111 (made of, e.g., BPSG) which is an interlayer insulating film is formed entirely on the exposed surface of the semiconductor substrate 1 by the CVD method.

Figure 38:
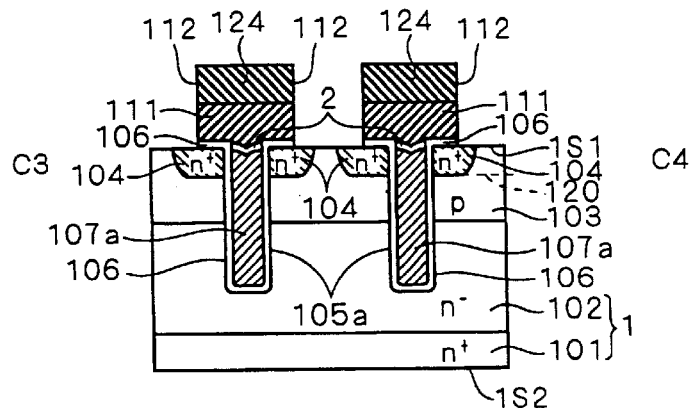
Figure 39A:
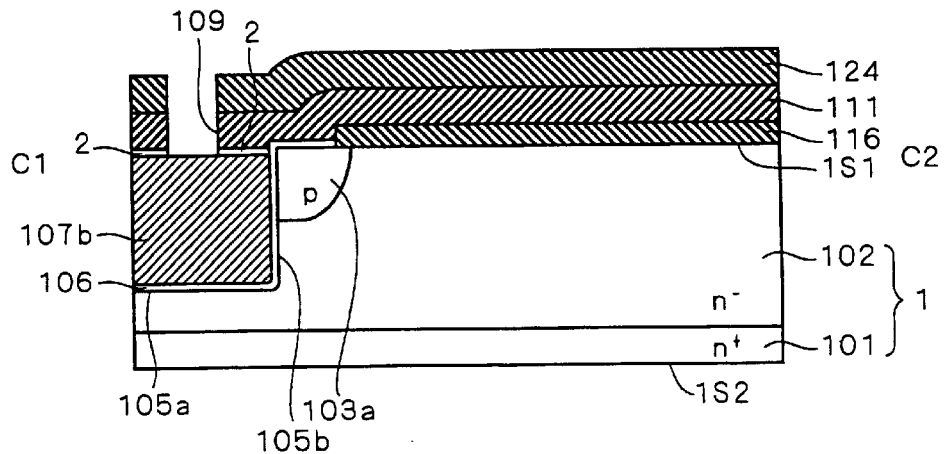
Figure 39B:
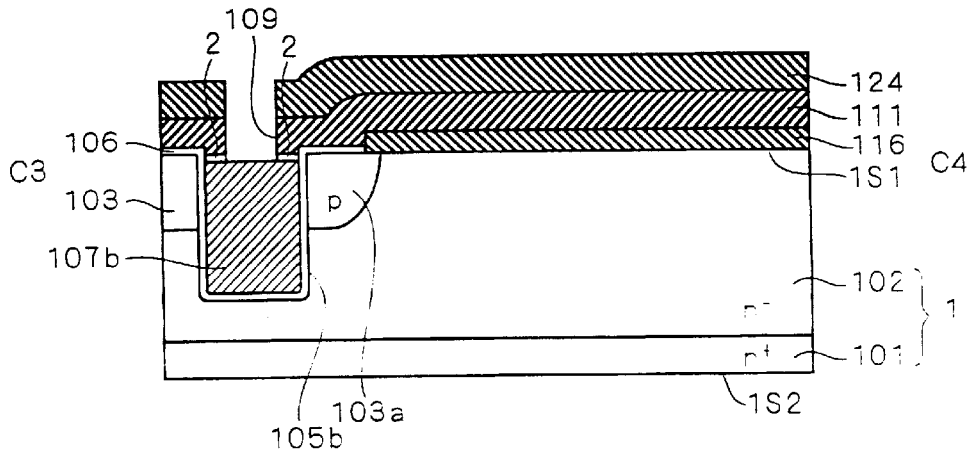

(Step 10) FIGS. 38, 39A and 39B

Next, a photoresist is formed entirely on the protection film 111 and a photoresist pattern 124 having openings each located above the upper surface of the source region 104 and the upper surface of the base layer 103 surrounded by the source region 104 and an opening located above the upper surface of the polysilicon layer 107b is formed by photolithography. With the photoresist pattern 124 used as a mask, the protection film 111 is dry-etched, thereby to form the hole-like source contact portions (the first contact portions) 112 in the MOS transistor portion and to form the gate contact portion (the third contact portion) 109 in stripe immediately above the upper surface of the second gate control electrode 107b inside the second trench 105b. After that, the photoresist pattern 124 is removed.

Figure 40:
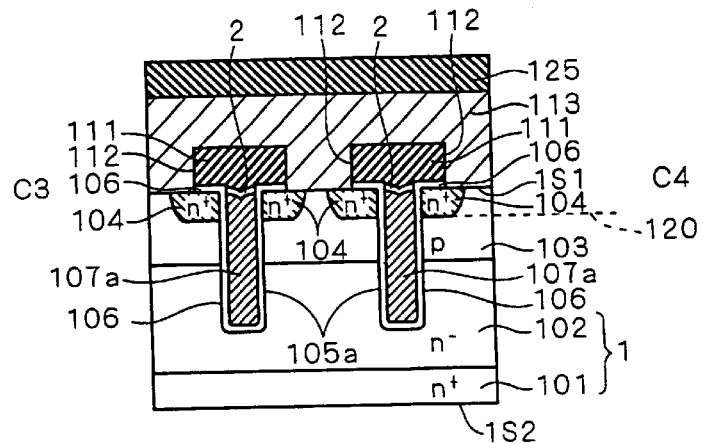
Figure 41A:
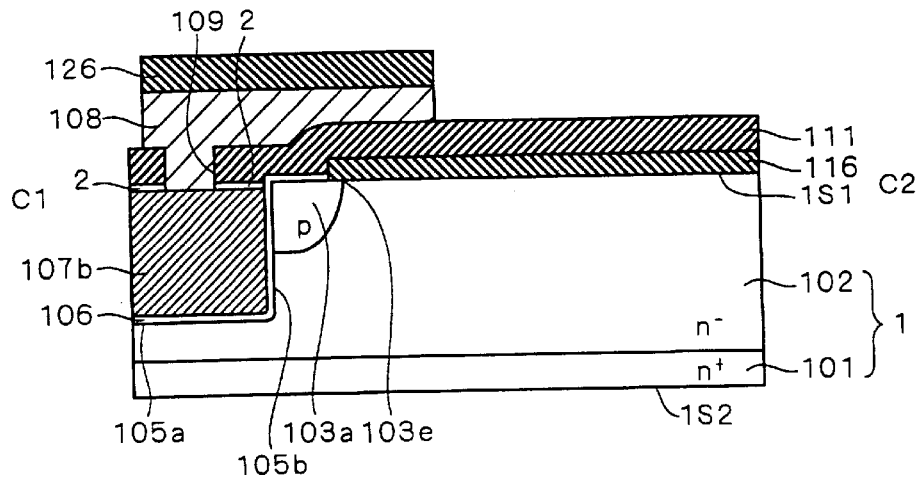
Figure 41B:
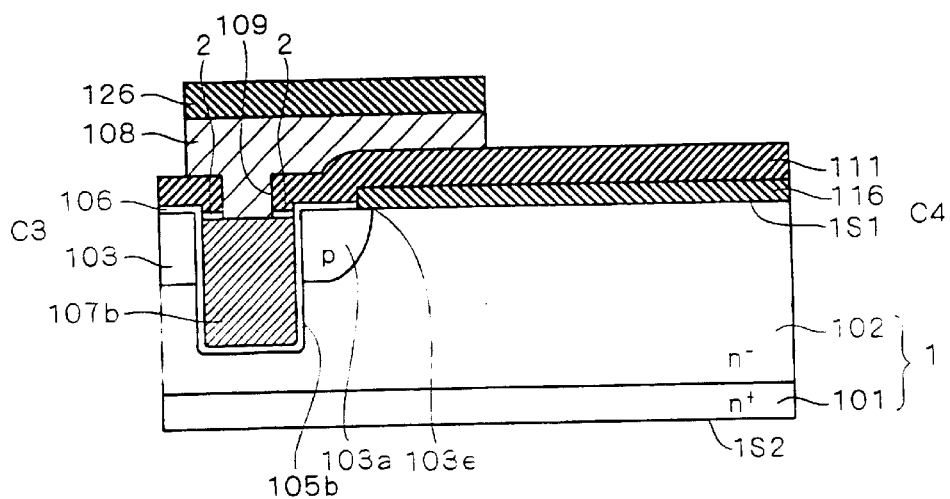

(Step 11) FIGS. 40, 41A and 41B

Next, a conductive Al—Si layer is vapor-deposited entirely on the exposed surface of the semiconductor substrate 1 by sputtering, and further photoresist patterns 125 and 126 are formed on the Al—Si layer by photolithography. With the photoresist patterns 125 and 126 used as masks, the Al—Si layer is thereafter etched, to form the source aluminum electrode 113 and the gate aluminum electrode 108. At this time, the photoresist pattern 126 is formed so that an end portion of the gate aluminum electrode 108 on the side of channel stopper should protrude towards the channel stopper beyond the end portion 103e of the peripheral edge side base layer 103a. After that, the photoresist patterns 125 and 126 are removed.

Figure 42:
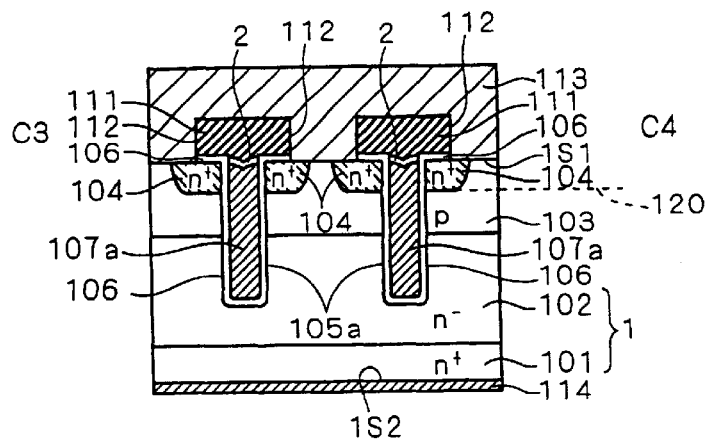
Figure 43A:
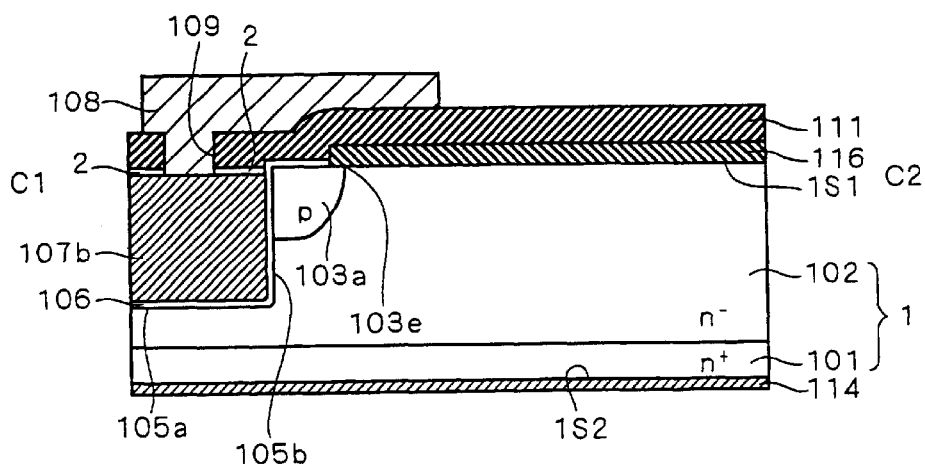
Figure 43B:
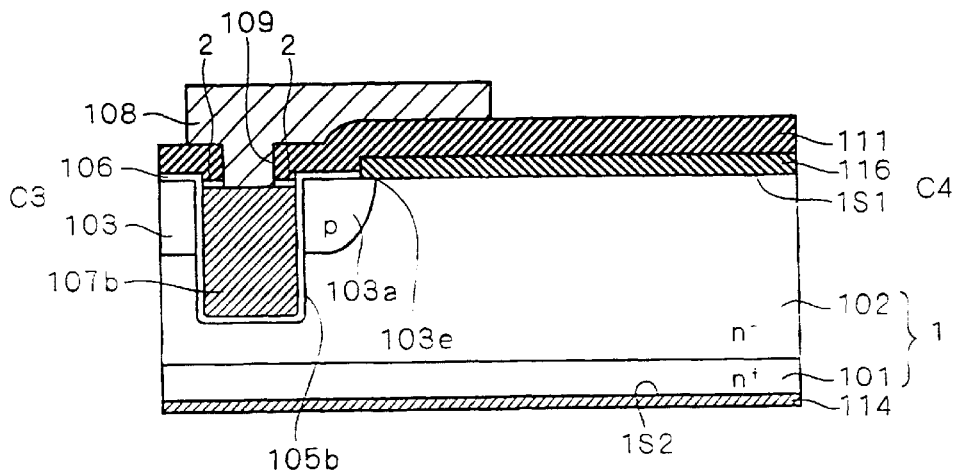

(Step 12) FIGS. 42, 43A and 43B

Finally, a conductive Ti/Ni/Au alloy layer is vapor-deposited entirely on the second main surface 1S2 by sputtering, to form the drain electrode 114.

The sixth preferred embodiment produces an effect of reducing the number of manufacturing process steps, as compared with the method of manufacturing the unpublished product (no prior art) made by the present applicant company discussed in association with the problems to be solved in the present invention, since patterning of the polysilicon gate control electrode formed on the insulating film is not needed.

The Eleventh Variation

The eleventh variation relates to an exemplary method of manufacturing the gate interconnection structure 100C (see FIGS. 6A, 6B and 6C) of the third variation. In the eleventh variation, description on the common process steps with the sixth preferred embodiment uses the corresponding figures and description of the sixth preferred embodiment (specifically, description on the steps 1 to 7 of the sixth preferred embodiment). Therefore, the process steps different from those of the sixth preferred embodiment will be described below. Further, as to figures, figures without the signs A or B are longitudinal sections of the MOS transistor portion MTP, taken along the line C3–C4 of FIG. 6A, figures with sign A are longitudinal sections of the region near the boundary BL, taken along the line C1–C2 of FIG. 6A and figures with sign B are longitudinal sections of the region near the boundary BL, taken along the line C3–C4 of FIG. 6A, like in the sixth preferred embodiment.

Figure 44:
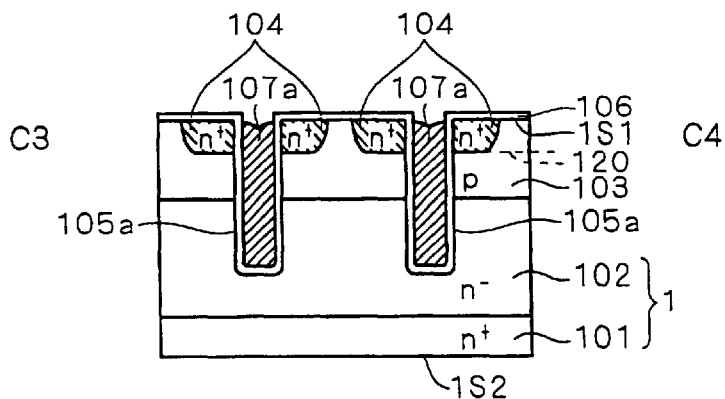
FIGS. 44, 45A and 45B, 46, 47A and 47B, 48, 49A and 49B, 50, 51A and 51B, 52 and 53A and 53B are longitudinal sections each showing a process step of manufacturing a semiconductor device in accordance with an eleventh variation of the present invention.
Figure 45A:
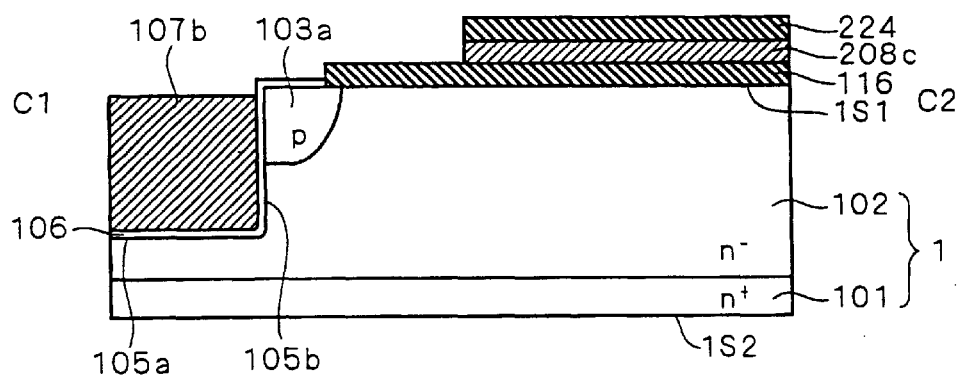
Figure 45B:
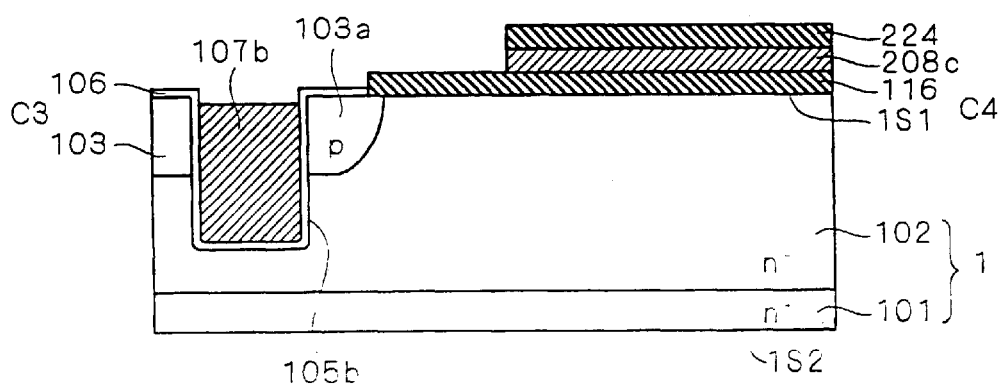

(Step 8) FIGS. 44, 45A and 45B

First, a photoresist pattern 224 is so formed by photolithography as to leave the polysilicon layer 208c on the insulating film 116, and the polysilicon layer 107 is dry-etched, like in the sixth preferred embodiment (see FIGS. 32, 33A and 33B). In this case, the polysilicon layer 208c serves as the third gate control electrode. After that, the photoresist pattern 224 is removed.

Figure 46:
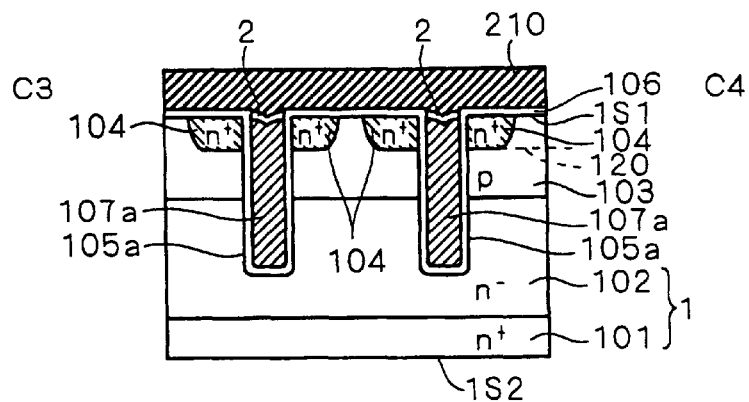
Figure 47A:
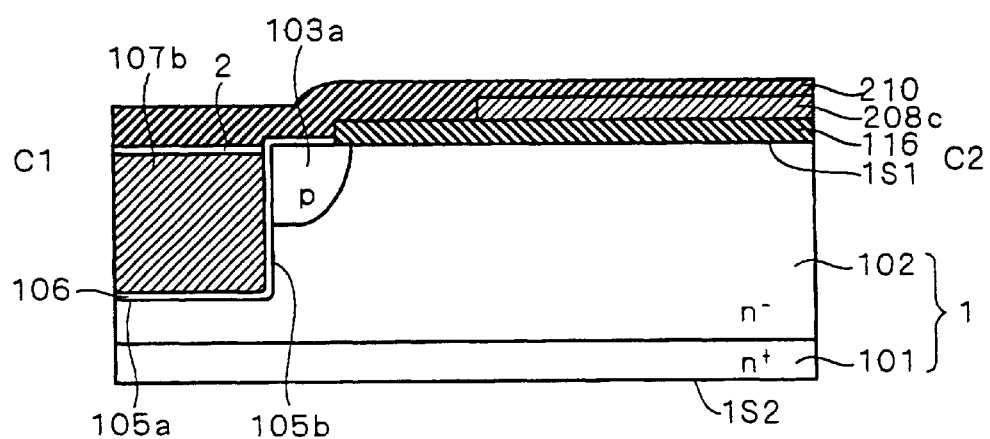
Figure 47B:
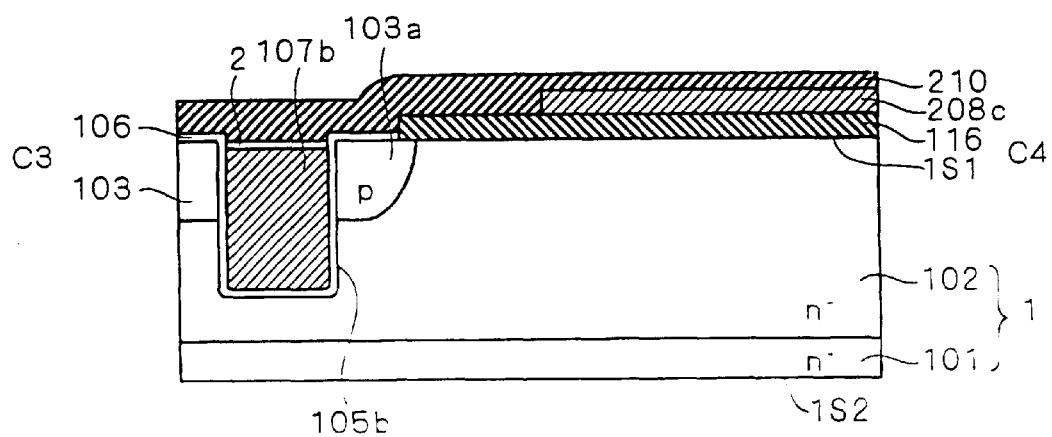

(Step 9) FIGS. 46, 47A and 47B

Next, a cap oxidation is performed in order to insulate the whole of exposed surface of the semiconductor substrate 1, to thereby form the cap oxide film 2. After that, a protection film 210 (made of, e.g., BPSG) which is an interlayer insulating film is formed entirely on the exposed surface of the semiconductor substrate 1 by the CVD method.

Figure 48:
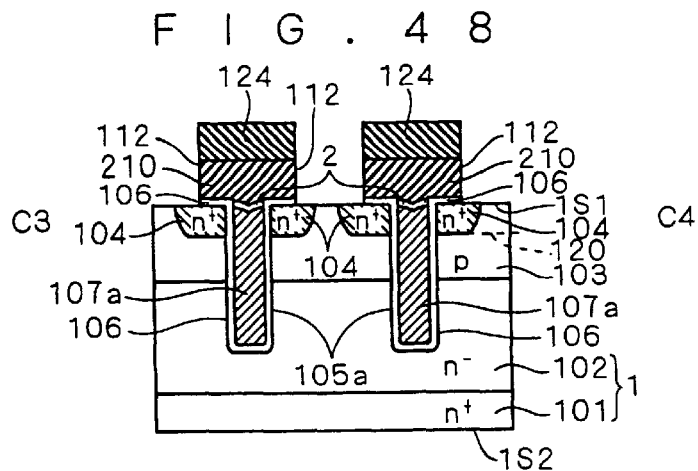
Figure 49A:
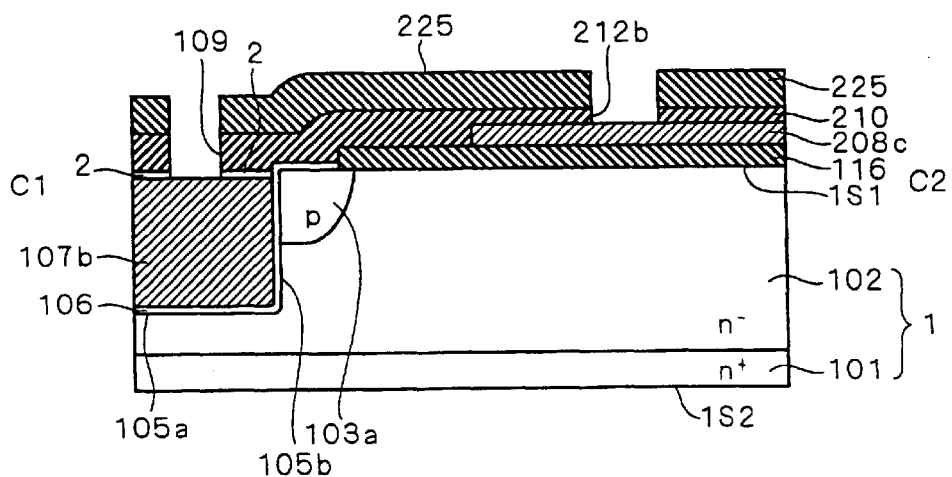
Figure 49B:
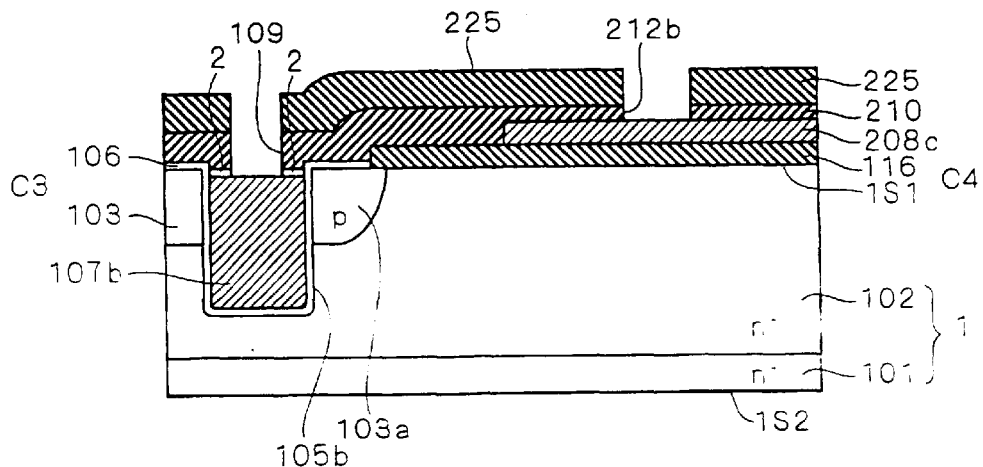

(Step 10) FIGS. 48, 49A and 49B

Next, photoresist patterns 124 and 225 are formed by photolithography and with these photoresist patterns 124 and 125 used as masks, the protection film 210 is dry-etched, thereby to form the (first) source contact portions 112, the first gate contact portion 109 and the second gate contact portion (which corresponds to another gate contact portion) 212b. After that, the photoresist patterns 124 and 225 are removed.

Figure 50:
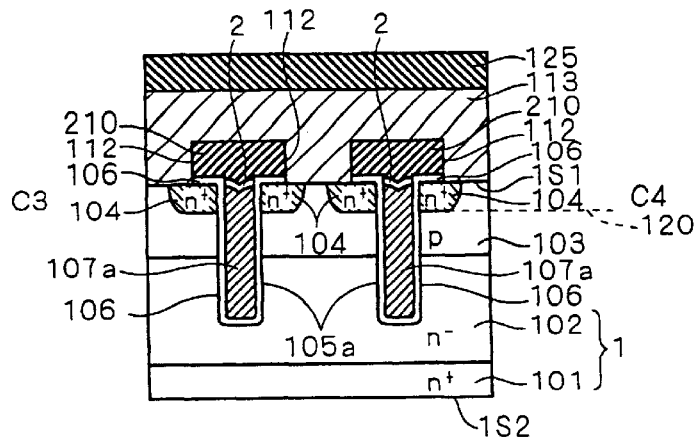
Figure 51A:
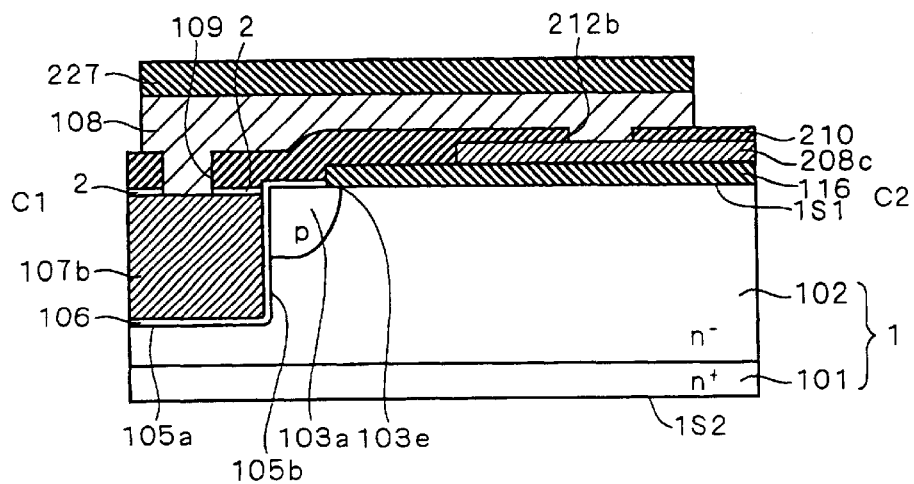
Figure 51B:
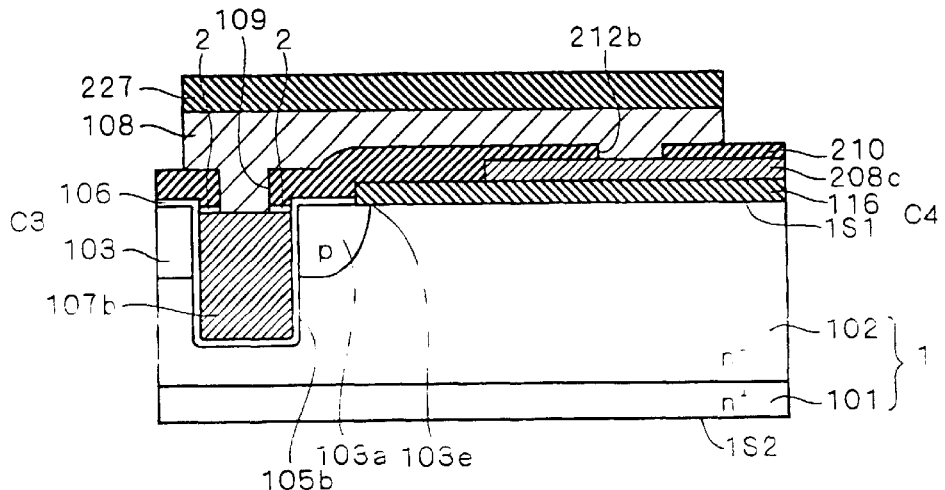

(Step 11) FIGS. 50, 51A and 51B

Next, a conductive Al—Si layer is vapor-deposited entirely on the exposed surface by sputtering, and further photoresist patterns 125 and 227 are formed by photolithography. With the photoresist patterns 125 and 227 used as masks, the Al—Si layer is thereafter etched, to form the source aluminum electrode 113 and the gate aluminum electrode 108. After that, the photoresist patterns 125 and 227 are removed.

Figure 52:
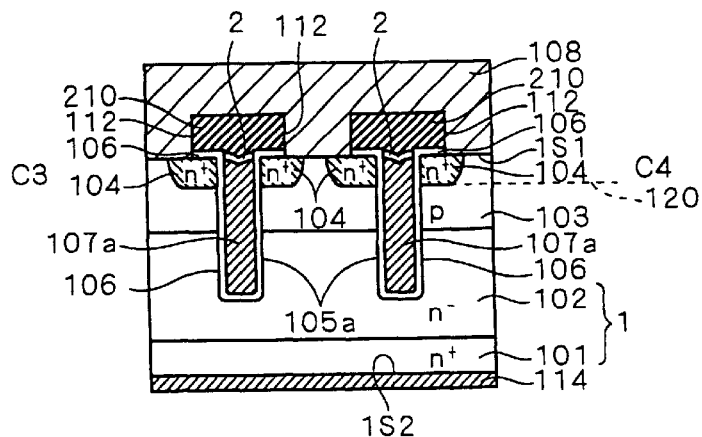
Figure 53A:
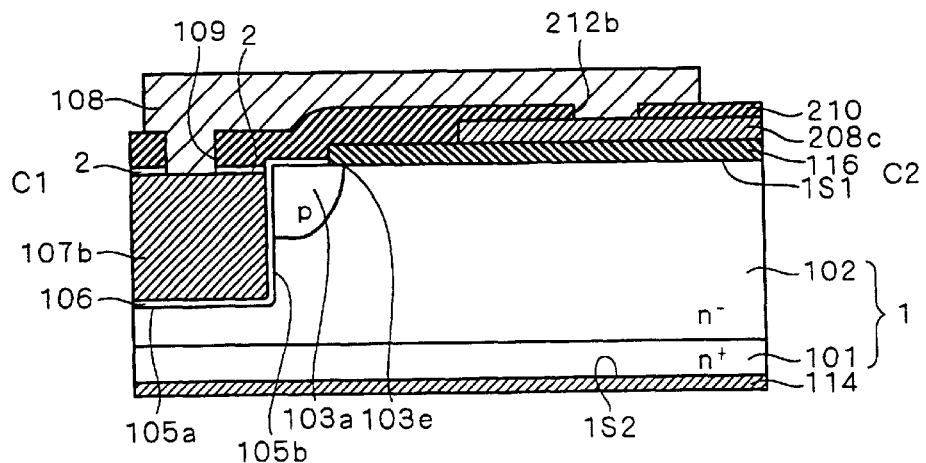
Figure 53B:
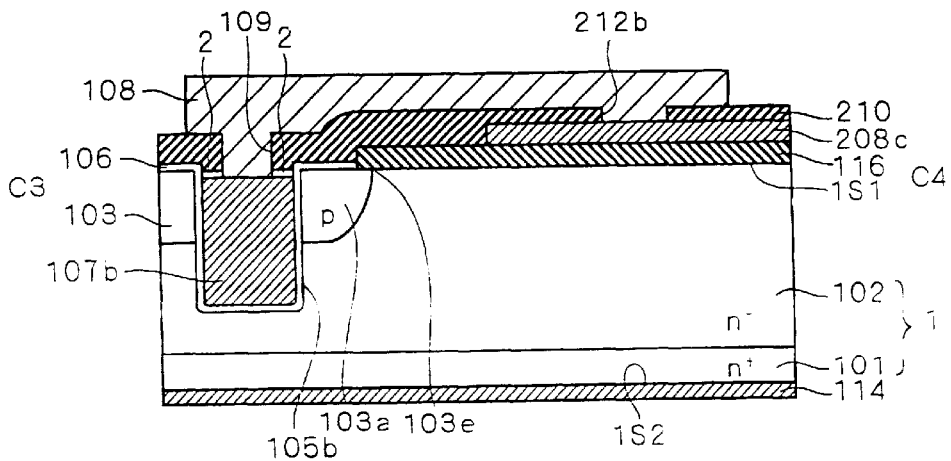

(Step 12) FIGS. 52, 53A and 53B

Finally, the drain electrode 114 is formed entirely on the second main surface 1S2 in the same manner as in the sixth preferred embodiment. Thus, the gate interconnection structure 100C is achieved.

As is clear from the above description on the manufacturing process steps, the eleventh variation produces an advantage of easily manufacturing a structure to increase an area of the contact region between the gate aluminum electrode and the gate control electrode.

The Seventh Preferred Embodiment

The seventh preferred embodiment relates to an exemplary method of manufacturing the gate interconnection structure 150 (see FIGS. 10, 11B and 11C) of the second preferred embodiment. In the seventh preferred embodiment, description on the common process steps with the sixth preferred embodiment uses the corresponding figures and description of the sixth preferred embodiment (specifically, description on the steps 1 to 9 of the sixth preferred embodiment). Therefore, the process steps different from those of the sixth preferred embodiment will be described. Further, as to figures, figures without the signs A or B are longitudinal sections of the MOS transistor portion MTP, taken along the line C3–C4 of FIG. 10, figures with sign A are longitudinal sections of the region near the boundary BL, taken along the line C1–C2 of FIG. 10 and figures with sign B are longitudinal sections of the region near the boundary BL, taken along the line C3–C4 of FIG. 10, like in the sixth preferred embodiment.

Figure 54:
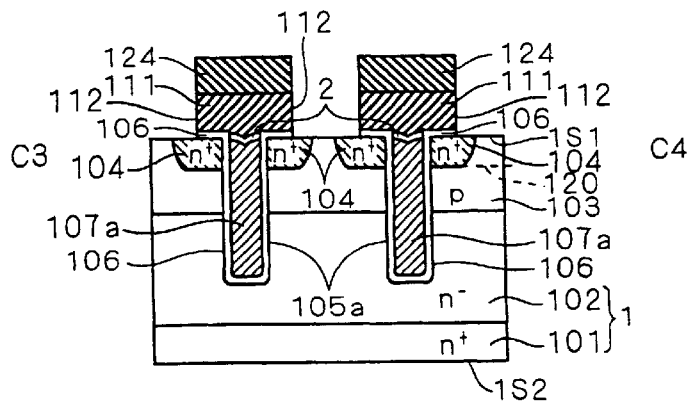
FIGS. 54, 55A and 55B, 56, 57A and 57B, 58 and 59A and 59B are longitudinal sections each showing a process step of manufacturing a semiconductor device in accordance with a seventh preferred embodiment of the present invention.
Figure 55A:
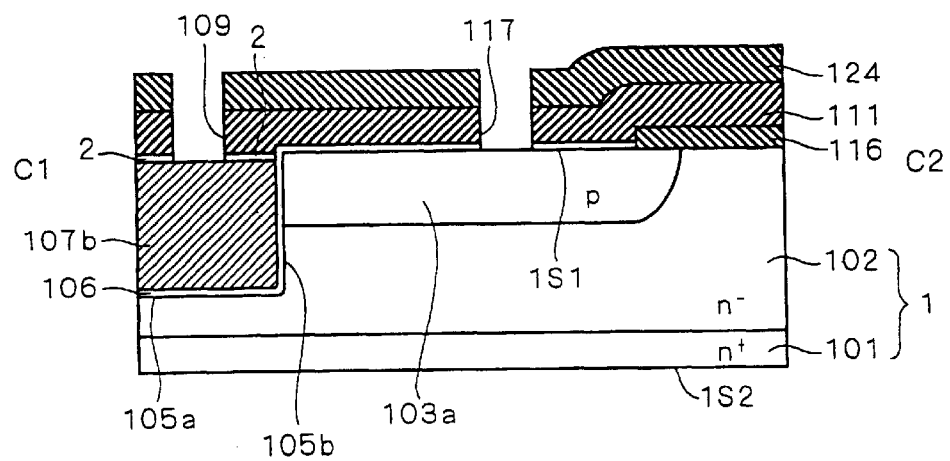
Figure 55B:
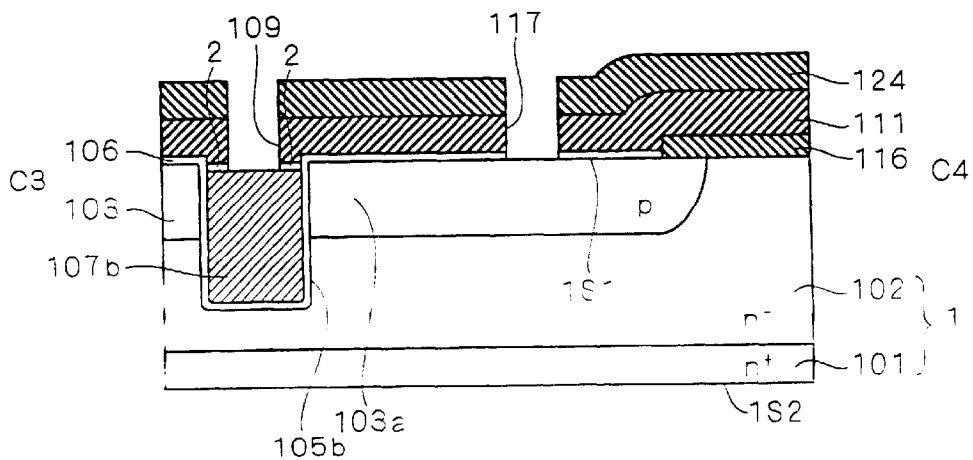

(Step 10) FIGS. 54, 55A and 55B

First, the photoresist pattern 124 is formed by photolithography on the protection film 111 and with the photoresist pattern 124 used as a mask, the protection film 111 is dry-etched, to form the first source contact portions 112, the gate contact portion 109 and the third source contact portion 117 immediately above the peripheral edge side base layer 103a. After that, the photoresist pattern 124 is removed.

Figure 56:
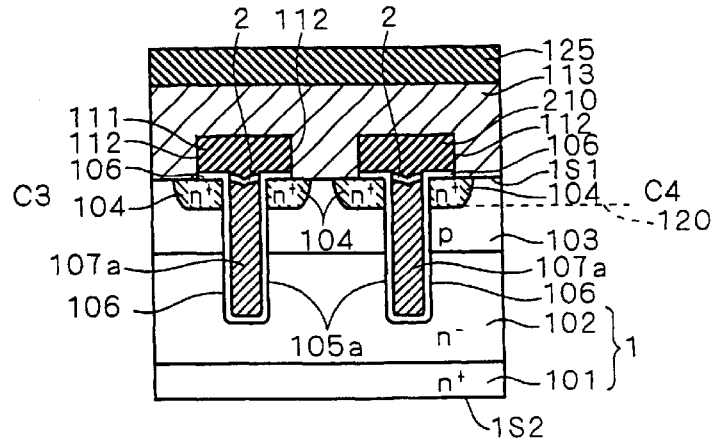
Figure 57A:
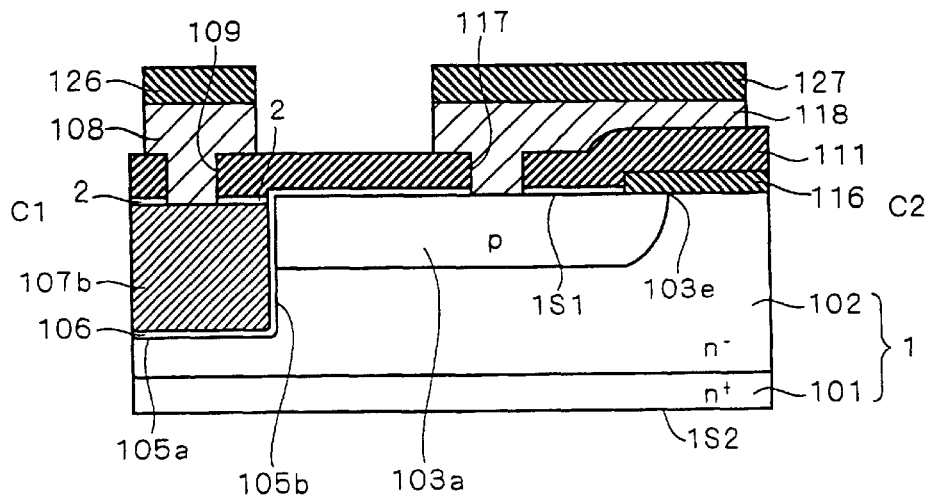
Figure 57B:
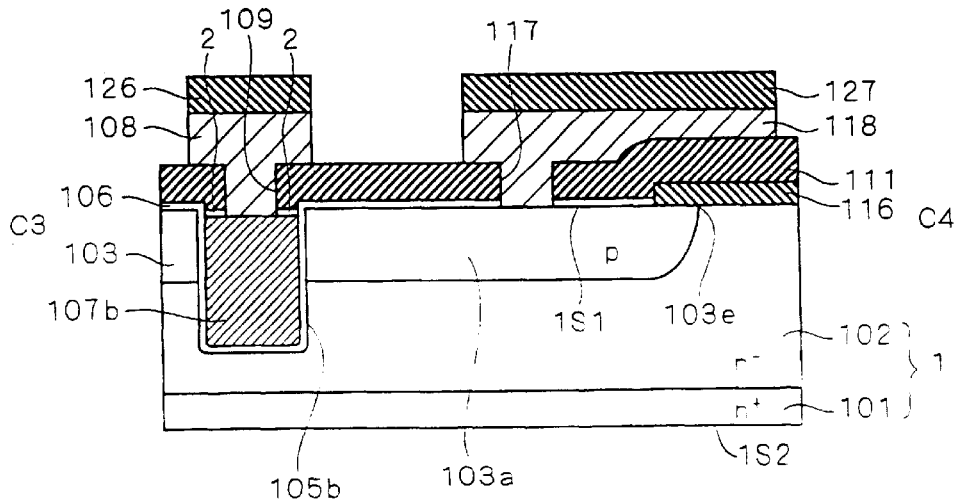

(Step 11) FIGS. 56, 57A and 57B

Next, a conductive Al—Si layer is vapor-deposited entirely on the exposed surface of the semiconductor substrate 1 by sputtering, and further photoresist patterns 125, 126 and 127 are formed on the Al—Si layer by photolithography. With the photoresist patterns 125, 126 and 127 used as masks, the Al—Si layer is thereafter etched, to form the first source aluminum electrode 113, the gate aluminum electrode 108 and the second source aluminum electrode 118. At this time, the size of the photoresist pattern 127 is determined in advance so that an end portion of the second source aluminum electrode 118 on the side of channel stopper should protrude towards the channel stopper beyond the end portion 103e of the peripheral edge side base layer 103a. Further, the first source aluminum electrode 113 and the second source aluminum electrode 118 are partially connected (see the connecting portion 119 of FIG. 10), and these electrode 113 and 118 are electrically equivalent in potential to each other.

Figure 58:
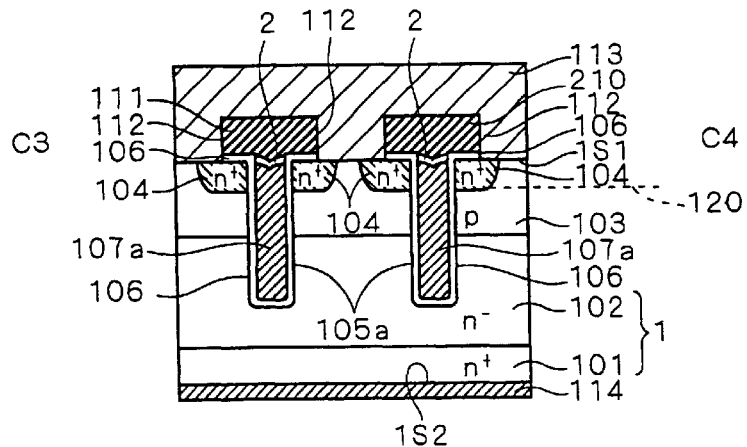
Figure 59A:
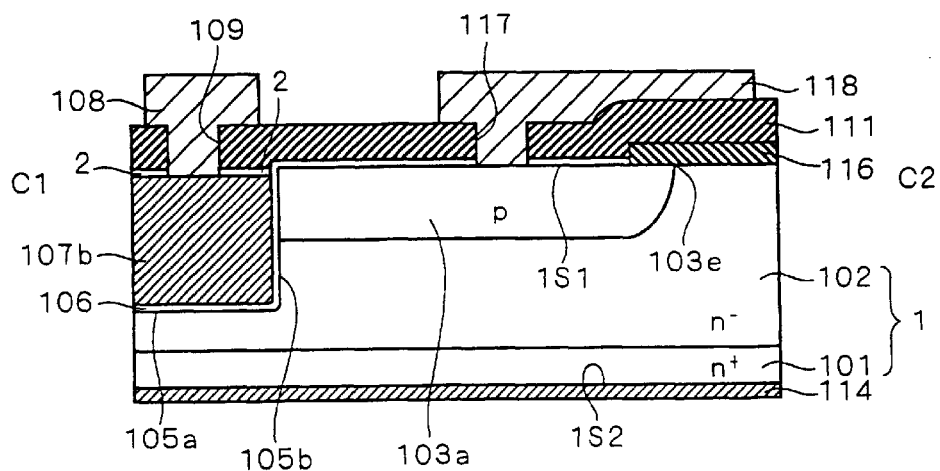
Figure 59B:
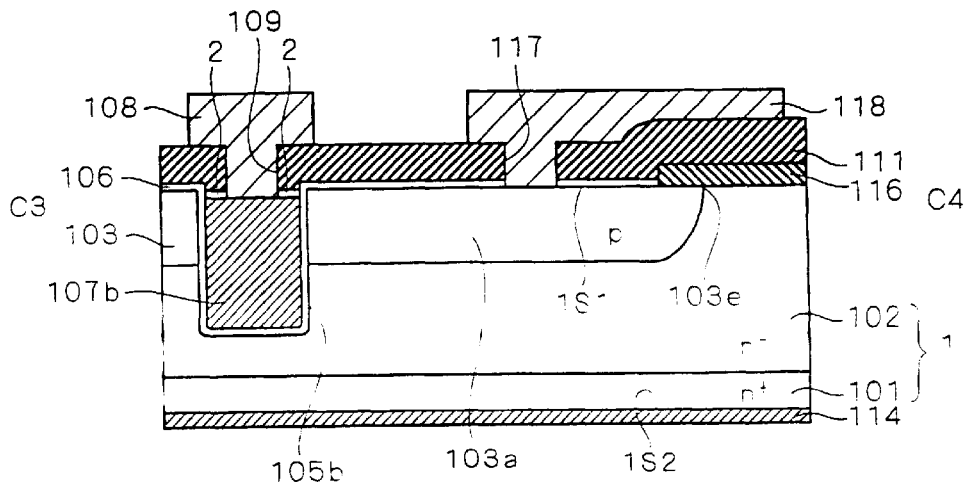

(Step 12) FIGS. 58, 59A and 59B

Finally, the drain electrode 114 of Ti/Ni/Au alloy layer is formed on the second main surface 1S2 by sputtering in the same manner as in the sixth preferred embodiment. Thus, the gate interconnection structure 150 is achieved.

As is clear from the above description on the manufacturing process steps, the seventh preferred embodiment produces an advantage of easily manufacturing a gate interconnection structure in which the source aluminum electrode itself serves as a field plate.

Other Variations (A) Though the n-channel power UMOSFET is taken as an example of a semiconductor device of the present invention in the above-discussed preferred embodiments and the variations, the present invention can be naturally applied to a p-channel power UMOSFET and also in this case, the same effect can be produced. In this case, p type corresponds to the first conductivity type and n type corresponds to the second conductivity type. Further, as discussed at the beginning of specification, the present invention can be applied to a power semiconductor device having other MOS structures, such as a VMOSFET or an IGBT.

The cases in which the gate interconnection structure according to the present invention is applied to an IGBT having a trench gate will be described below.

Figure 60A:
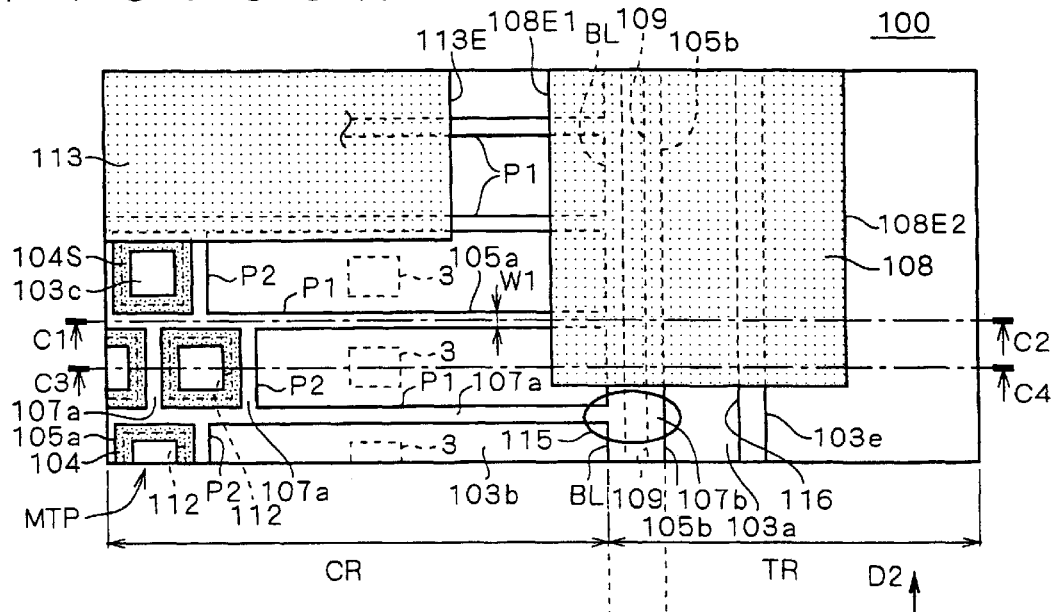
FIGS. 60A, 60B and 60C are a plan view, a longitudinal section and a longitudinal section, respectively, each showing the state in which the subject matter of the first preferred embodiment of the present invention is applied to a trench gate type IGBT.
Figure 60B:
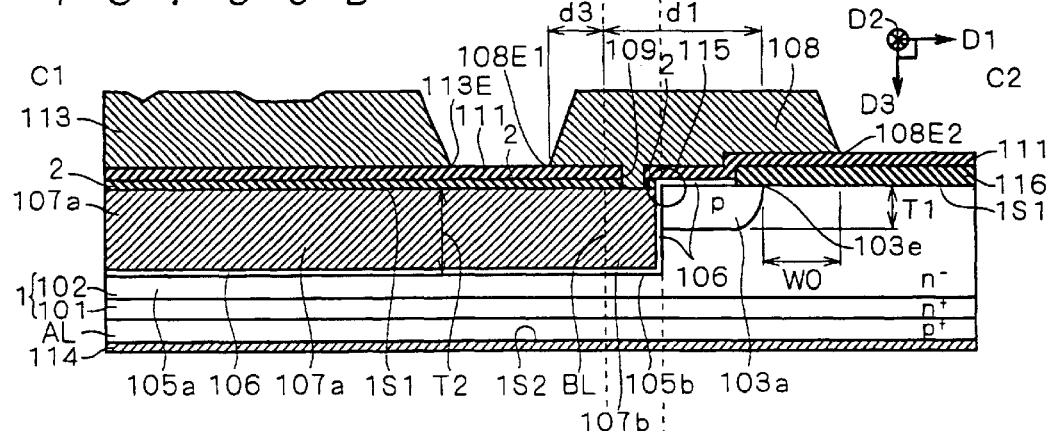
Figure 60C:
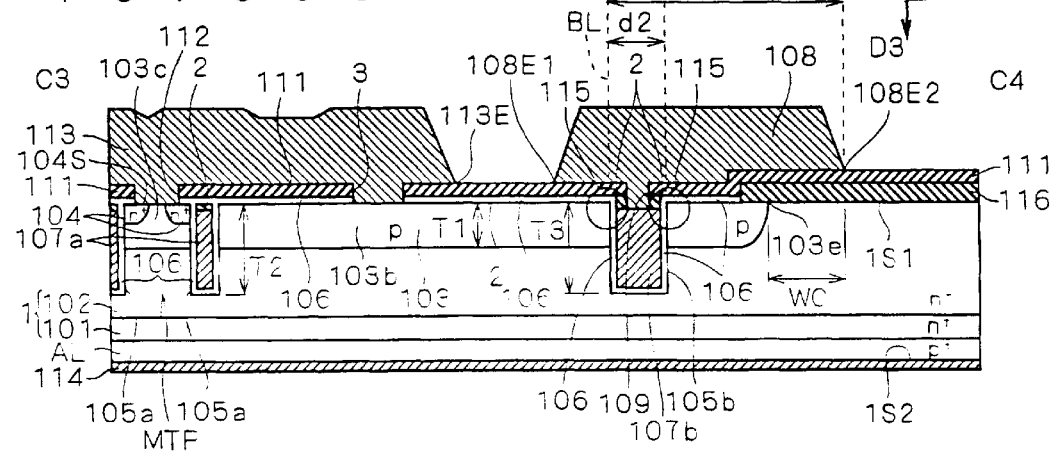

FIGS. 60A, 60B and 60C are a plan view, a longitudinal section taken along the line C1–C2 and a longitudinal section taken along the line C3–C4, respectively, each showing the state in which the subject matter of the first preferred embodiment is applied to a trench gate type IGBT. The only difference between the structure shown in FIGS. 60A to 60C and that shown in FIGS. 1A to 1C lies in that a semiconductor layer AL of the second conductivity type (in this case, p-type) is provided between the $n^+$-type buffer layer 101 and the first main electrode 114 (corresponding to a collector electrode).

FIGS. 61B and 61C are longitudinal sections taken along the lines C1–C2 and C3–C4, respectively, each showing the state in which the subject matter of the second preferred embodiment is applied to a trench gate type IGBT. The only difference between the structure shown in FIGS. 61B and 61C and that shown in FIGS. 11B and 11C also lies in that the semiconductor layer AL of the second conductivity type (in this case, p-type) is formed on the second main surface 1S2 of the semiconductor substrate 1.

Figure 62A:
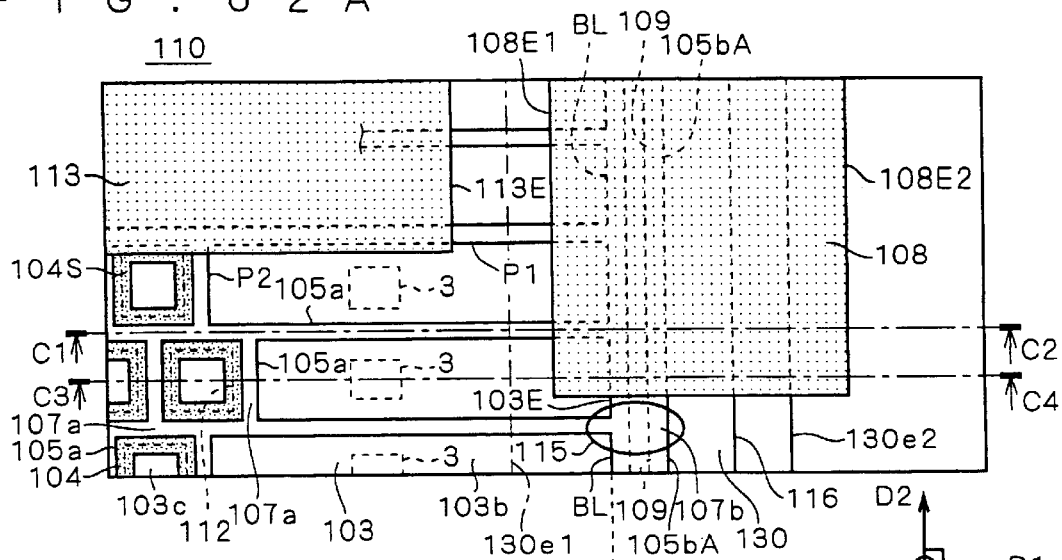
FIGS. 62A, 62B and 62C are a plan view, a longitudinal section and a longitudinal section, respectively, each showing the state in which the subject matter of the third preferred embodiment of the present invention is applied to a trench gate type IGBT.
Figure 62B:
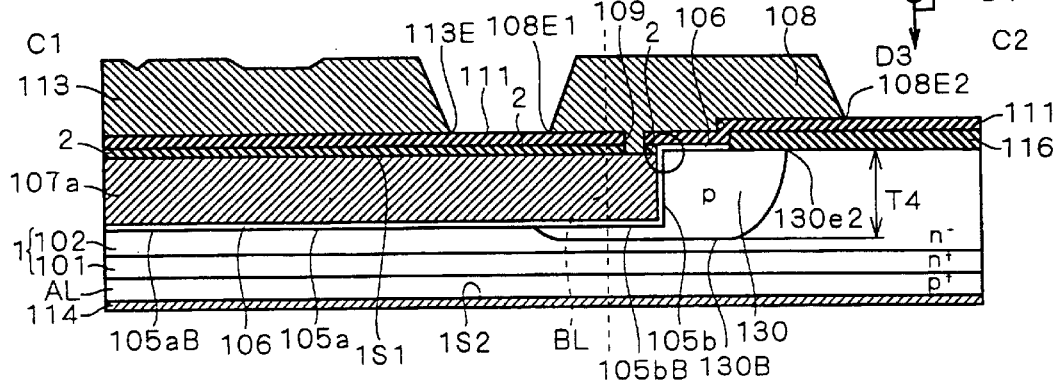
Figure 62C:
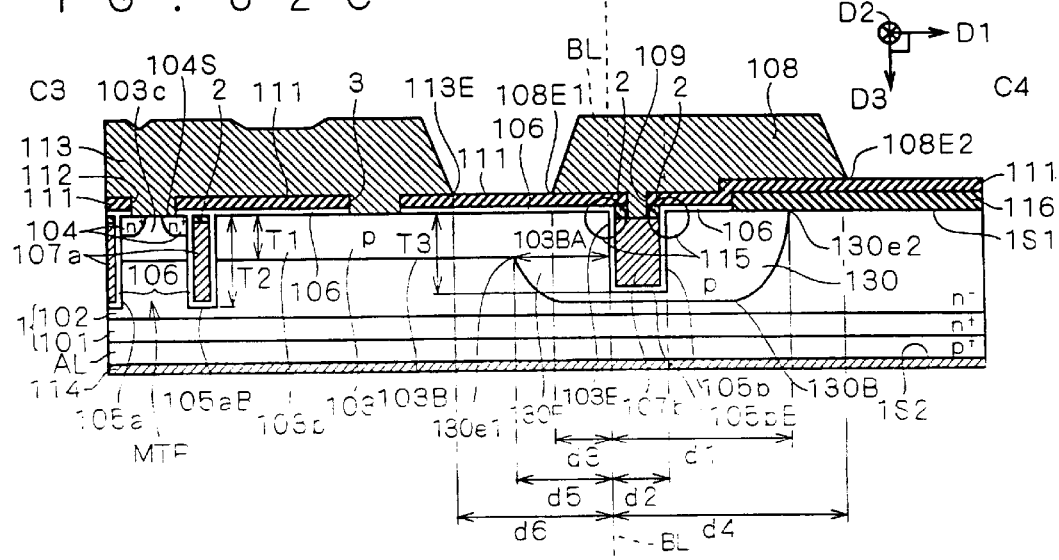

FIGS. 62A, 62B and 62C are a plan view, a longitudinal section taken along the line C1–C2 and a longitudinal section taken along the line C3–C4, respectively, each showing the state in which the subject matter of the third preferred embodiment is applied to a trench gate type IGBT. The only difference between the structure shown in FIGS. 62A to 62C and that shown in FIGS. 12A to 12C also lies in that the semiconductor layer AL of the second conductivity type (p-type) is provided.

Figure 63A:
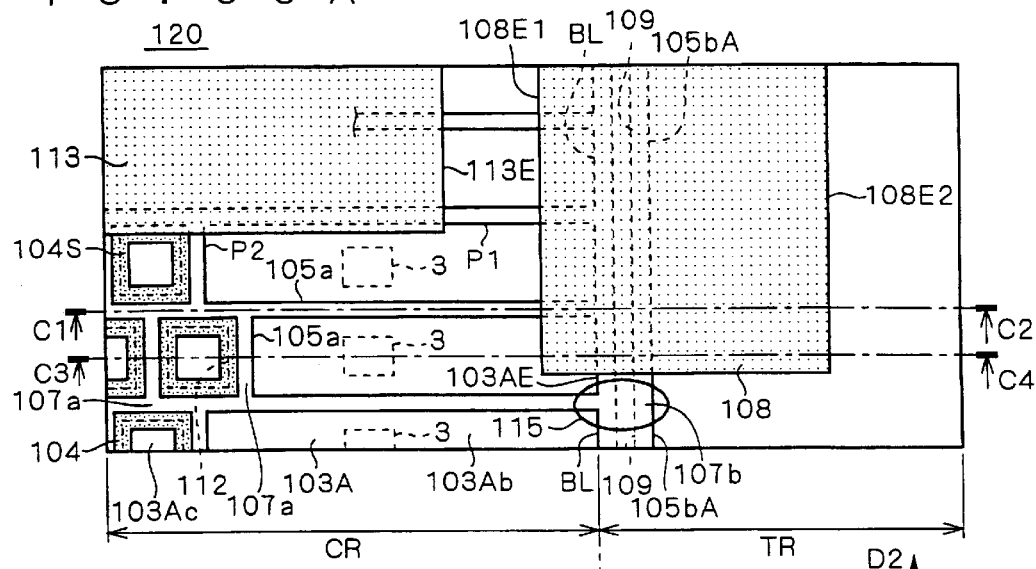
FIGS. 63A, 63B and 63C are a plan view, a longitudinal section and a longitudinal section, respectively, each showing the state in which the subject matter of the fourth preferred embodiment of the present invention is applied to a trench gate type IGBT.
Figure 63B:
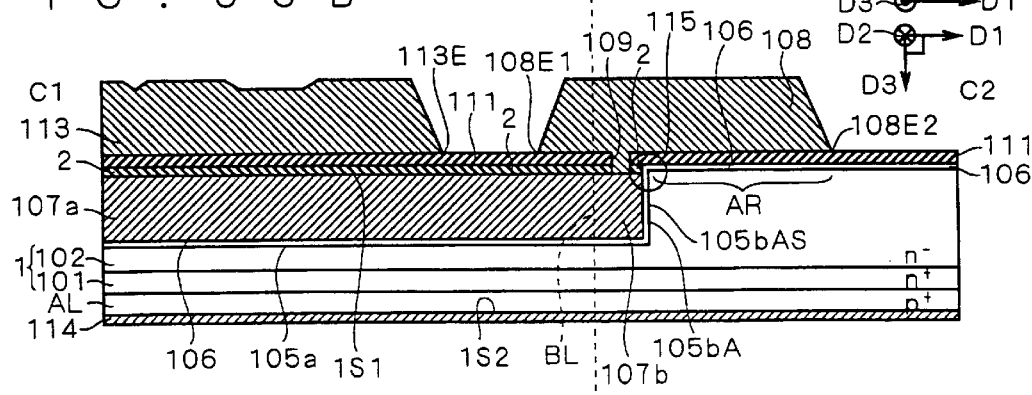
Figure 63C:
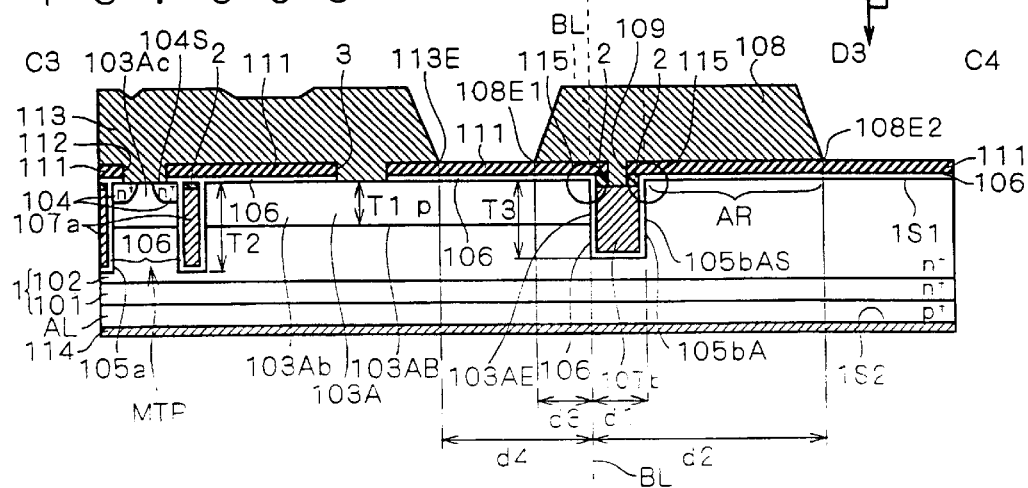

FIGS. 63A, 63B and 63C are a plan view, a longitudinal section taken along the line C1–C2 and a longitudinal section taken along the line C3–C4, respectively, each showing the state in which the subject matter of the fourth preferred embodiment is applied to a trench gate type IGBT. The only difference between the structure shown in FIGS. 63A to 63C and that shown in FIGS. 15A to 15C also lies in that the semiconductor layer AL of the second conductivity type (p-type) is provided.

Figure 64A:
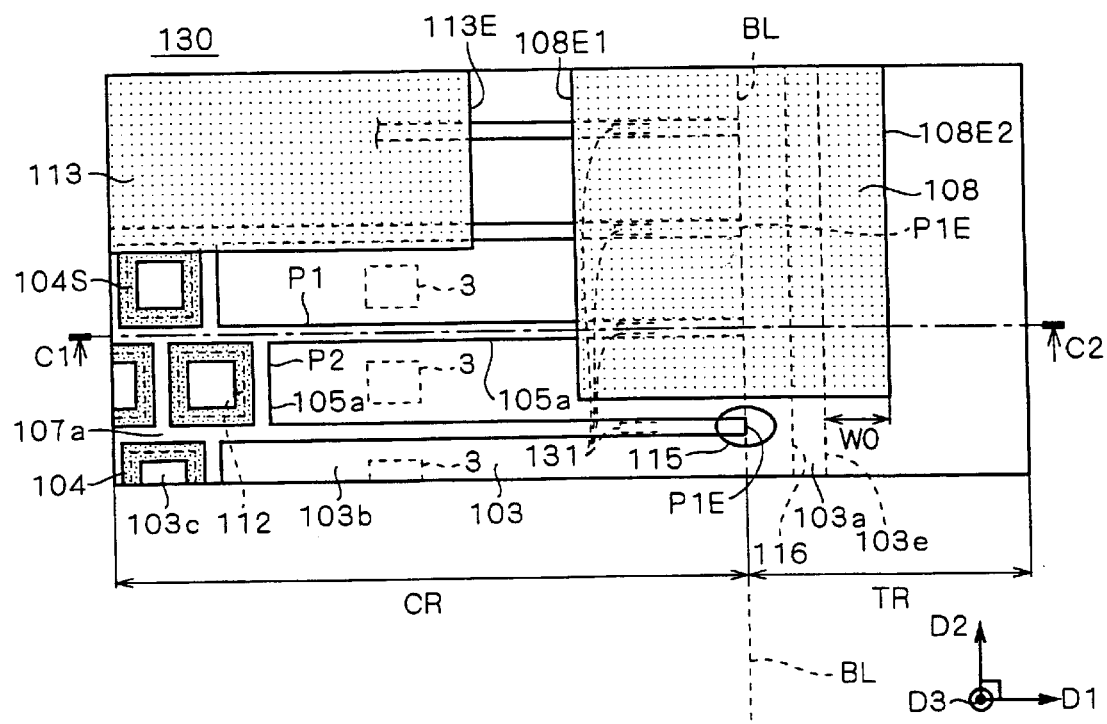
FIGS. 64A and 64B are a plan view and a longitudinal section, respectively, each showing the state in which the subject matter of the fifth preferred embodiment of the present invention is applied to a trench gate type IGBT.
Figure 64B:
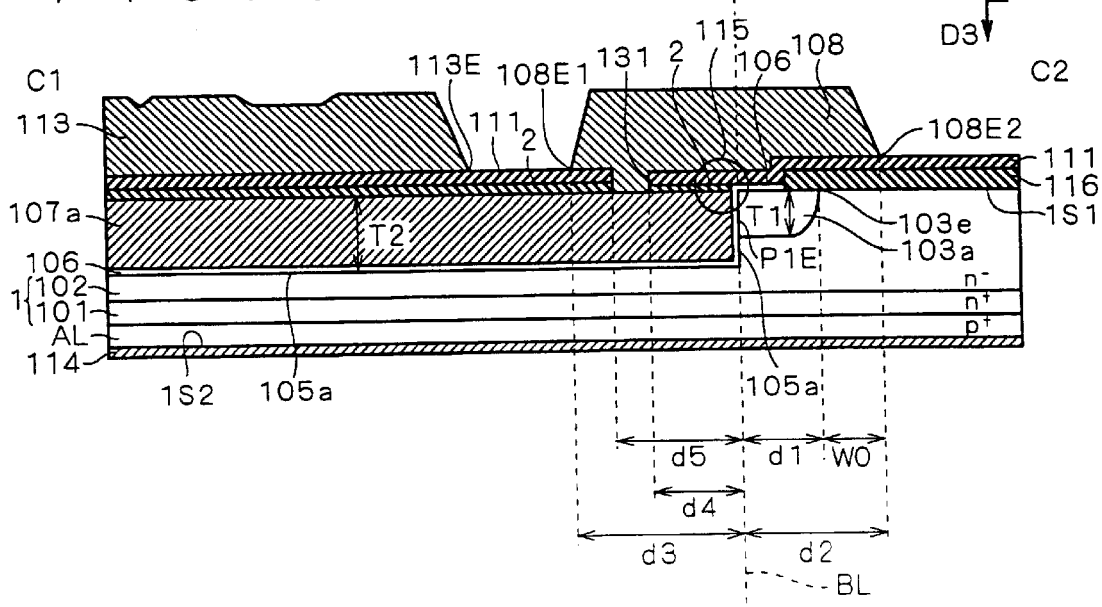

FIGS. 64A and 64B are a plan view and a longitudinal section taken along the line C1–C2, respectively, each showing the state in which the subject matter of the fifth preferred embodiment is applied to a trench gate type IGBT. The only difference between the structure shown in FIGS. 64A and 64B and that shown in FIGS. 18A and 18B also lies in that the semiconductor layer AL of the second conductivity type (p-type) is provided.

<Definition>

In the variations of the present invention applied to a trench gate type IGBT, the word "on" included in the sentence "the first main electrode 114 formed on the second main surface 1S2" should be interpreted as having the following meaning. That is, "the first main electrode formed on the second main surface 1S2" includes (1) the semiconductor layer AL of the second conductivity type formed on the second main surface 1S2 and (2) the first main electrode layer 114 formed on a surface of the semiconductor layer AL opposite to the second main surface 1S2.

(B) Though any impurity diffusion region for higher-speed oxidation does not exist at the trench end corner portion in the above-discussed preferred embodiments and the variations, the present invention can be also applied to a case where a diffusion layer containing an $n^+$-type impurity such as As is formed at the trench end corner portion, and also in this case, the same effect can be produced.

(C) Though the insulating oxide film 116 is partially formed on the upper surface of the epitaxial semiconductor layer 102 and the third gate control electrode 208c is formed thereon in the above-discussed third variation, even if no insulating oxide film 116 is formed but only the gate oxide film 106 is formed, the same effect of the third variation can be produced.

(D) Though no barrier metal is formed at the junction portion of the interface between each aluminum electrode and silicon in the above-discussed preferred embodiments and the variations, if a structure using the barrier metal is adopted, the same effect can be produced and a further improvement in characteristics can be expected since a junction resistance can be further reduced.

(E) Though a polysilicon is used for each gate control electrode in the above-discussed preferred embodiments and the variations, if other electrode materials (e.g., W—Si or Al) are used for each gate control electrode, the same effect can be naturally produced.

(F) Though the Ti/Ni/Au alloy layer is used for the drain electrode in the above-discussed sixth and seventh preferred embodiments and the eleventh variation, if other electrode materials (e.g., Ti/Ni/Ag alloy, Al/Mo/Ni/Au alloy layer) are used for the drain electrode, the same effect can be naturally produced.

SUMMARY (1) In the preferred embodiments and the variations of the present invention, since the gate control electrode formed inside the trench does not cover the gate oxide film formed at the trench end corner portion, it is possible to achieve a structure to avoid concentration of the electric field stress on a portion with curvature in which the gate oxide film is thinner on application of the gate voltage. Therefore, the withstand insulation voltage and the reliability of gates can be improved and the yield can be accordingly improved.

(2) Further, since the gate aluminum electrode (the second source aluminum electrode in the second preferred embodiment) is used as a field plate by so forming the gate aluminum electrode as to protrude beyond the end of the base layer, it is possible to effectively prevent deterioration in drain-source main breakdown voltage due to deep formation of the gate trench and improve the main breakdown voltage.

(3) Furthermore, by adopting the above structure, it is possible to reduce the number of manufacturing process steps.

While the invention has been shown and described in detail, the foregoing description is in all aspects illustrative and not restrictive. It is therefore understood that numerous modifications and variations can be devised without departing from the scope of the invention.

What is claimed is:
1. An insulated gate semiconductor device which comprises an MOS transistor structure, comprising:

a semiconductor substrate of a first conductivity type having a first main surface and a second main surface which are opposed to each other in a third direction;

a base layer of a second conductivity type formed from a cell region in said first main surface and a region in said first main surface which is defined by one end which is a boundary between said cell region and a terminal region adjacent to said cell region and the other end away from said boundary towards said terminal region by a first distance along a first direction, towards an inside of said semiconductor substrate along said third direction;

a first trench formed from said cell region in said first main surface, through said base layer, up to said inside of said semiconductor substrate along said third direction;

a first gate insulating film formed entirely on a bottom surface and side surfaces of said first trench; and a first main electrode formed on said second main surface, wherein said first direction is parallel to said first main surface and orthogonal to said third direction, a first depth from said first main surface to a bottom surface of said base layer is smaller than a second depth from said first main surface to said bottom surface of said first trench, said first trench has a plurality of first portions and a plurality of second portions, said plurality of first portions are arranged along a second direction orthogonal to said first direction and said third direction, each of said plurality of first portions has one end portion located on said boundary between said cell region and said terminal region and extends towards said one end portion along said first direction, and each of said plurality of second portions is located between adjacent first portions out of said plurality of first portions and extends along said second direction to connect said adjacent first portions to each other, said insulated gate semiconductor device further comprising:

a plurality of second main electrode regions of said first conductivity type, each of which is formed from a region in said cell region of said first main surface which is surrounded by said adjacent first portions and adjacent second portions out of said plurality of second portions corresponding to said adjacent first portions towards an inside of said base layer along upper portions of side surfaces of said adjacent first portions and upper portions of side surfaces of said adjacent second portions;

a first gate control electrode so formed inside said first trench as to be located beneath an upper surface of said first trench, said first gate control electrode filling said first trench with said first gate insulating film interposed therebetween;

a second trench formed from a region in said first main surface which is defined by one end which is said boundary and the other end away from said boundary toward said terminal region by a second distance shorter than said first distance along said first direction, through said base layer, up to said inside of said semiconductor substrate along said third direction, said second trench having a third depth larger than said first depth and extending along said second direction while being connected to said one end portion which each of said plurality of first portions has;

a second gate insulating film formed entirely on a bottom surface and side surfaces of said second trench;

a second gate control electrode so formed inside said second trench as to be located beneath an upper surface of said second trench, said second gate control electrode filling said second trench with said second gate insulating film interposed therebetween and being electrically connected to said first gate control electrode at said one end portion which each of said plurality of first portions has;

an insulating layer formed on an upper surface of said base-layer, an upper surface of said first gate control electrode, an upper surface of said first gate insulating film, an upper surface of said second gate control electrode, an upper surface of said second gate insulating film and a region in said terminal region of said first main surface which is located outside an end of said base layer;

a plurality of first contact portions each so formed in said insulating layer as to expose part of an upper surface which each of said plurality of second main electrode regions has and an upper surface of a portion in said base layer which is surrounded by each of said plurality of second main electrode regions;

a plurality of second contact portions each so formed in said insulating layer as to expose part of an upper surface of a portion in said base layer which is surrounded by a side surface of said second trench on the side of said boundary, side surfaces of said adjacent first portions and a side surface of an outermost second portion of said plurality of second portions which faces said second trench;

a second main electrode formed in said plurality of first contact portions and said plurality of second contact portions and on a portion in said insulating layer which is located on said cell region of said first main surface, said second main electrode extending along said second direction and being electrically connected to each of said plurality of second main electrode regions and said base layer;

a third contact portion so formed in said insulating layer as to expose part of said upper surface of said second gate control electrode; and a gate electrode formed inside said third contact portion, on a portion in said insulating layer which is defined by said boundary and a location away from said boundary towards said cell region along said first direction by a third distance not reaching an end portion of said second main electrode and on a portion in said insulating layer which is defined by said boundary and a location away from said boundary towards said terminal region along said first direction by a fourth distance longer than said first distance, said gate electrode extending along said second direction and being electrically connected to said second gate control electrode through said third contact portion.

2. The insulated gate semiconductor device according to claim 1, further comprising:

a plurality of fourth contact portions each so formed in said insulating layer as to expose part of an upper surface of a portion which is defined by said boundary and a location away from said boundary towards said cell region by said third distance along said first direction in a portion of said first gate control electrode which fills each of said plurality of first portions, being filled with said gate electrode, wherein said gate electrode has an electric connection with said first gate control electrode through said plurality of fourth contact portions.

3. The insulated gate semiconductor device according to claim 1, wherein said second trench has a second width equal to a first width of each of said plurality of first portions.

4. The insulated gate semiconductor device according to claim 1, further comprising:

a third gate control electrode provided inside a portion of said insulating layer formed on said terminal region of said first main surface, which is located outside said end of said base layer and is at least located beneath said gate electrode, said third gate control electrode extending along said second direction; and a fourth contact portion so formed in said insulating layer as to expose part of an upper surface of said third gate control electrode, being filled with said gate electrode, wherein said gate electrode also has an electric connection with said third gate control electrode through said fourth contact portion.

5. The insulated gate semiconductor device according to claim 4, wherein said fourth contact portion comprises a plurality of contact holes.

6. The insulated gate semiconductor device according to claim 1, wherein said third contact portion has a stripe shape extending in parallel with said second trench along said second direction.

7. The insulated gate semiconductor device according to claim 1, further comprising:

a third trench formed from a region in said terminal region of said first main surface, which is located outside said second trench, through said base layer located beneath said terminal region, up to said inside of said semiconductor substrate along said third direction, said third trench extending along said first direction and said second direction while being connected to said second trench to make a mesh shape;

a third gate insulating film formed entirely on a bottom surface and side surfaces of said third trench;

a third gate control electrode so formed inside said third trench as to be located beneath an upper surface of said third trench to fill the inside of said third trench with said third gate insulating film interposed therebetween and electrically connected to said second gate control electrode at connecting portions between said second trench and portions of said third trench extending along said first direction; and a fourth contact portion so formed in said insulating layer as to expose an upper surface of said third gate control electrode, extending along said first direction and said second direction to make a mesh shape and being filled with said gate electrode, wherein said gate electrode also has an electric connection with said third gate control electrode through said fourth contact portion, and said third contact portion has a stripe shape extending in parallel with said second trench along said second direction and is connected to lateral portions of said fourth contact portion each extending along said first direction.

8. The insulated gate semiconductor device according to claim 1, wherein a third trench formed from a region in said terminal region of said first main surface, which is located outside said second trench, through said base layer located beneath said terminal region, up to said inside of said semiconductor substrate along said third direction, said third trench extending along said first direction and said second direction while being connected to said second trench to make a mesh shape;

a third gate insulating film formed entirely on a bottom surface and side surfaces of said third trench;

a third gate control electrode so formed inside said third trench as to be located beneath an upper surface of said third trench to fill the inside of said third trench with said third gate insulating film interposed therebetween and electrically connected to said second gate control electrode at connecting portions between said second trench and lateral portions of said third trench extending along said first direction; and a fourth contact portion so formed in said insulating layer as to expose an upper surface of said third gate control electrode and filled with said gate electrode, wherein said gate electrode also has an electric connection with said third gate control electrode through said fourth contact portion, said third contact portion comprises a plurality of contact holes formed near said connecting portions between said second trench and said third trench, respectively, and said fourth contact portion comprises a plurality of contact holes formed at crossing portions between said lateral portions of said third trench extending along said first direction and longitudinal portions of said third trench extending along said second direction.

9. An insulated gate semiconductor device which comprises an MOS transistor structure, comprising:

a semiconductor substrate of a first conductivity type having a first main surface and a second main surface which are opposed to each other in a third direction;

a base layer of a second conductivity type formed from a cell region in said first main surface and a region in said first main surface which is defined by one end which is a boundary between said cell region and a terminal region adjacent to said cell region and the other end away from said boundary towards said terminal region by a first distance along a first direction, towards an inside of said semiconductor substrate along said third direction;

a first trench formed from said cell region in said first main surface, through said base layer, up to said inside of said semiconductor substrate along said third direction;

a first gate insulating film formed entirely on a bottom surface and side surfaces of said first trench; and a first main electrode formed on said second main surface, wherein said first direction is parallel to said first main surface and orthogonal to said third direction, a first depth from said first main surface to a bottom surface of said base layer is smaller than a second depth from said first main surface to said bottom surface of said first trench, said first trench has a plurality of first portions and a plurality of second portions, said plurality of first portions are arranged along a second direction orthogonal to said first direction and said third direction, each of said plurality of first portions has one end portion located on said boundary between said cell region and said terminal region and extends towards said one end portion along said first direction, and each of said plurality of second portions is located between adjacent first portions out of said plurality of first portions and extends along said second direction to connect said adjacent first portions to each other, said insulated gate semiconductor device further comprising:

a plurality of second main electrode regions of said first conductivity type, each of which is formed from a region in said cell region of said first main surface which is surrounded by said adjacent first portions and adjacent second portions out of said plurality of second portions corresponding to said adjacent first portions towards an inside of said base layer along upper portions of side surfaces of said adjacent first portions and upper portions of side surfaces of said adjacent second portions;

a first gate control electrode so formed inside said first trench as to be located beneath an upper surface of said first trench, said first gate control electrode filling said first trench with said first gate insulating film interposed therebetween;

a second trench formed from a region in said first main surface which is defined by one end which is said boundary and the other end away from said boundary towards said terminal region by a second distance shorter than said first distance along said first direction, through said base layer, up to said inside of said semiconductor substrate along said third direction, said second trench having a third depth larger than said first depth and extending along said second direction while being connected to said one end portion which each of said plurality of first portions has;

a second gate insulating film formed entirely on a bottom surface and side surfaces of said second trench;

a second gate control electrode so formed inside said second trench as to be located beneath an upper surface of said second trench, said second gate control electrode filling said second trench with said second gate insulating film interposed therebetween and being electrically connected to said first gate control electrode at said one end portion which each of said plurality of first portions has;

an insulating layer formed on an upper surface of said base layer, an upper surface of said first gate control electrode, an upper surface of said first gate insulating film, an upper surface of said second gate control electrode, an upper surface of said second gate insulating film and a region in said terminal region of said first main surface which is located outside an end of said base layer;

a plurality of first contact portions each so formed in said insulating layer as to expose part of an upper surface which each of said plurality of second main electrode regions has and an upper surface of a portion in said base layer which is surrounded by each of said plurality of second main electrode regions;

a plurality of second contact portions each so formed in said insulating layer as to expose part of an upper surface of a portion in said base layer which is surrounded by a side surface of said second trench on the side of said boundary, side surfaces of said adjacent first portions and a side surface of an outermost second portion of said plurality of second portions which faces said second trench;

a first electrode layer for second main electrode formed in said plurality of first contact portions and said plurality of second contact portions and on a portion in said insulating layer which is located on said cell region of said first main surface, having one end portion away from said boundary by a seventh distance along said first direction, extending along said second direction and being electrically connected to each of said plurality of second main electrode regions and said base layer;

a third contact portion so formed in said insulating layer as to expose part of said upper surface of said second gate control electrode;

a gate electrode formed inside said third contact portion, on a portion in said insulating layer which is defined by said boundary and a location away from said boundary towards said cell region along said first direction by a third distance shorter than said seventh distance and on a portion in said insulating layer which is defined by said boundary and a location away from said boundary towards said terminal region along said first direction by a fourth distance shorter than said first distance, said gate electrode extending along said second direction and being electrically connected to said second gate control electrode through said third contact portion;

a fourth contact portion so formed in said insulating:layer as to expose part of an upper surface of a portion in said base layer which is sandwiched between a location away from said boundary towards said terminal region along said first direction by a fifth distance which is shorter than said first distance and longer than said fourth distance and said other end of said base layer away from said boundary by said first distance; and a second electrode layer for second main electrode formed in said fourth contact portion and on a portion in said insulating layer which is defined by said location away from said boundary towards said terminal region along said first direction by said fifth distance and a location away from said boundary towards said terminal region along said first direction by a sixth distance longer than said first distance, extending along said second direction and being electrically connected to said base layer through said fourth contact portion, wherein both the length of said first electrode layer for second main electrode and that of said second electrode layer for second main electrode along said second direction are longer than the length of said gate electrode along said second direction, said insulated gate semiconductor device further comprising:

a connection layer having a side surface which is being away from one end portion of said gate electrode in said second direction by a predetermined distance along said second direction and extends along said first direction, being formed on a portion of said insulating layer which is defined by said one end portion of said first electrode layer for second main electrode and said location away from said boundary towards said terminal region by said fifth distance along said first direction, and configured to electrically connect said first electrode layer for second main electrode and said second electrode layer for second main electrode to each other.

10. An insulated gate semiconductor device which comprises an MOS transistor structure, comprising:

a semiconductor substrate of a first conductivity type having a first main surface and a second main surface which are opposed to each other in a third direction;

a base layer of a second conductivity type formed from a cell region in said first main surface towards a first bottom surface located inside said semiconductor substrate along said third direction, having one end portion located on a boundary between said cell region and a terminal region adjacent to said cell region and a first depth from said first main surface to said first bottom surface;

a well layer of said second conductivity type, being connected to said one end portion of said base layer in said boundary, formed from a region in said terminal region of said first main surface which is defined by one end which is said boundary and the other end away from said boundary towards said terminal region by a first distance along said first direction, towards a fourth bottom surface located inside said semiconductor substrate along said third direction, and having a fourth depth from said first main surface to said fourth bottom surface;

a first trench formed from said cell region in said first main surface, through said base layer, up to a second bottom surface located inside said semiconductor substrate along said third direction, and having a second depth from said first main surface to said second bottom surface;

a first gate insulating film formed entirely on said second bottom surface and side surfaces of said first trench; and a first main electrode formed on said second main surface, wherein said first direction is parallel to said first main surface and orthogonal to said third direction, said first depth is smaller than said second depth, said second depth is smaller than said fourth depth, said well layer further has a base-layer covering portion formed from a portion in said first bottom surface of said base layer which is sandwiched between said boundary and a location away from said boundary by a fifth distance along said first direction, towards said fourth bottom surface of said well layer up to an inside of said semiconductor substrate, said first trench has a plurality of first portions and a plurality of second portions, said plurality of first portions are arranged along a second direction orthogonal to said first direction and said third direction, each of said plurality of first portions has one end portion located on said boundary between said cell region and said terminal region and extends towards said one end portion along said first direction, and each of said plurality of second portions is located between adjacent first portions out of said plurality of first portions and extends along said second direction to connect said adjacent first portions to each other, said insulated gate semiconductor device further comprising:
- a plurality of second main electrode regions of said first conductivity type, each of which is formed from a region in said cell region of said first main surface which is surrounded by said adjacent first portions and adjacent second portions out of said plurality of second portions corresponding to said adjacent first portions towards an inside of said base layer along upper portions of side surfaces of said adjacent first portions and upper portions of side surfaces of said adjacent second portions;
- a first gate control electrode so formed inside said first trench as to be located beneath an upper surface of said first trench, said first gate control electrode filling said first trench with said first gate insulating film interposed therebetween;
- a second trench formed from a region in said first main surface which is defined by said one end which is said boundary and the other end away from said boundary towards said terminal region by a second distance shorter than said first distance along said first direction, up to a third bottom surface located inside said well layer along said third direction, said second trench having a third depth from said first main surface to said third bottom surface and extending along said second direction while being connected to said one end portion which each of said plurality of first portions has;
- a second gate insulating film formed entirely on said third bottom surface and side surfaces of said second trench;
- a second gate control electrode so formed inside said second trench as to be located beneath an upper surface of said second trench, said second gate control electrode filling said second trench with said second gate insulating film interposed therebetween and being electrically connected to said first gate control electrode at said one end portion which each of said plurality of first portions has;
- an insulating layer formed on an upper surface of said base layer, an upper surface of said first gate control electrode, an upper surface of said first gate insulating film, an upper surface of said second gate control electrode, an upper surface of said second gate insulating film, an upper surface of said well layer and a region in said terminal region of said first main surface which is located outside an end of said well layer;
- a plurality of first contact portions each so formed in said insulating layer as to expose part of an upper surface which each of said plurality of second main electrode regions has and an upper surface of a portion in said base layer which is surrounded by each of said plurality of second main electrode regions;
- a plurality of second contact portions each so formed in said insulating layer as to expose part of an upper surface of a portion in said base layer which is surrounded by a side surface of said second trench on the side of said boundary, side surfaces of said adjacent first portions and a side surface of an outermost second portion of said plurality of second portions which faces said second trench;
- a second main electrode formed in said plurality of first contact portions and said plurality of second contact portions and on a portion in said insulating layer which is located on said cell region of said first main surface, having one end portion away from said boundary by a sixth distance larger than said fifth distance along said first direction, extending along said second direction and being electrically connected to each of said plurality of second main electrode regions and said base layer;
- a third contact portion so formed in said insulating layer as to expose part of said upper surface of said second gate control electrode; and
- a gate electrode formed inside said third contact portion, on a portion in said insulating layer which is defined by said boundary and a location away from said boundary towards said cell region along said first direction by a third distance shorter than said fifth distance and on a portion in said insulating layer which is defined by said boundary and a location away from said boundary towards said terminal region along said first direction by a fourth distance longer than said first distance, said gate electrode extending along said second direction and being electrically connected to said second gate control electrode through said third contact portion,
- wherein said third depth is larger than said first depth, and
- said fourth depth is larger than said third depth.

11. The insulated gate semiconductor device according to claim 10, further comprising:
- a third gate control electrode provided inside a portion of said insulating layer formed on said terminal region of said first main surface, which is located outside said end of said well layer and is at least located beneath said gate electrode, said third gate control electrode extending along said second direction; and
- a fourth contact portion so formed in said insulating layer as to expose part of an upper surface of said third gate control electrode, being filled with said gate electrode,
- wherein said gate electrode also has an electric connection with said third gate control electrode through said fourth contact portion.

12. An insulated gate semiconductor device which comprises an MOS transistor structure, comprising:
- a semiconductor substrate of a first conductivity type having a first main surface and a second main surface which are opposed to each other in a third direction;
- a base layer of a second conductivity type formed from a cell region in said first main surface towards a first bottom surface located inside said semiconductor substrate along said third direction, having one end portion located on a boundary between said cell region and a terminal region adjacent to said cell region and a first depth from said first main surface to said first bottom surface;
- a well layer of said second conductivity type, being connected to said one end portion of said base layer in said boundary, formed from a region in said terminal region of said first main surface which is defined by one end which is said boundary and the other end away from said boundary towards said terminal region by a first distance along said first direction, towards a fourth bottom surface located inside said semiconductor substrate along said third direction, and having a fourth depth from said first main surface to said fourth bottom surface;
- a first trench formed from said cell region in said first main surface, through said base layer, up to a second bottom surface located inside said semiconductor substrate along said third direction, and having a second depth from said first main surface to said second bottom surface;

a first gate insulating film formed entirely on said second bottom surface and side surfaces of said first trench; and a first main electrode formed on said second main surface, wherein said first direction is parallel to said first main surface and orthogonal to said third direction, said first depth is smaller than said second depth, said second depth is smaller than said fourth depth, said well layer further has a base-layer covering portion formed from a portion in said second bottom surface of said base layer which is sandwiched between said boundary and a location away from said boundary by an eighth distance along said first direction, towards said fourth bottom surface of said well layer up to an inside of said semiconductor substrate, said first trench has a plurality of first portions and a-plurality of second portions, said plurality of first portions are arranged along a second direction orthogonal to said first direction and said third direction, each of said plurality of first portions has one end portion located on said boundary between said cell region and said terminal region and extends towards said one end portion along said first direction, and each of said plurality of second portions is located between adjacent first portions out of said plurality of first portions and extends along said second direction to connect said adjacent first portions to each other, said insulated gate semiconductor device further comprising:

a plurality of second main electrode regions of said first conductivity type, each of which is formed from a region in said cell region of said first main surface, which is surrounded by said adjacent first portions and adjacent second portions out of said plurality of second portions corresponding to said adjacent first portions towards an inside of said base layer along upper portions of side surfaces of said adjacent first portions and upper portions of side surfaces of said adjacent second portions;

a first gate control electrode so formed inside said first trench as to be located beneath an upper surface of said first trench, said first gate control electrode filling said first trench with said first gate insulating film interposed therebetween;

a second trench formed from a region in said first main surface which is defined by said one end which is said boundary and the other end away from said boundary towards said terminal region by a second distance shorter than said first distance along said first direction, up to a third bottom surface located inside said well layer along said third direction, said second trench having a third depth from said first main surface to said third bottom surface and extending along said second direction while being connected to said one end portion which each of said plurality of first portions has;

a second gate insulating film formed entirely on said third bottom surface and side surfaces of said second trench;

a second gate control electrode so formed inside said second trench as to be located beneath an upper surface of said second trench, said second gate control electrode filling said second trench with said second gate insulating film interposed therebetween and being electrically connected to said first gate control electrode at said one end portion which each of said plurality of first portions has;

an insulating layer formed on an upper surface of said base layer, an upper surface of said first gate control electrode, an upper surface of said first gate insulating film, an upper surface of said second gate control electrode, an upper surface of said second gate insulating film, an upper surface of said well layer and a region in said terminal region of said first main surface which is located outside an end of said well layer;

a plurality of first contact portions each so formed in said insulating layer as to expose part of an upper surface which each of said plurality of second main electrode regions has and an upper surface of a portion in said base layer which is surrounded by each of said plurality of second main electrode regions;

a plurality of second contact portions each so formed in said insulating layer as to expose part of an upper surface of a portion in said base layer which is surrounded by a side surface of said second trench on the side of said boundary, side surfaces of said adjacent first portions and a side surface of an outermost second portion of said plurality of second portions which faces said second trench;

a first electrode layer for second main electrode formed in said plurality of first contact portions and said plurality of second contact portions and on a portion in said insulating layer which is located on said cell region of said first main surface, having one end portion away from said boundary by a seventh distance longer than said eighth distance along said first direction, extending along said second direction and being electrically connected to each of said plurality of second main electrode regions and said base layer;

a third contact portion so formed in said insulating layer as to expose part of said upper surface of said second gate control electrode;

a gate electrode formed inside said third contact portion, on a portion in said insulating layer which is defined by said boundary and a location away from said boundary towards said cell region along said first direction by a third distance shorter than said eighth distance and on a portion in said insulating layer which is defined by said boundary and a location away from said boundary towards said terminal region along said first direction by a fourth distance shorter than said first distance, said gate electrode extending along said second direction and being electrically connected to said second gate control electrode through said third contact portion;

a fourth contact portion so formed in said insulating layer as to expose part of an upper surface of a portion in said well layer which is sandwiched between a location away from said boundary towards said terminal region along said first direction by a fifth distance which is shorter than said first distance and longer than said fourth distance and said other end of said well layer away from said boundary by said first distance; and a second electrode layer for second main electrode formed in said fourth contact portion and on a portion in said insulating layer which is defined by said location away from said boundary towards said terminal region along said first direction by said fifth distance and a location away from said boundary towards said terminal region along said first direction by a sixth distance longer than said first distance, extending along said second direction and being electrically connected to said well layer through said fourth contact portion, wherein both the length of said first electrode layer for second main electrode and that of said second electrode layer for second main electrode along said second direction are longer than the length of said gate electrode along said second direction, said insulated gate semiconductor device further comprising:

a connection layer having a side surface which is away from one end portion of said gate electrode in said second direction by a predetermined distance along said second direction and extends along said first direction, being formed on a portion of said insulating layer which is defined by said one end portion of said first electrode layer for second main electrode and said location away from said boundary towards said terminal region by said fifth distance along said first direction, and configured to electrically connect said first electrode layer for second main electrode and said second electrode layer for second main electrode to each other, wherein said third depth is larger than said first depth, and said fourth depth is larger than said third depth.

13. An insulated gate semiconductor device which comprises an MOS transistor structure, comprising:

a semiconductor substrate of a first conductivity type having a first main surface and a second main surface which are opposed to each other in a third direction;

a base layer of a second conductivity type formed from a cell region in said first main surface towards a first bottom surface located inside said semiconductor substrate along said third direction, having one end portion located on a boundary between said cell region and a terminal region adjacent to said cell region and a first depth from said first main surface to said first bottom surface;

a first trench formed from said cell region in said first main surface, through said base layer, up to a second bottom surface located inside said semiconductor substrate along said third direction, and having a second depth from said first main surface to said second bottom surface;

a first gate insulating film formed entirely on said second bottom surface and side surfaces of said first trench; and a first main electrode formed on said second main surface, wherein said first direction is parallel to said first main surface and orthogonal to said third direction, said first depth is smaller than said second depth, said first trench has a plurality of first portions and a plurality of second portions, said plurality of first portions are arranged along a second direction orthogonal to said first direction and said third direction, each of said plurality of first portions has one end portion located on said boundary between said cell region and said terminal region and extends towards said one end portion along said first direction, and each of said plurality of second portions is located between adjacent first portions out of said plurality of first portions and extends along said second direction to connect said adjacent first portions to each other, said insulated gate semiconductor device further comprising:

a plurality of second main electrode regions of said first conductivity type, each of which is formed from a region in said cell region of said first main surface, which is surrounded by said adjacent first portions and adjacent second portions out of said plurality of second portions corresponding to said adjacent first portions, towards an inside of said base layer along upper portions of side surfaces of said adjacent first portions and upper portions of side surfaces of said adjacent second portions;

a first gate control electrode so formed inside said first trench as to be located beneath an upper surface of said first trench, said first gate control electrode filling said first trench with said first gate insulating film interposed therebetween;

a second trench formed from a region in said first main surface which is defined by said one end which is said boundary and the other end away from said boundary toward said terminal region by a first distance along said first direction, up to a third bottom surface located inside said semiconductor substrate along said third direction, said second trench having a third depth from said first main surface to said third bottom surface and extending along said second direction while being connected to said one end portion which each of said plurality of first portions has;

a second gate insulating film formed entirely on said third bottom surface and side surfaces of said second trench;

a second gate control electrode so formed inside said second trench as to be located beneath an upper surface of said second trench, said second gate control electrode filling said second trench with said second gate insulating film interposed therebetween and being electrically connected to said first gate control electrode at said one end portion which each of said plurality of first portions has;

an insulating layer formed on an upper surface of said base layer, an upper surface of said first gate control electrode, an upper surface of said first gate insulating film, an upper surface of said second gate control electrode, an upper surface of said second gate insulating film and a portion of said first main surface which is located outside one of said side surfaces of said second trench on the side of said terminal region;

a plurality of first contact portions each so formed in said insulating layer as to expose part of an upper surface which each of said plurality of second main electrode regions has and an upper surface of a portion in said base layer which is surrounded by each of said plurality of second main electrode regions;

a plurality of second contact portions each so formed in said insulating layer as to expose part of an upper surface of a portion in said base layer which is surrounded by a side surface of said second trench on the side of said boundary, side surfaces of said adjacent first portions and a side surface of an outermost second portion of said plurality of second portions which faces said second trench;

a second main electrode formed in said plurality of first contact portions and said plurality of second contact portions and on a portion in said insulating layer which is located on said cell region of said first main surface, having one end portion away from said boundary by a fourth distance along said first direction, extending along said second direction and being electrically connected to each of said plurality of second main electrode regions and said base layer;

a third contact portion so formed in said insulating layer as to expose part of said upper surface of said second gate control electrode; and a gate electrode formed inside said third contact portion, on a portion in said insulating layer which is defined by said boundary and a location away from said boundary towards said cell region along said first direction by a third distance shorter than said fourth distance and on a portion in said insulating layer which is defined by said boundary and a location away from said boundary towards said terminal region along said first direction by a second distance longer than said first distance, said gate electrode extending along said second direction and being electrically connected to said second gate control electrode through said third contact portion, wherein said third depth is larger than said first depth, and no semiconductor layer of said second conductivity type is formed in a portion of said semiconductor substrate which is located immediately below said gate electrode, which is defied by a side surface of said second trench on the side of said terminal region and said location away from said boundary towards said terminal region by said second distance along said first direction.

14. The insulated gate semiconductor device according to claim 13, further comprising:

a third gate control electrode provided inside a portion of said insulating layer formed on said terminal region of said first main surface, which is located outside said one of said side surfaces of said second trench on the side of said terminal region and is at least located beneath said gate electrode, said third gate control electrode extending along said second direction; and a fourth contact portion so formed in said insulating layer as to expose part of an upper surface of said third gate control electrode, being filled with said gate electrode, wherein said gate electrode also has an electric connection with said third gate control electrode through said fourth contact portion.

15. An insulated gate semiconductor device which comprises an MOS transistor structure, comprising:

a semiconductor substrate of a first conductivity type having a first main surface and a second main surface which are opposed to each other in a third direction;

a base layer of a second conductivity type formed from a cell region in said first main surface and a region in said first main surface which is defined by one end which is a boundary between said cell region and a terminal region adjacent to said cell region and the other end away from said boundary towards said terminal region by a first distance along a first direction, towards an inside of said semiconductor substrate along said third direction;

a trench formed from said cell region in said first main surface, through said base layer, up to said inside of said semiconductor substrate along said third direction;

a gate insulating film formed entirely on a bottom surface and side surfaces of said trench; and a first main electrode formed on said second main surface, wherein said first direction is parallel to said first main surface and orthogonal to said third direction, a first depth from said first main surface to a bottom surface of said base layer is smaller than a second depth from said first main surface to said bottom surface of said trench, said trench has a plurality of first portions and a plurality of second portions, said plurality of first portions are arranged along a second direction orthogonal to said first direction and said third direction, each of said plurality of first portions has one end portion located on said boundary between said cell region and said terminal region and extends towards said one end portion along said first direction, and each of said plurality of second portions is located between adjacent first portions out of said plurality of first portions and extends along said second direction to connect said adjacent first portions to each other, said insulated gate semiconductor device further comprising:

a plurality of second main electrode regions of said first conductivity type, each of which is formed from a region in said cell region of said first main surface which is surrounded by said adjacent first portions and adjacent second portions out of said plurality of second portions corresponding to said adjacent first portions towards an inside of said base layer along upper portions of side surfaces of said adjacent first portions and upper portions of side surfaces of said adjacent second portions;

a gate control electrode so formed inside said trench as to be located beneath an upper surface of said trench, said gate control electrode filling said trench with said gate insulating film interposed therebetween;

an insulating layer formed on an upper surface of said base layer, an upper surface of said gate control electrode, an upper surface of said gate insulating film and a region in said terminal region of said first main surface which is located outside an end of said base layer;

a plurality of first contact portions each so formed in said insulating layer as to expose part of an upper surface which each of said plurality of second main electrode regions has and an upper surface of a portion in said base layer which is surrounded by each of said plurality of second main electrode regions;

a plurality of second contact portions each so formed in said insulating layer as to expose part of an upper surface of a portion in said base layer which is defined by said boundary, side surfaces of said adjacent first portions and a side surface of an outermost second portion of said plurality of second portions which faces said boundary;

a second main electrode formed in said plurality of first contact portions and said plurality of second contact portions and on a portion in said insulating layer which is located on said cell region of said first main surface, said second main electrode extending along said second direction and being electrically connected to each of said plurality of second main electrode regions and said base layer;

a plurality of third contact portions provided for said plurality of first portions, respectively, each of which is so formed in said insulating layer as to expose a portion which is sandwiched between a first location away from said boundary along said first direction by a fourth distance and a second location away from said boundary along said first direction by a fifth distance longer than said fourth distance in an upper surface of a portion of said gate control electrode filling each of said plurality of first portions; and a gate electrode formed inside each of said plurality of third contact portions, on a portion in said insulating layer which is defined by said boundary and a location away from said boundary towards said cell region along said first direction by a third distance longer than said fifth distance and on a portion in said insulating layer which is defined by said boundary and a location away from said boundary towards said terminal region along said first direction by a second distance longer than said first distance, said gate electrode extending along said second direction and being electrically connected to said gate control electrode through said plurality of third contact portions.

16. The insulated gate semiconductor device according to claim 15, further comprising:

assuming that said gate control electrode is defined as a first gate control electrode, a second gate control electrode provided inside a portion of said insulating layer formed on said terminal region of said first main surface, which is located outside said end of said base layer and is at least located beneath said gate electrode, said second gate control electrode extending along said second direction; and a fourth contact portion so formed in said insulating layer as to expose part of an upper surface of said second gate control electrode, being filled with said gate electrode, wherein said gate electrode also has an electric connection with said second gate control electrode through said fourth contact portion.

17. A method of manufacturing a gate interconnection structure, comprising the steps of:

(a) forming a base layer of a second conductivity type from a main surface of a semiconductor substrate of a first conductivity type up to an inside of said semiconductor substrate along a third direction;

(b) forming a first trench penetrating said base layer, extending along a first direction which is in parallel with said main surface and orthogonal to said third direction and having a bottom surface inside said semiconductor substrate and a second trench penetrating said base layer, extending along a second direction orthogonal to said first direction and said third direction while being connected to one end portion of said first trench in said first direction and having a bottom surface inside said semiconductor substrate;

(c) forming a first gate oxide film on said bottom surface and side surfaces of said first trench and a second gate oxide film on said bottom surface and side surfaces of said second trench;

(d) forming a first gate control electrode which fills said first trench with said first gate oxide film interposed therebetween and a second gate control electrode which fills said second trench with said second gate oxide film interposed therebetween;

(e) forming an insulating layer, which covers an upper surface of said first gate control electrode and an upper surface of said second gate control electrode, on said main surface of said semiconductor substrate;

(f) forming a gate contact portion in said insulating layer, said gate contact portion exposing said upper surface of said second gate control electrode; and (g) forming a gate electrode on an upper surface of said insulating layer, said gate electrode filling said gate contact portion and having one end portion protruding outside beyond an end portion of said base layer in said first direction.

18. The method of manufacturing a gate interconnection structure according to claim 17, wherein said step (d) includes a step of forming a third gate control electrode on a portion in said main surface of said semiconductor substrate, which is located outside said end portion of said base layer, with an insulating oxide film interposed therebetween, said insulating layer formed in said step (e) covers said third gate control electrode, said step (f) includes a step of forming another gate contact portion, which exposes an upper surface portion of said third gate control electrode located inside said one end portion of said gate electrode, in said insulating layer and said gate electrode formed in said step (g) also fills said another gate contact portion.

19. A method of manufacturing a gate interconnection structure, comprising the steps of:

(a) forming a base layer of a second conductivity type from a main surface of a semiconductor substrate of a first conductivity type up to an inside of said semiconductor substrate along a third direction;

(b) forming a first trench penetrating said base layer, extending along a first direction which is in parallel with said main surface and orthogonal to said third direction and having a bottom surface inside said semiconductor substrate and a second trench penetrating said base layer, extending along a second direction orthogonal to said first direction and said third direction while being connected to one end portion of said first trench in said first direction and having a bottom surface inside said semiconductor substrate;

(c) forming a first gate oxide film on said bottom surface and side surfaces of said first trench and a second gate oxide film on said bottom surface and side surfaces of said second trench;

(d) forming a first gate control electrode which fills said first trench with said first gate oxide film interposed therebetween and a second gate control electrode which fills said second trench with said second gate oxide film interposed therebetween;

(e) forming an insulating layer, which covers an upper surface of said first gate control electrode and an upper surface of said second gate control electrode, on said main surface of said semiconductor substrate;

(f) forming a gate contact portion and a source contact portion in said insulating layer, said gate contact portion exposing said upper surface of said second gate control electrode, said source contact portion exposing an upper surface of said base layer located outside said second trench; and (g) forming a gate electrode and a source electrode on an upper surface of said insulating layer, said gate electrode filling said gate contact portion, said source electrode filling said source contact portion and having one end portion protruding outside beyond an end portion of said base layer in said first direction.

20. The insulated gate semiconductor device according to claim 1, wherein said first main electrode comprises:
- a semiconductor layer of said second conductivity type formed on said second main surface; and
- a first main electrode layer formed on a surface of said semiconductor layer opposite to said second main surface.

* * * * *